US012398653B2

United States Patent
Kim et al.

(10) Patent No.: US 12,398,653 B2
(45) Date of Patent: Aug. 26, 2025

(54) FAST RESPONSE ACTIVE CLEARANCE SYSTEMS WITH PIEZOELECTRIC ACTUATOR IN AXIAL, AXIAL/RADIAL COMBINED, AND CIRCUMFERENTIAL DIRECTIONS

(71) Applicant: General Electric Company, Schenectady, NY (US)

(72) Inventors: Taehong Kim, Evendale, OH (US); Tyler F. Hooper, Lynn, MA (US)

(73) Assignee: General Electric Company, Evendale, OH (US)

( * ) Notice: Subject to any disclaimer, the term of this patent is extended or adjusted under 35 U.S.C. 154(b) by 16 days.

(21) Appl. No.: 18/393,389

(22) Filed: Dec. 21, 2023

(65) Prior Publication Data

US 2024/0337198 A1 Oct. 10, 2024

Related U.S. Application Data

(63) Continuation of application No. 17/739,766, filed on May 9, 2022, now Pat. No. 11,867,068.

(51) Int. Cl.
*F01D 11/20* (2006.01)
*F03G 7/06* (2006.01)
(Continued)

(52) U.S. Cl.
CPC .......... *F01D 11/20* (2013.01); *F03G 7/06145* (2021.08); *F03G 7/0665* (2021.08);
(Continued)

(58) Field of Classification Search
CPC .... F01D 11/20; F03G 7/06145; F03G 7/0665; H10N 30/206; H10N 30/50; H10N 30/802
See application file for complete search history.

(56) References Cited

U.S. PATENT DOCUMENTS 5,203,673 A 4/1993 Evans
5,545,007 A 8/1996 Martin
(Continued)

FOREIGN PATENT DOCUMENTS

WO 2010083805 A1 7/2010

OTHER PUBLICATIONS

United States Patent and Trademark Office, "Non-Final Office Action," issued in connection with U.S. Appl. No. 17/739,766, dated Apr. 20, 2023, 8 pages.

*Primary Examiner* — Hoang M Nguyen
(74) *Attorney, Agent, or Firm* — Hanley, Flight & Zimmerman, LLC

(57) ABSTRACT

Certain examples disclose and describe apparatus and methods to provide fast response active clearance system with piezoelectric actuator in axial, axial/radial combined, and circumferential directions. In some examples, an apparatus includes an actuator to control clearance between a blade and at least one of a shroud or a hanger, the actuator including a multilayer stack of material, and wherein the actuator is outside a case. The apparatus further includes a rod coupled to the actuator and the at least one of the shroud or the hanger through an opening in the case, the rod to move the at least one of the shroud or the hanger in a radial direction based on axial movement of the multilayer stack of material.

20 Claims, 18 Drawing Sheets

(51) Int. Cl.
*H10N 30/20* (2023.01)
*H10N 30/50* (2023.01)
*H10N 30/80* (2023.01)

(52) U.S. Cl.
CPC .......... *H10N 30/206* (2023.02); *H10N 30/50* (2023.02); *H10N 30/802* (2023.02)

(56) References Cited

U.S. PATENT DOCUMENTS

| | | | |
|---|---|---|---|
| 5,780,957 A * | 7/1998 | Oliver | B60J 1/17 |
| | | | 310/328 |
| 6,142,477 A | 11/2000 | Meinzer | |
| 6,927,528 B2 | 8/2005 | Barillot et al. | |
| 7,125,223 B2 | 10/2006 | Turnquist et al. | |
| 7,448,849 B1 | 11/2008 | Webster et al. | |
| 8,113,768 B2 | 2/2012 | Somanath et al. | |
| 8,939,709 B2 | 1/2015 | Nanukuttan et al. | |
| 8,961,115 B2 | 2/2015 | Rhoden et al. | |
| 9,845,700 B2 | 12/2017 | Dierksmeier | |
| 11,867,068 B2 | 1/2024 | Kim et al. | |
| 2008/0267770 A1 | 10/2008 | Webster et al. | |
| 2011/0215674 A1 * | 9/2011 | Rinner | H10N 30/073 |
| | | | 29/25.35 |
| 2012/0156007 A1 | 6/2012 | Bacic | |
| 2022/0254981 A1 * | 8/2022 | Kuroda | H10N 30/871 |

* cited by examiner

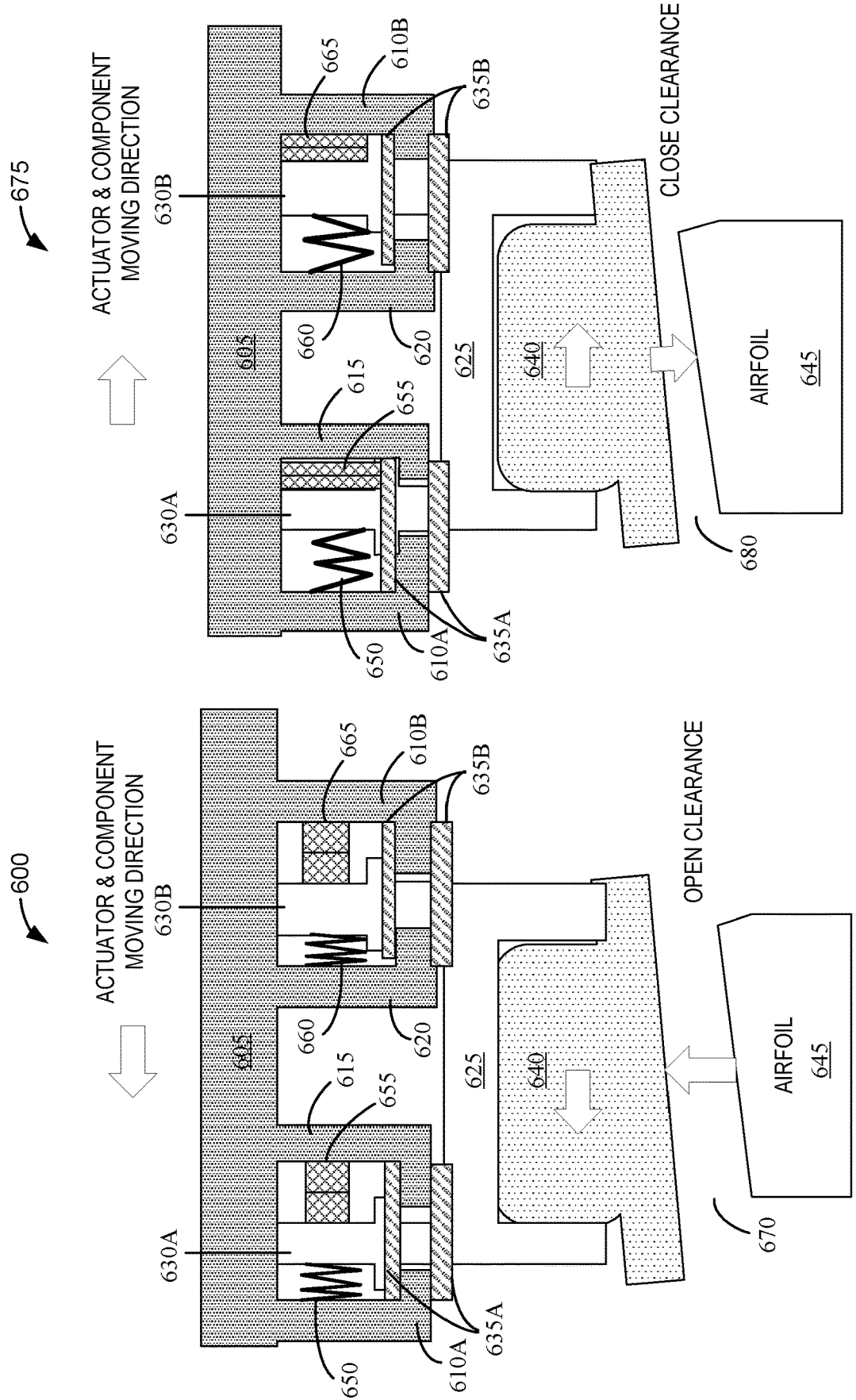

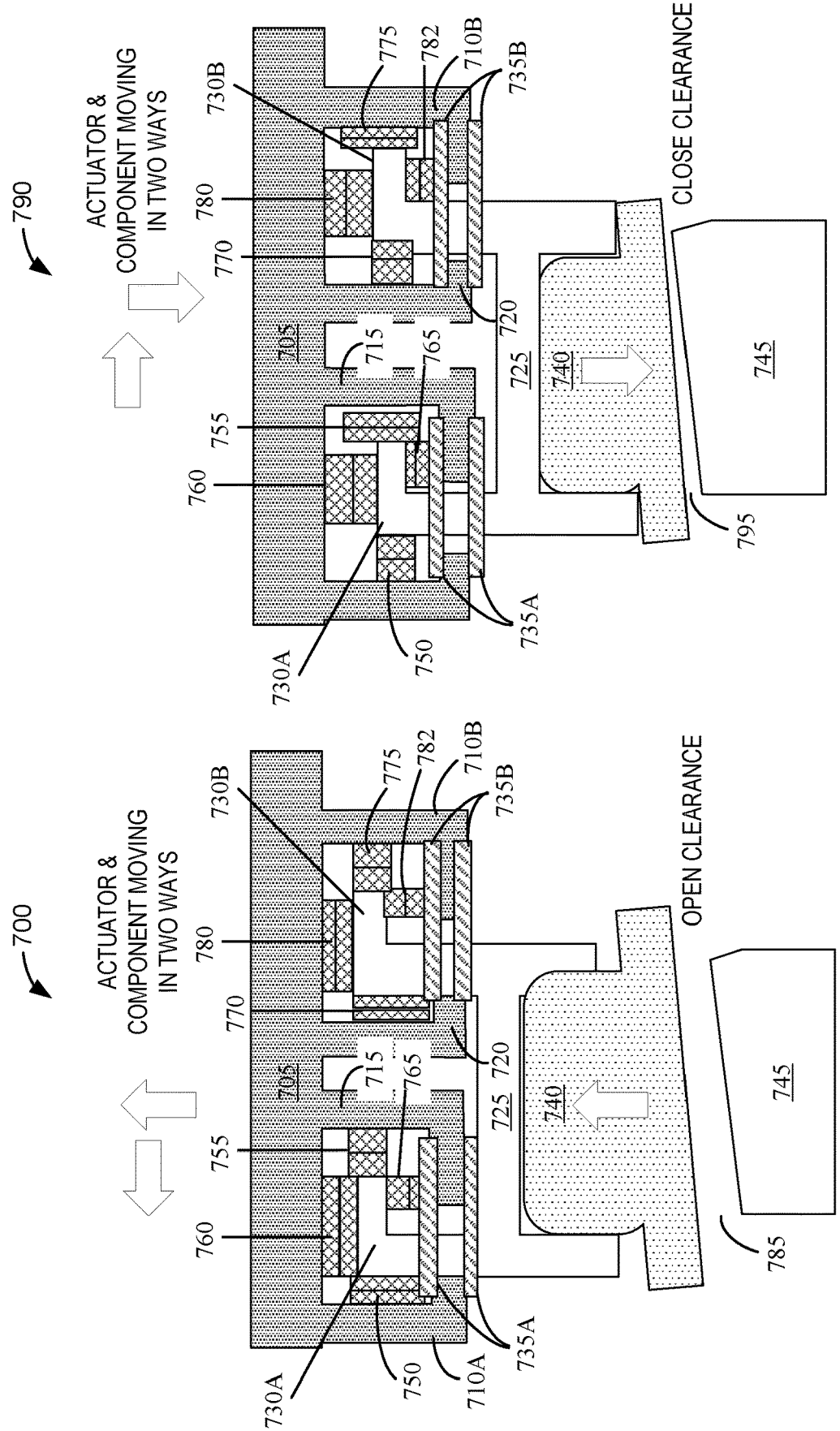

FAST RESPONSE ACTIVE CLEARANCE SYSTEMS WITH PIEZOELECTRIC ACTUATOR IN AXIAL, AXIAL/RADIAL COMBINED, AND CIRCUMFERENTIAL DIRECTIONS

REFERENCE TO RELATED APPLICATIONS

This patent claims the benefit of priority to U.S. patent application Ser. No. 17/739,766 (now U.S. Pat. No. 11,867,068), filed on May 9, 2022, entitled "FAST RESPONSE ACTIVE CLEARANCE SYSTEMS WITH PIEZOELECTRIC ACTUATOR IN AXIAL, AXIAL/RADIAL COMBINED, AND CIRCUMFERENTIAL DIRECTIONS," which is incorporated herein by reference in its entirety.

FIELD OF THE DISCLOSURE

This disclosure relates generally to a gas turbine engine and, more particularly, to fast response active clearance system with piezoelectric actuator in axial, axial/radial combined, and circumferential directions.

BACKGROUND

A gas turbine engine generally includes, in serial flow order, an inlet section, a compressor section, a combustion section, a turbine section, and an exhaust section. In operation, air enters the inlet section and flows to the compressor section where one or more axial compressors progressively compress the air until it reaches the combustion section. Fuel mixes with the compressed air and burns within the combustion section, thereby creating combustion gases. The combustion gases flow from the combustion section through a hot gas path defined within the turbine section and then exit the turbine section via the exhaust section.

In general, it is desirable for a gas turbine engine to maintain clearance between the tip of a blade in the gas turbine engine and the stationary parts of the gas turbine engine (e.g., the gas turbine engine casing, stator, etc.). During operation, the gas turbine engine is exposed to thermal (e.g., hot and cold air pumped into the gas turbine engine, etc.) and mechanical loads (e.g., centrifugal force on the blades on the gas turbine engine, etc.), which can expand and contract the gas turbine engine casing and rotor. The expansion and contraction of the gas turbine engine casing can change the clearance between the blade tip and the stationary parts of the gas turbine engine. There is a continuing need to control the clearance between the blade tip and the engine casing that fluctuates during normal operation for a gas turbine engine to avoid damage to the gas turbine engine (e.g., wear, breakage, etc. due to unintentional rub).

BRIEF DESCRIPTION OF THE DRAWINGS

FIGS. 6A and 6B are schematic cross-sectional views of a third example ACC system with an example axial, inner-stack piezoelectric actuator and spring load in accordance with teachings disclosed herein.

FIGS. 7A and 7B are schematic cross-sectional views of a fourth example ACC system with an example axial/radial combined piezoelectric actuator in accordance with teachings disclosed herein.

Figure 1:
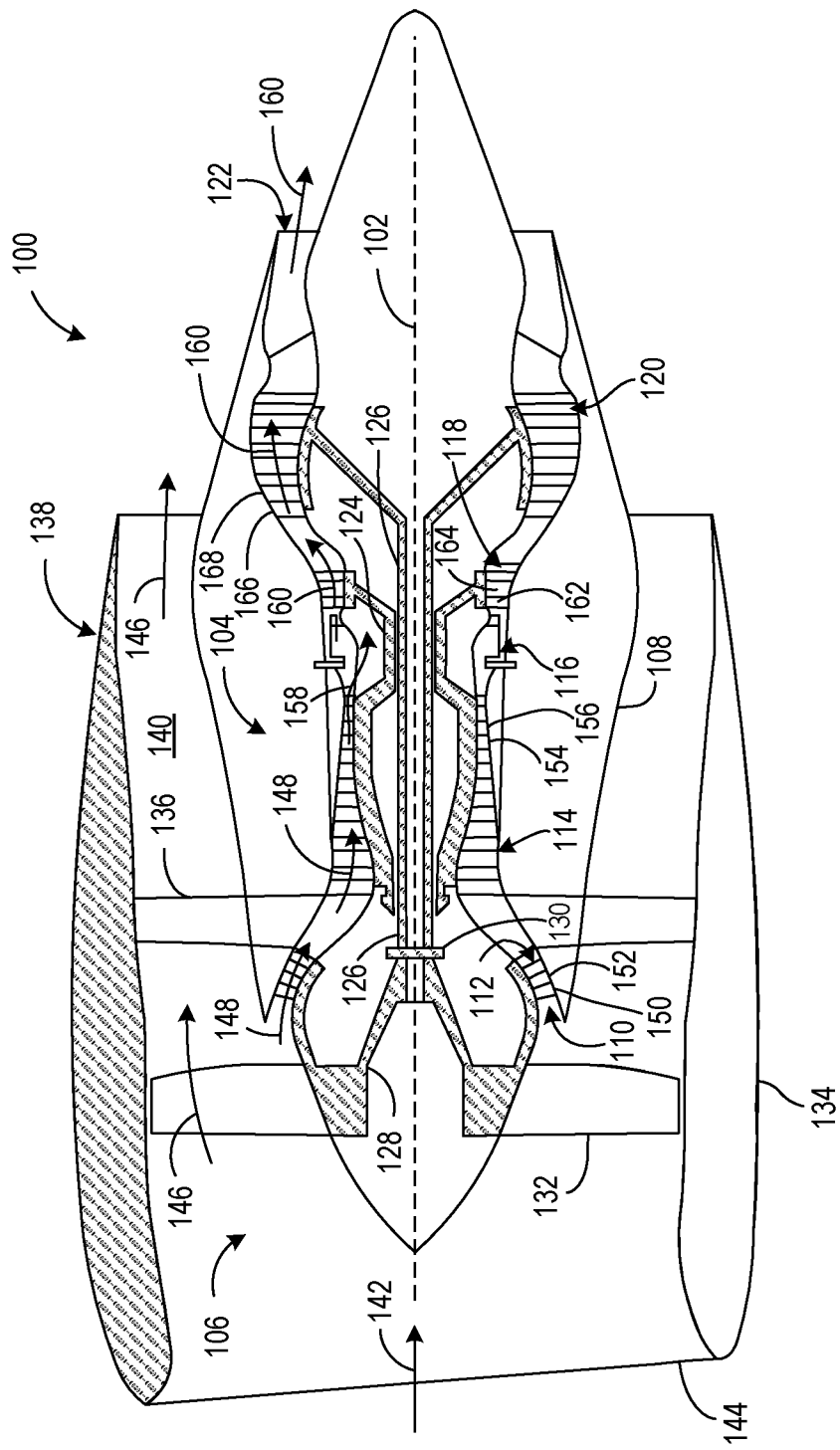
FIG. 1 is a schematic cross-sectional view of an example gas turbine engine in accordance with the examples disclosed herein.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts. As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

DETAILED DESCRIPTION

In the following detailed description, reference is made to the accompanying drawings that form a part hereof, and in which is shown by way of illustration specific examples that may be practiced. These examples are described in sufficient detail to enable one skilled in the art to practice the subject matter, and it is to be understood that other examples may be utilized. The following detailed description is therefore, provided to describe example implementations and not to be taken limiting on the scope of the subject matter described in this disclosure. Certain features from different aspects of the following description may be combined to form yet new aspects of the subject matter discussed below.

When introducing elements of various embodiments of the present disclosure, the articles "a," "an," "the," and "said" are intended to mean that there are one or more of the elements. The terms "first," "second," and the like, do not denote any order, quantity, or importance, but rather are used to distinguish one element from another. The terms "comprising," "including," and "having" are intended to be inclusive and mean that there may be additional elements other than the listed elements. As the terms "connected to," "coupled to," etc. are used herein, one object (e.g., a material, element, structure, member, etc.) can be connected to or coupled to another object regardless of whether the one object is directly connected or coupled to the other object or whether there are one or more intervening objects between the one object and the other object.

As used herein, the terms "system," "unit," "module," "engine," etc., may include a hardware and/or software system that operates to perform one or more functions. For example, a module, unit, or system may include a computer processor, controller, and/or other logic-based device that performs operations based on instructions stored on a tangible and non-transitory computer readable storage medium, such as a computer memory. Alternatively, a module, unit, engine, or system may include a hard-wired device that performs operations based on hard-wired logic of the device. Various modules, units, engines, and/or systems shown in the attached figures may represent the hardware that operates based on software or hardwired instructions, the software that directs hardware to perform the operations, or a combination thereof.

The terms "upstream" and "downstream" refer to the relative direction with respect to fluid flow in a fluid pathway. For example, "upstream" refers to the direction from which the fluid flows, and "downstream" refers to the direction to which the fluid flows. As used herein, "vertical" refers to the direction perpendicular to the ground. As used herein, "horizontal" refers to the direction parallel to the centerline of the gas turbine engine 100. As used herein, "lateral" refers to the direction perpendicular to the axial and vertical directions (e.g., into and out of the plane of FIGS. 1, 2, etc.).

In some examples used herein, the term "substantially" is used to describe a relationship between two parts that is within three degrees of the stated relationship (e.g., a substantially colinear relationship is within three degrees of being linear, a substantially perpendicular relationship is within three degrees of being perpendicular, a substantially parallel relationship is within three degrees of being parallel, etc.).

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

A turbine engine, also called a combustion turbine or a gas turbine, is a type of internal combustion engine. Turbine engines are commonly utilized in aircraft and power-generation applications. As used herein, the terms "asset," "aircraft turbine engine," "gas turbine," "land-based turbine engine," and "turbine engine" are used interchangeably. A basic operation of the turbine engine includes an intake of fresh atmospheric air flow through the front of the turbine engine with a fan. In some examples, the air flow travels through an intermediate-pressure compressor or a booster compressor located between the fan and a high-pressure compressor. A turbine engine also includes a turbine with an intricate array of alternating rotating and stationary airfoil-section blades. As the hot combustion gas passes through the turbine, the hot combustion gas expands, causing the rotating blades to spin.

The components of the turbine engine (e.g., the fan, the booster compressor, the high-pressure compressor, the high-pressure turbine, the low-pressure turbine, etc.) can degrade over time due to demanding operating conditions such as extreme temperature and vibration. During operation, the turbine engine components are exposed to thermal (e.g., hot and cold air pumped into the turbine engine, etc.) and mechanical loads (e.g., centrifugal force on the blades on the turbine engine, etc.), which can expand and contract the turbine engine casing and/or compressor casing within the turbine engine along with other components of the turbine engine and/or its compressor. The expansion and contraction of the turbine engine casing and/or compressor casing within the turbine engine can change the clearance between the blades' tips and the stationary components of the turbine engine. In some examples, if the clearance between the blades' tips and the stationary components is not controlled, then the blades' tips and stationary components can collide during operation and lead to further degradation of the components of the turbine engine.

The Active Clearance Control (ACC) System was developed to optimize blade tip clearance for engine performance improvement without unexpected rub events during flight and ground operations. A conventional ACC System includes using cooling air from a fan or compressor to control the clearance between the blade tip and an engine component that has shrunk (e.g., the stator, the case, etc.). The conventional ACC system is limited in that clearance is only modulated in one direction (e.g., engine component shrinkage). For a hot rotor condition (e.g., the engine component(s) are expanded), the conventional ACC system waits for rotor-stator thermal/mechanical growth matching to escape the hot rotor condition (e.g., modulate the blade tip clearance). Additionally, the conventional ACC system is limited in response time for modulating clearance (e.g., engine component shrinkage) due to the time delay for using a thermal response (e.g., cooling air). The response time for clearance modulation in the conventional ACC systems may be slow for certain systems that require faster responses for engine component shrinkage.

Examples disclosed herein optimize and/or otherwise improve an ACC system using piezoelectric actuator(s) that provide fast response clearance control without the mechanical delay seen in the conventional ACC system. Examples disclosed herein maintain desired clearances between the blade tip and other engine components without additional margin for various operating conditions, which will lead to performance improvement and provide better exhaust gas temperature (EGT) control capability. In certain examples, piezoelectric material generates linear displacement when an electric field is applied. The linear displacement can have a force, and examples disclosed herein apply the linear force of the piezoelectric material for the ACC system to achieve fast response clearance control. Examples disclosed herein apply the mechanical force from the linear displacement of the piezoelectric material on to modulating the ACC system. Examples disclosed herein can include other materials that generate linear displacement such as, shape memory alloy (SMA), etc. The range of displacement is increased by adding layers of piezoelectric material or SMA, called multilayer stacks, where more layers in a stack provides more axial movement and radial movement range and gives the ACC system more muscle capability.

Examples disclosed herein use an actuator to house the piezoelectric material. The actuator achieves clearance by converting the linear displacement of the piezoelectric material (e.g., axial displacement, axial/radial combined displacement, and circumferential displacement) into a radial directional clearance control and adjustment. In examples disclosed herein, the direction of the actuator (e.g., axial direction, axial/radial combined direction, and circumferential direction) achieves radial clearance control by mechanical conversion of the displacement of the piezoelectric material. Examples disclosed herein do not need additional clearance margin for maximum transient closure or hot-rotor condition like the conventional ACC system. Examples disclosed herein provide significant specific fuel consumption (SFC) improvement on tighter clearance and a better EGT control as there are no additional margins for transient closure or the hot rotor condition.

In the examples disclosed herein, the actuator for the piezoelectric material can provide a variety of design spaces with compact and simple piezo-stacks while providing the same high mechanical force as conventional ACC. Example disclosed herein propose five different mechanical design configurations for how to move the actuator and stack/locate the piezoelectric material in the actuator(s): (1) an axial actuator outside of a high pressure turbine (HPT) case or a compressor case (2) an axial actuator inside of hanger hooks (3) an axial actuator inside of hanger hooks with springs (4) an axial/radial combined actuator inside of hanger hooks, and (5) a circumferential actuator inside of the hanger. The example first mechanical design configuration includes an outer-stack piezoelectric actuator that generates a linear displacement from an applied electric field. The first mechanical design configuration includes the piezoelectric actuator in an axial direction that mechanically converts the linear displacement of the piezoelectric stack in the axial direction into a radial direction for clearance control (e.g., via a rod). The first mechanical design configuration has the benefit for easy access for maintenance and part replacement since the piezoelectric actuator is located outside the case (e.g., the HPT case, the compressor case, etc.). However, it also includes sealing concerns for the case. As the piezoelectric stack is located outside of the case, the first mechanical design configuration preserves the piezoelectric material in a cold condition, which reduces concern of temperature limitations for the piezoelectric material.

The example second mechanical design configuration includes an inner-stack piezoelectric actuator that applies two axial actuators on hanger hooks under the case. Each of the axial actuators of the second mechanical design configuration include two stacks of piezoelectric material on opposite sides of the hanger hooks to displace the hanger in an axial direction, which is mechanically converted to clearance control in the radial direction. The piezoelectric stacks are positioned on left and right surfaces of the hanger hooks to achieve more accurate modulation, and the second mechanical design configuration relatively reduces the concern for sealing present in the first mechanical design configuration. However, this second mechanical design configuration does not allow easy access for maintenance or part replacement compared to the first mechanical design configuration.

The third mechanical design configuration includes an inner-stack piezoelectric actuator that applies two axial actuators on hanger hooks under the case. The two axial actuators include inner-stacks of piezoelectric materials on a right surface of the hanger hooks and springs on the left surface of the hanger hooks. Each of the axial actuators of the include a stack of piezoelectric material and a spring on opposite sides of the hanger hook to displace the hanger in an axial direction, which is mechanically converted to clearance control in the radial direction. The third mechanical design configuration is a similar design to the second mechanical design configuration except including springs. The third mechanical design configuration needs less piezoelectric material stacks for cost, but it may cause uncertainty of modulation accuracy. The third mechanical design configuration also has the disadvantage for maintenance or part replacement compared to the first mechanical design configuration.

The example fourth mechanical design configuration includes an inner-stack piezoelectric actuator that applies two axial/radial combined actuators on hanger hooks under the case. Each of the axial/radial combined actuators include four stacks of piezoelectric material on all surfaces of the hanger hooks (e.g., left surface, right surface, upper surface, and lower surface) to displace the hanger in an axial direction and a radial direction, which are combined and mechanically converted to clearance control in the radial direction. The piezoelectric stacks are positioned on the left, right, upper, and lower surfaces of the hanger hooks to achieve a stronger and more accurate modulation, and the fourth mechanical design configuration relatively reduces the concern for sealing present in the first mechanical design configuration. However, this fourth mechanical design configuration does not allow easy access for maintenance or part replacement compared to the first mechanical design configuration. Furthermore, the more piezoelectric material stacks included in the fourth mechanical design configuration increases the cost.

The example fifth mechanical design configuration includes an inner-stack piezoelectric actuator that applies circumferential displacement on the under the case. The circumferential actuator of the fifth mechanical design configuration is located inside of the hanger body below the hanger hooks, and the circumferential actuator includes two stacks of piezoelectric materials on a right surface and a left surface of a rod connected to between the circumferential actuator and the case. In the example fifth mechanical design configuration, the hanger includes slanted slots (slope angle) that are connected to pins in the case. The displacement of the piezoelectric materials in the circumferential actuator move the hanger along the slanted slots to mechanically convert the circumferential displacement of the hanger into clearance control in the radial direction. The fifth mechanical design configuration provides circumferential gap adjustment between the hanger/shroud and the blade tip while also providing radial clearance control using the piezoelectric material displacement combine with the slanted slots and pins of the hanger and case, respectively. However, the fifth mechanical design configuration also has the disadvantage for maintenance or part replacement.

Certain examples provide an engine controller, referred to as a full authority digital engine (or electronics) control (FADEC). The FADEC includes a digital computer, referred to as an electronic engine controller (EEC) or engine control unit (ECU), and related accessories that control aspects of aircraft engine performance. The FADEC can be used with a variety of engines such as piston engines, jet engines, other aircraft engines, etc. In certain examples, the EEC/ECU is provided separate from the FADEC, allowing manual override or intervention by a pilot and/or other operator.

In examples disclosed herein, the engine controller receives values for a plurality of input variables relating to flight condition (e.g., air density, throttle lever position, engine temperatures, engine pressures, etc.). The engine controller computes engine operating parameters such as fuel flow, stator vane position, air bleed valve position, etc., using the flight condition data. The engine operating parameters can be used by the engine controller to control operation of the piezoelectric actuator(s) to modulate blade tip clearance in the turbine engine.

Reference now will be made in detail to examples of the present disclosure, one or more examples of which are illustrated in the drawings. Each example is provided by way of explanation only, not limitation of the present disclosure. In fact, it will be apparent to those skilled in the art that various modifications and variations can be made in the preferred embodiments without departing from the scope or spirit of the present disclosure. For instance, features illustrated or described as part of one embodiment can be used with another embodiment to yield a still further embodiment. Thus, it is intended that the examples disclosed and described herein cover such modifications and variations as come within the scope of the appended claims and their equivalents.

FIG. 1 is a schematic cross-sectional view of a conventional turbofan-type gas turbine engine 100 ("turbofan 100"). As shown in FIG. 1, the turbofan 100 defines a longitudinal or axial centerline axis 102 extending therethrough for reference. In general, the turbofan 100 may include a core turbine or gas turbine engine 104 disposed downstream from a fan section 106.

The core turbine 104 generally includes a substantially tubular outer casing 108 that defines an annular inlet 110. The outer casing 108 can be formed from a single casing or multiple casings. The outer casing 108 encloses, in serial flow relationship, a compressor section having a booster or low pressure compressor 112 ("LP compressor 112") and a high pressure compressor 114 ("HP compressor 114"), a combustion section 116, a turbine section having a high pressure turbine 118 ("HP turbine 118") and a low pressure turbine 120 ("LP turbine 120"), and an exhaust section 122. A high pressure shaft or spool 124 ("HP shaft 124") drivingly couples the HP turbine 118 and the HP compressor 114. A low pressure shaft or spool 126 ("LP shaft 126") drivingly couples the LP turbine 120 and the LP compressor 112. The LP shaft 126 may also couple to a fan spool or shaft 128 of the fan section 106. In some examples, the LP shaft 126 may couple directly to the fan shaft 128 (i.e., a direct-drive configuration). In alternative configurations, the LP shaft 126 may couple to the fan shaft 128 via a reduction gearbox 130 (i.e., an indirect-drive or geared-drive configuration).

As shown in FIG. 1, the fan section 106 includes a plurality of fan blades 132 coupled to and extending radially outwardly from the fan shaft 128. An annular fan casing or nacelle 134 circumferentially encloses the fan section 106 and/or at least a portion of the core turbine 104. The nacelle 134 is supported relative to the core turbine 104 by a plurality of circumferentially-spaced apart outlet guide vanes 136. Furthermore, a downstream section 138 of the nacelle 134 can enclose an outer portion of the core turbine 104 to define a bypass airflow passage 140 therebetween.

As illustrated in FIG. 1, air 142 enters an inlet portion 144 of the turbofan 100 during operation thereof. A first portion 146 of the air 142 flows into the bypass airflow passage 140, while a second portion 148 of the air 142 flows into the inlet 110 of the LP compressor 112. One or more sequential stages of LP compressor stator vanes 150 and LP compressor rotor blades 152 coupled to the LP shaft 126 progressively compress the second portion 148 of the air 142 flowing through the LP compressor 112 en route to the HP compressor 114. Next, one or more sequential stages of HP compressor stator vanes 154 and HP compressor rotor blades 156 coupled to the HP shaft 124 further compress the second portion 148 of the air 142 flowing through the HP compressor 114. This provides compressed air 158 to the combustion section 116 where it mixes with fuel and burns to provide combustion gases 160.

The combustion gases 160 flow through the HP turbine 118 in which one or more sequential stages of HP turbine stator vanes 162 and HP turbine rotor blades 164 coupled to the HP shaft 124 extract a first portion of kinetic and/or thermal energy from the combustion gases 160. This energy extraction supports operation of the HP compressor 114. The combustion gases 160 then flow through the LP turbine 120 where one or more sequential stages of LP turbine stator vanes 166 and LP turbine rotor blades 168 coupled to the LP shaft 126 extract a second portion of thermal and/or kinetic energy therefrom. This energy extraction causes the LP shaft 126 to rotate, thereby supporting operation of the LP compressor 112 and/or rotation of the fan shaft 128. The combustion gases 160 then exit the core turbine 104 through the exhaust section 122 thereof.

Along with the turbofan 100, the core turbine 104 serves a similar purpose and operates in a similar environment in land-based gas turbines, turbojet engines in which the ratio of the first portion 146 of the air 142 to the second portion 148 of the air 142 is less than that of a turbofan, and unducted fan engines in which the fan section 106 is devoid of the nacelle 134. In each of the turbofan, turbojet, and unducted engines, a speed reduction device (e.g., the reduction gearbox 130) may be included between any shafts and spools. For example, the reduction gearbox 130 may be disposed between the LP shaft 126 and the fan shaft 128 of the fan section 106.

Figure 2:
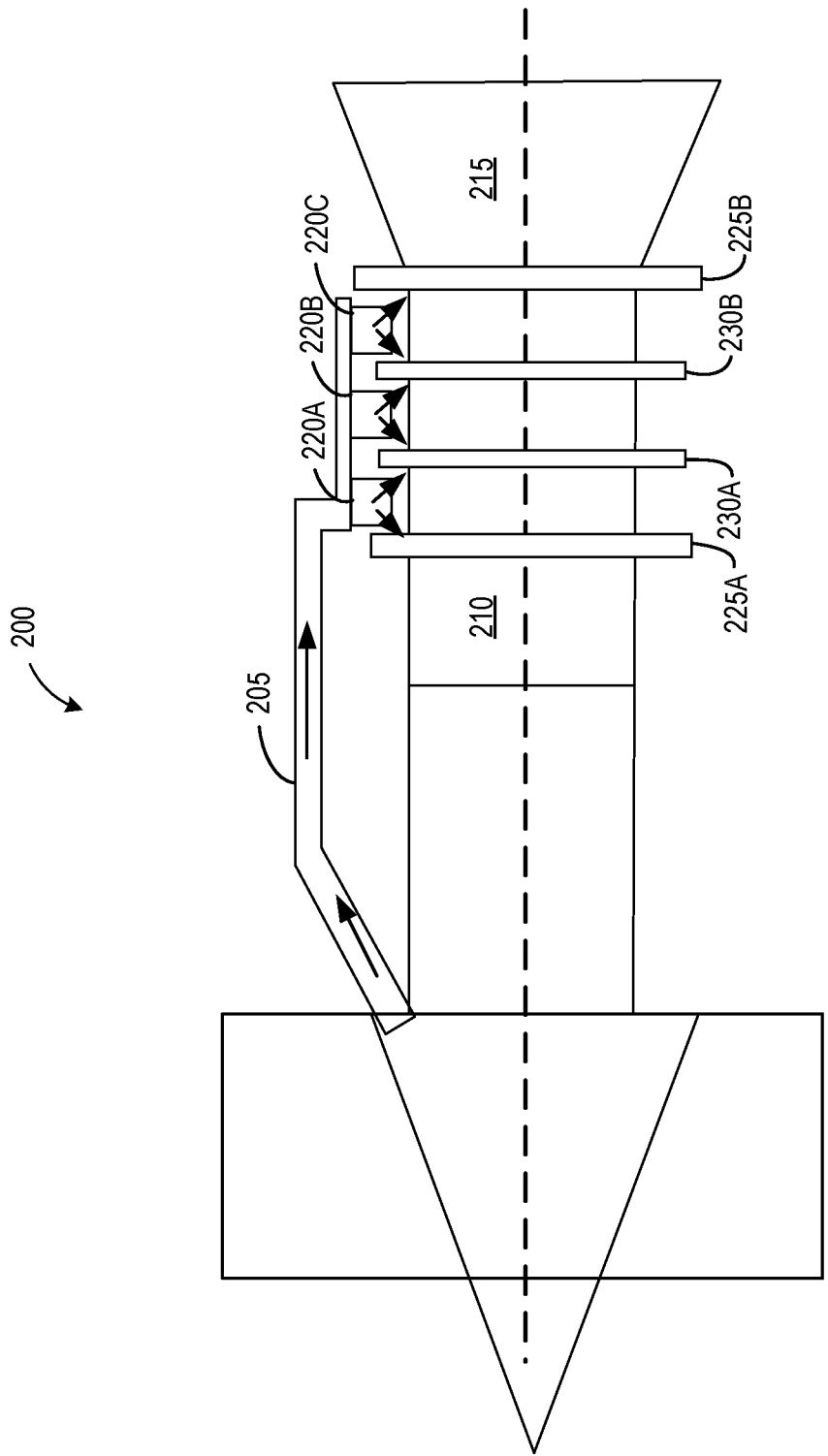
FIG. 2 is a schematic cross-sectional view of an example gas turbine engine with a conventional active clearance control (ACC) system.

FIG. 2 is a schematic cross-sectional view of an example gas turbine engine (such as the example turbofan 100) with a conventional active clearance control (ACC) system 200. The ACC system 200 includes an example main pipe 205, an example high pressure turbine 210, an example low pressure turbine 215, example manifolds 220A, 220B, 220C, example flanges 225A, 225B, and example mid-rings 230A, 230B. In the illustrated example of FIG. 2, air from a fan (e.g., from the fan section 106) enters the main pipe 205, where the airflow in the main pipe 205 is shown by the arrows in FIG. 2. In some examples, the inlet of the main pipe 205 is located at the fan (e.g., the fan section 106 of FIG. 1) or upstream of a compressor (e.g., the HP compressor 114 of FIG. 1) for the high pressure turbine 210. In some examples, the ACC system 200 is applicable for a compressor (e.g., the HP compressor 114 and LP compressor 112 of FIG. 1) and the low pressure turbine 215. The main pipe 205 delivers the air from the fan to the manifolds 220A, 220B, 220C. The manifolds 220A, 220B, 220C evenly distribute the air from the fan to the high pressure turbine 210 and the low pressure turbine 215. In some examples, the high pressure turbine 210 is substantially similar to the HP turbine 118 and the low pressure turbine 215 is substantially similar to the LP turbine 120. The flanges 225A, 225B and mid-rings 230A, 230B are joined to the outer surfaces of the high pressure turbine 210 case and the low pressure turbine 215 case. The flanges 225A, 225B and mid-rings 230A, 230B are configured to contract radially inward and/or expand radially outward in responses to changes in temperature (e.g., changes in temperature caused by the air from the manifolds 220A, 220B, 220C). In some examples, at least some of the air is directed to impinge on the surfaces of the flanges 225A, 225B and mid-rings 230A, 230B. In some examples, the contraction inward and expansion outward of the flanges 225A, 225B and the mid-rings 230A, 230B can change blade tip clearances in the high pressure turbine 210 and the low pressure turbine 215.

Figure 3:
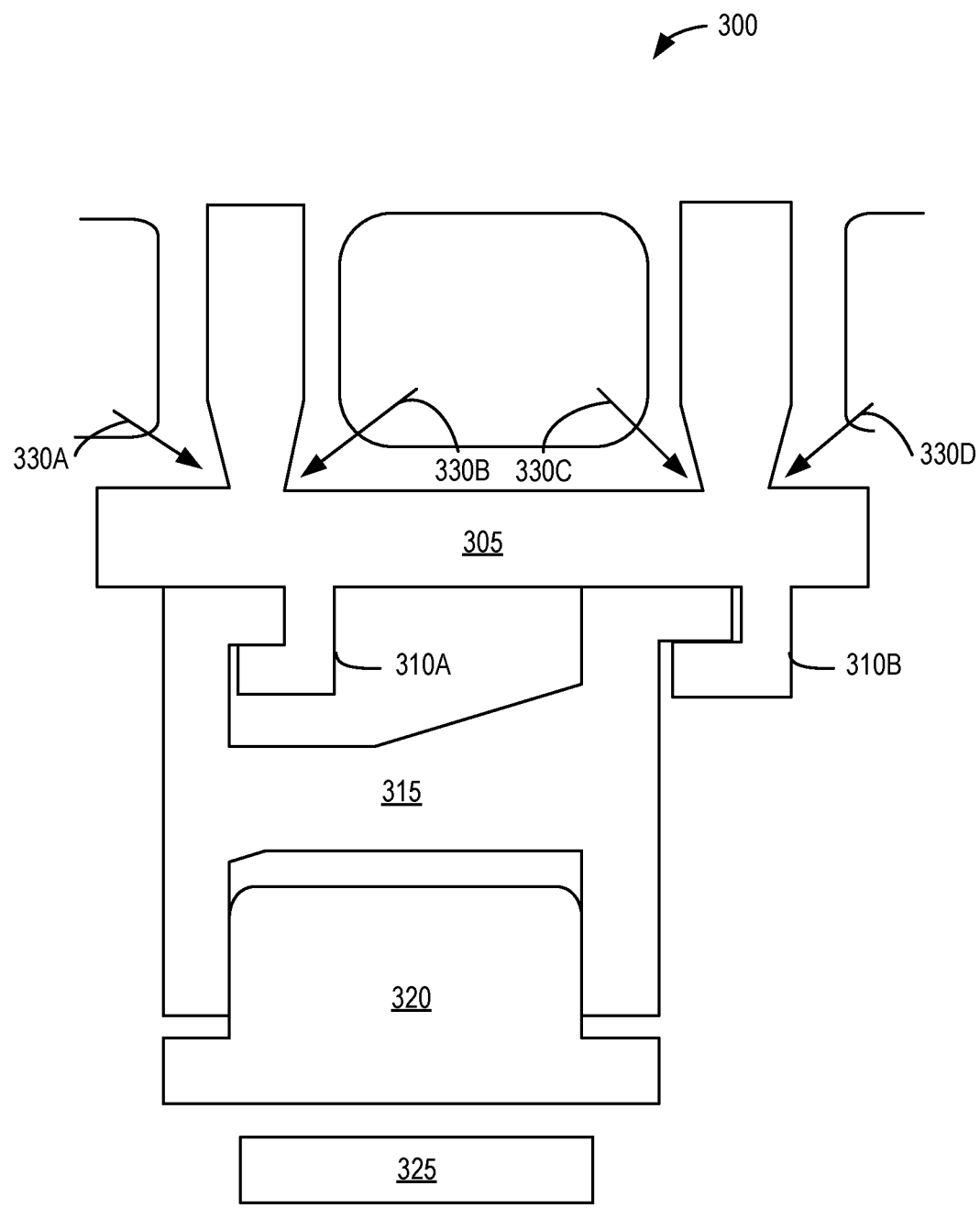
FIG. 3 is a schematic cross-sectional view of a prior ACC system for a gas turbine engine.

FIG. 3 is a schematic cross-sectional view of a prior ACC system 300 for the example gas turbine engine 100 of FIG. 1. The prior ACC system 300 includes a case 305, guiding hooks 310A, 310B, a hanger 315, a shroud 320, and a blade 325. In the illustrated example of FIG. 3, the case 305 is the casing surrounding either the HP turbine 118, the LP turbine 120, and/or the compressor (e.g., the HP compressor 114 and LP compressor 112 of FIG. 1). The case 305 includes the guiding hooks 310A, 310B, wherein the guiding hooks 310A, 310B connect the case 305 to the hanger 315. The hanger 315 is connected to the shroud 320.

In the illustrated example of FIG. 3, the prior ACC system 300 determines the clearance between the shroud 320 and the blade 325. The arrows 330A-330D in the prior ACC system 300 are representative of the cooling airflow from the main pipe 205 and manifolds 220A, 220B, 220C of the example FIG. 2. The prior ACC system 300 controls the movement of the shroud 320 in only one direction (e.g., inward towards the blade 325). The prior ACC system 300 uses the cooling airflow from the compressor or fan to cool the case 305. The case 305 shrinks (e.g., moves inward) as it is cooled by the airflow. The case 305 moves the hanger 315 and shroud 320 inward towards the blade 325. The prior ACC system 300 is unable to move the case 305, the hanger 315, and the shroud 320 for expansion. For example, the ACC system 300 is unable to expand the case 305 (e.g., move outward) to increase the clearance between the shroud 320 and the blade 325. In such examples, the prior ACC system 300 waits for clearance between the shroud 320 and the blade 325 to open (e.g., increase). The prior ACC system 300 does not provide bi-directional control of the clearance between the shroud 320 and the blade 325.

In some examples (e.g., the prior ACC system 300 of FIG. 3), an ACC system directs airflow around the case of an engine to control clearance between the case and the blade tip. For example, the ACC system controls the cooling airflow (represented as arrows 330A-330D in FIG. 3) from a compressor or fan to the case 305. In some examples, the ACC system mixes hot and cold air from a compressor and a bypass duct (contains turbofan airflow that bypassed the engine core) respectively to a desired temperature. In some examples, the ACC system helps to maintain and adjust the clearance between the engine case and the blade tip in prior ACC systems. In prior ACC systems (e.g., the prior ACC system 300 of FIG. 3), cooling airflow around the engine case (e.g., case 305) adjusts the clearance by controlling the thermal expansion and contraction of the case. In some examples, the ACC system controls the cooling airflow to either contract or expand the turbine engine case. For example, the prior ACC system 300 directs cooling airflow to the case 305 to contract the case 305 and restricts the cooling airflow to the case 305 to expand the case 305. The ACC system controls the cooling airflow to adjust the clearance to compensate any changes in the blade of the turbine engine. In some examples, the ACC system is controlled by a controller in the turbine engine (e.g., the FADEC). The FADEC sends electrical control signals to the ACC system to signal the ACC system to modulate the airflow to control the case thermal expansion. The ACC system ultimately controls the amount of cooling airflow to manage the turbine engine casing temperatures, thereby adjusting the blade tip clearance.

Figure 4B:
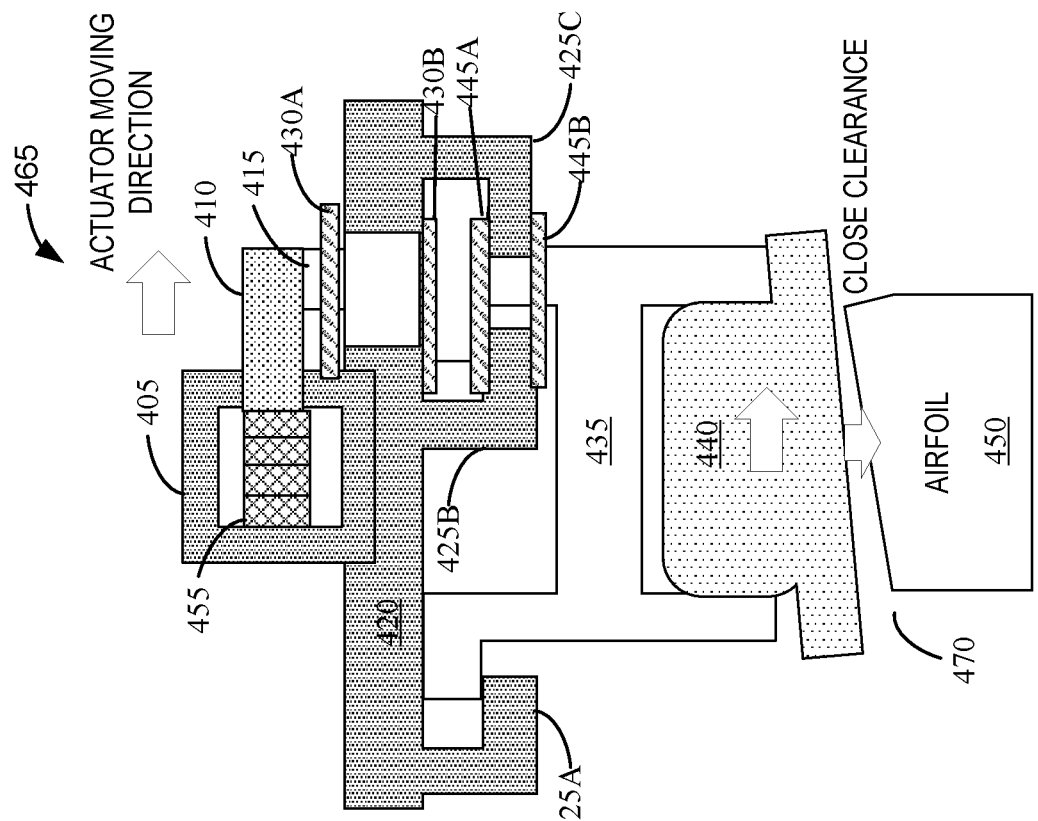
FIGS. 4A and 4B are schematic cross-sectional views of a first example ACC system with an example axial, outer-stack piezoelectric actuator in accordance with teachings disclosed herein.
Figure 4A:
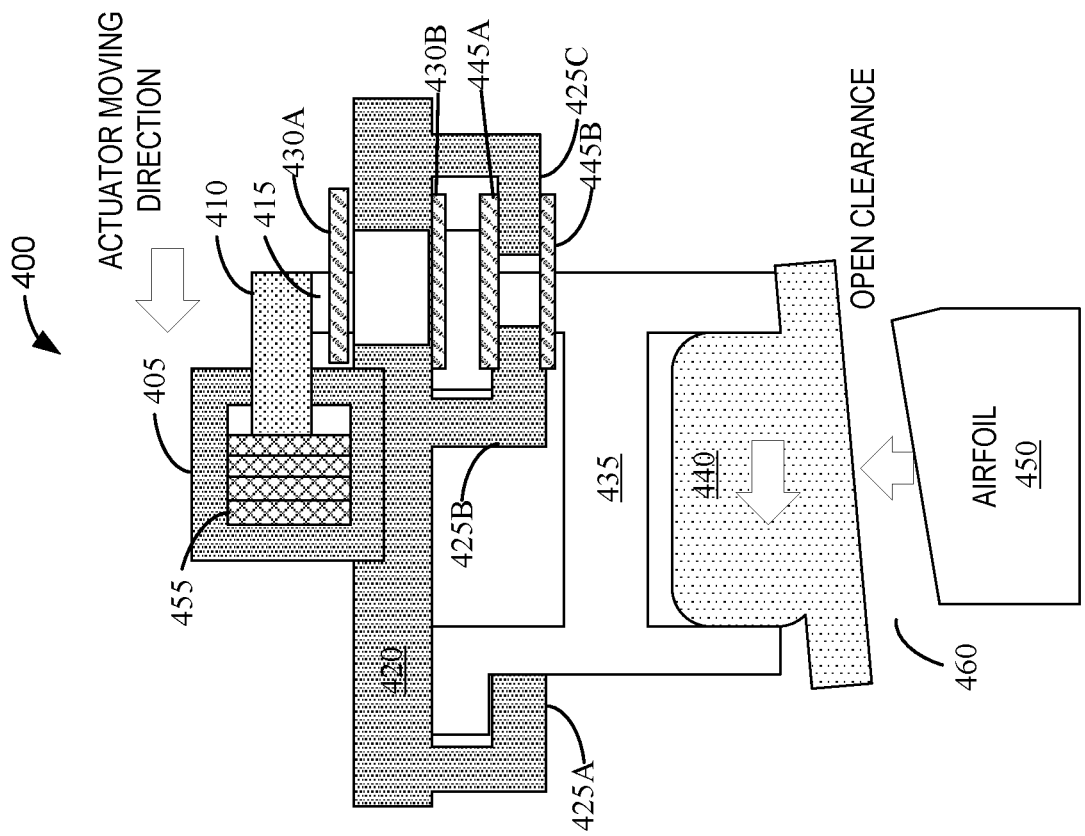

FIGS. 4A and 4B are schematic cross-sectional views of a first example ACC system 400, 465 including an example axial, outer-stack piezoelectric actuator in accordance with teachings disclosed herein. An example ACC system 400 of FIG. 4A illustrates an example actuator 405 in an open clearance state. The example ACC system 400 of FIG. 4A includes an actuator 405, a first rod 410, a second rod 415, a case 420, outer sealing 430A, 430B, a hanger 435, a shroud 440, inner sealing 445A, 445B, and a blade 450. The actuator 405 includes a multilayer piezoelectric stack 455, for example. The example ACC system 400 of FIG. 4A includes an open clearance 460 between the shroud 440 and the blade 450.

FIG. 4B shows an alternative implementation of an ACC system 465. The example ACC system 465 of FID. 4B illustrates the example actuator 405 in a closed/tight clearance state. The example ACC system 465 includes the actuator 405, the first rod 410, the second rod 415, the case 420, the outer sealing 430A, 430B, the hanger 435, the shroud 440, the inner sealing 445A, 445B, and the blade 450 of FIG. 4A. The actuator 405 of FIG. 4B includes the multilayer piezoelectric stack 455 which is expanded (or elongated) in the axial direction and contracted in the radial direction. The ACC system 465 of FIG. 4B includes a tight/closed clearance 470 between the shroud 440 and the blade 450. In examples disclosed herein, the case 420 includes the guiding hooks 425A, 425B, 425C, wherein the guiding hooks 425A, 425B, 425C connect the case 420 to the hanger 435. The hanger 435 is connected to the shroud 440.

In the illustrated examples of FIGS. 4A and 4B, the actuator 405 is located outside of the case 420 and oriented in an axial direction. In some examples, the case 420 is a case surrounding a high pressure turbine (e.g., the HP turbine 118 of FIG. 1), a low pressure turbine (e.g., the LP turbine 120 of FIG. 1), and/or a compressor (e.g., the HP compressor 114 and LP compressor 112 of FIG. 1). In some examples, locating the actuator 405 outside of the case 420 prevents material temperature limitations from affecting the actuator 405. For example, hot gas temperatures in a high pressure turbine such as the HP turbine 118 of FIG. 1, could cause material limitations for the actuator 405 if the actuator 405 was located inside the case 420. In the example ACC systems 400 and 465, the actuator 405 includes a multilayer stack of piezoelectric material 455. In some examples, the piezoelectric material of the multilayer stack of piezoelectric material 455 includes quartz, topaz, etc. However, other piezoelectric materials or other materials that generate linear displacement, such as shape memory alloy (SMA) materials, etc., can be additionally and/or alternatively included. In some examples, locating the actuator 405 and the multilayer stack of piezoelectric material 455 outside of the case 420 helps to preserve the piezoelectric material in a cold condition without concern of temperature limitations. The location of the actuator 405 and the multilayer stack of piezoelectric material 455 provide a benefit of easy access for maintenance and part replacement, for example.

In the illustrated examples of FIGS. 4A and 4B, the multilayer stack of piezoelectric material 455 is connected to the first rod 410. The first rod 410 is connected to the multilayer stack of piezoelectric material 455 and the second rod 415. The second rod 415 is connected to the hanger 435 through the case 420. Since the actuator 405 and the multilayer stack of piezoelectric material 455 are located outside of the case 420, the second rod 415 is inserted through the case to connect to the first rod 410 (which is connected to the multilayer stack of piezoelectric material 455) and the hanger 435. In some examples, the opening in the case 420 for the second rod 415 to be inserted through introduces possible leakage through the case 420. In such examples, the second rod 415 is surrounded by the outer sealing 430A, 430B and the inner sealing 445A, 445B to seal the opening in the case 420 that the second rod 415 is inserted through. For example, the second rod 415 is surrounded by the outer sealing 430A, 430B to seal the opening in the case 420, and the second rod 415 is surrounded by the inner sealing 445A, 445B to seal the opening between the guiding hooks 425B and 425C.

Figure 12:
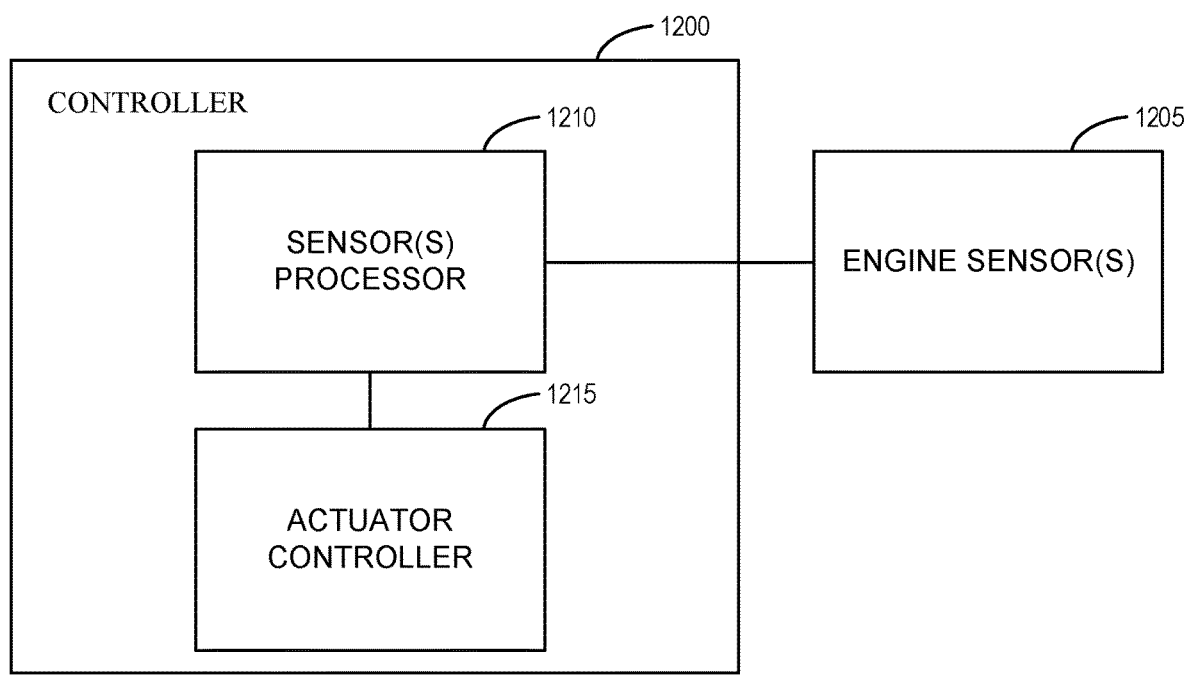
FIG. 12 is a block diagram of an example controller of the example ACC systems of FIGS. 4A-11C.

In the illustrated examples of FIGS. 4A and 4B, the multilayer stack of piezoelectric material 455 generates a linear displacement of the first rod 410 and the second rod 415 from an electrical signal generated by an example controller (not shown). An example implementation of the controller that generates the electrical signal is illustrated in FIG. 12, which is described in further detail below. In some examples, the first rod 410 moves the second rod 415 in an axial direction using the linear displacement generated by the multilayer stack of piezoelectric material 455. In some examples, the second rod 415 moves the hanger 435 in an axial direction using the linear displacement from the first rod 410 (generated by the multilayer stack of piezoelectric material 455). In the illustrated example, the hanger 435 and the shroud 440 are connected and move together. Therefore, in the illustrated example, the second rod 415 moves the hanger 435 and the shroud 440 using the linear displacement generated by the multilayer stack of piezoelectric material 455. In some examples, the ACC system 400 includes the shroud 440 without the hanger 435. In such examples, the second rod 415 moves the shroud 440 using the linear displacement from the first rod 410 (generated by the multilayer stack of piezoelectric material 455). In some examples, the range of the linear displacement is increased by adding more layers of piezoelectric material to the multilayer stack of piezoelectric material 455. For example, adding layers in the multilayer stack of piezoelectric material 455, increase the axial movement range and muscle capability for the ACC system 400, 465.

In the illustrated example of FIG. 4A, the ACC system 400 has an open clearance represented by the open clearance 460 between the shroud 440 and the blade 450. The multilayer stack of piezoelectric material 455 included in the actuator 405 controls the open clearance 460. In the ACC system 400, the actuator 405 receives a first electrical signal from an example controller, and the actuator 405 provides the first electrical signal to the multilayer stack of piezoelectric material 455. The first electrical signal causes a linear displacement of the multilayer stack of piezoelectric material 455 (e.g., each stack in the multilayer stack of piezoelectric material 455 is long and thin as seen in the example FIG. 4A). The linear displacement of the multilayer stack of piezoelectric material 455 moves the first rod 410 in an axial direction (e.g., leftward). The first rod 410 moves the second rod 415 in the axial direction (e.g., leftward), which moves the hanger 435 and the shroud 440 in the axial direction (e.g., leftward) away from the blade 450. In examples disclosed herein, and edge of the blade 450 near the shroud 440 is angled to control the clearance. In the illustrated example of FIG. 4A, the second rod 415 moves the hanger 435 and the shroud 440 in the axial direction (e.g., leftward) away from the edge of the blade 450, which increases the open clearance 460 in the radial direction.

The example ACC system 465 includes a tight/closed clearance, indicated by the tight clearance 470 between the shroud 440 and the blade 450 shown in FIG. 4B. The multilayer stack of piezoelectric material 455 included in the actuator 405 controls the tight clearance 470. In the ACC system 465, the actuator 405 receives a second electrical signal from an example controller, and the actuator 405 provides the second electrical signal to the multilayer stack of piezoelectric material 455. The second electrical signal causes a linear displacement of the multilayer stack of piezoelectric material 455 (e.g., each stack in the multilayer stack of piezoelectric material 455 is short and thick as seen in the example FIG. 4B). The linear displacement of the multilayer stack of piezoelectric material 455 moves the first rod 410 in an axial direction (e.g., rightward). The first rod 410 moves the second rod 415 in the axial direction (e.g., rightward), which moves the hanger 435 and the shroud 440 in the axial direction (e.g., rightward) toward the blade 450. In the illustrated example of FIG. 4B, the second rod 415 moves the hanger 435 and the shroud 440 in the axial direction (e.g., rightward) toward the edge of the blade 450, which decreases the tight clearance 470 in the radial direction.

In the illustrated examples of FIGS. 4A and 4B, the actuator 405 adjusts the clearance in two directions (e.g., shrinkage and expansion). The actuator 405 can be installed for an individual shroud (e.g., the shroud 440), partial groups of shrouds (e.g., for groups of three shrouds, for groups of five shrouds, etc.), or for an entire group of shrouds in a turbine (e.g., the shrouds surrounding the 360 degree inner surface of the case 420).

Figure 5B:
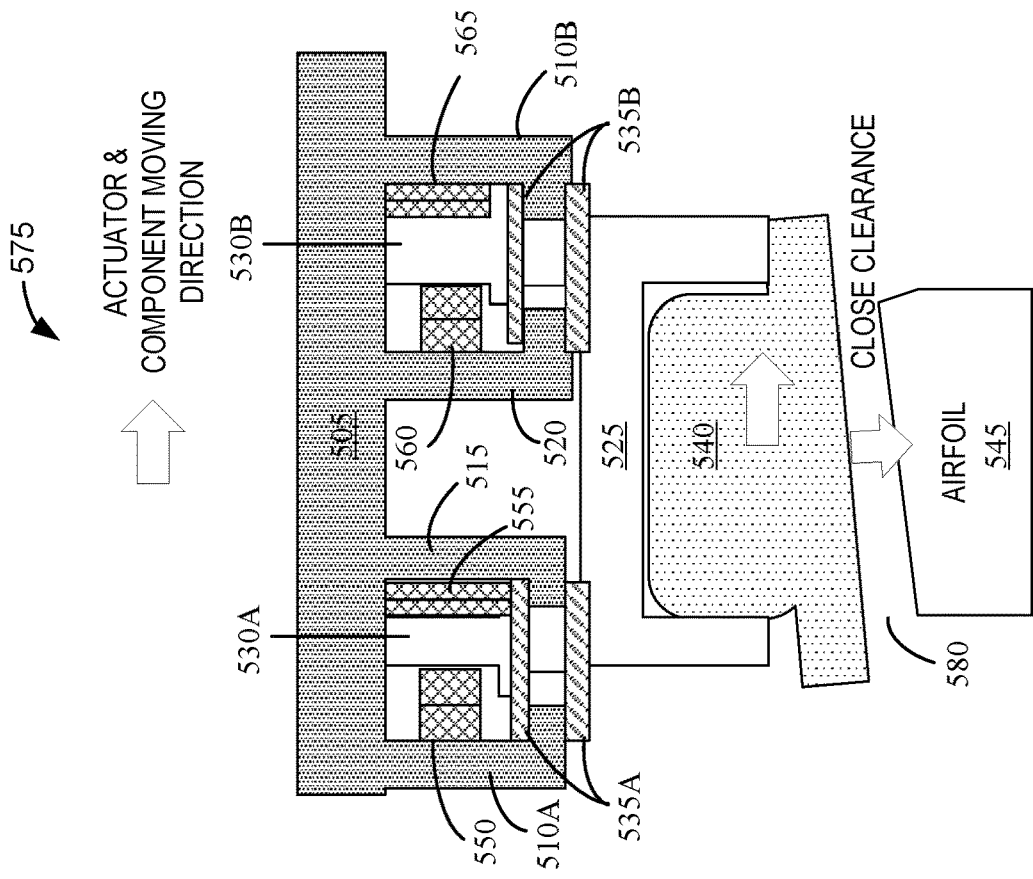
FIGS. 5A and 5B are schematic cross-sectional views of a second example ACC system with an example axial, inner-stack piezoelectric actuator in accordance with teachings disclosed herein.
Figure 5A:
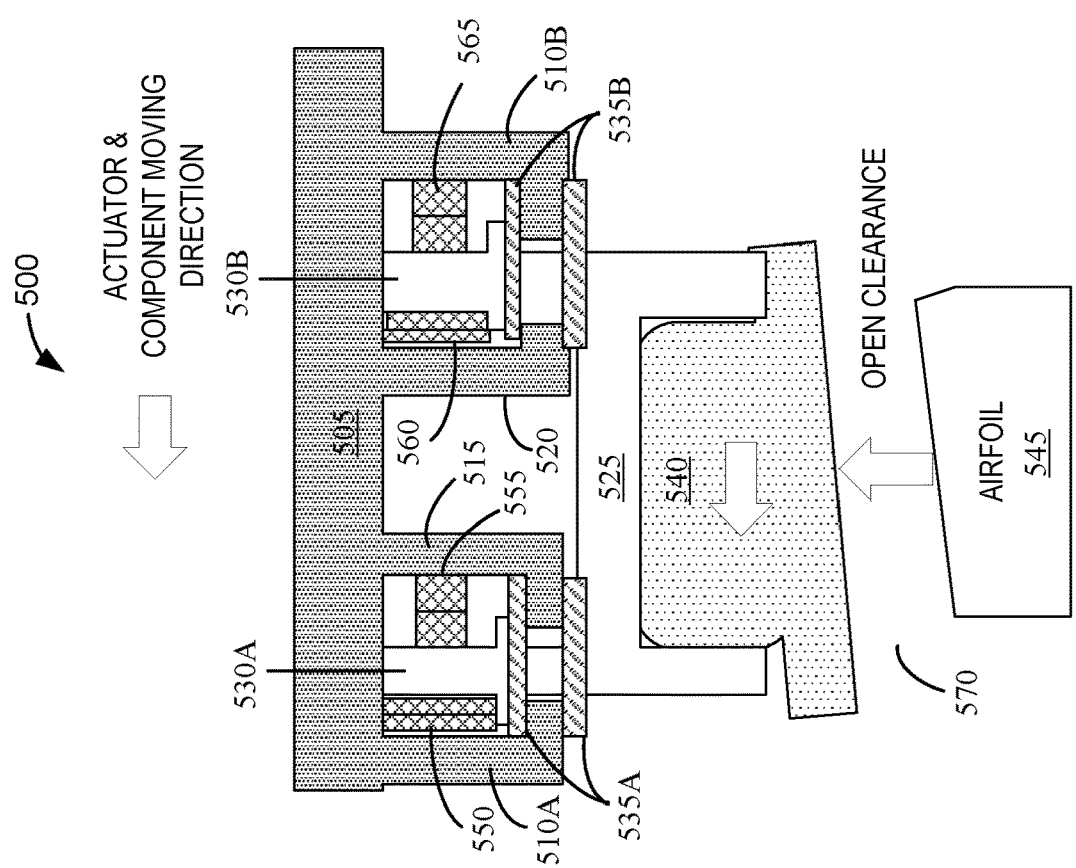

FIGS. 5A and 5B are schematic cross-sectional views of a second example ACC system 500, 575 with an example axial, inner-stack piezoelectric actuator in accordance with teachings disclosed herein. The example ACC system 500 of FIG. 5A includes a case 505, guiding hooks 510A, 510B, an actuator 515, an actuator 520, a hanger 525, hanger extensions 530A, 530B, sealant 535A, 535B, a shroud 540, and a blade 545. The actuator 515 includes a multilayer stack of piezoelectric material 550 and a multilayer stack of piezoelectric material 555. The actuator 520 includes a multilayer stack of piezoelectric material 560 and a multilayer stack of piezoelectric material 565. The ACC system 500 includes an open clearance 570 between the shroud 540 and the blade 545. The example ACC system 575 of FIG. 5B includes the case 505, the guiding hooks 510A, 510B, the actuator 515, the actuator 520, the hanger 525, the hanger extensions 530A, 530B, the sealant 535A, 535B, the shroud 540, and the blade 545 of FIG. 5A. The actuator 515 of FIG. 5B includes the multilayer stack of piezoelectric material 550 and the multilayer stack of piezoelectric material 555. The actuator 520 of FIG. 5B includes the multilayer stack of piezoelectric material 560 and the multilayer stack of piezoelectric material 565. The example ACC system 575 includes a tight clearance 580 between the shroud 540 and the blade 545. The case 505 includes the guiding hooks 510A, 510B, wherein the guiding hooks 510A, 510B connect the actuator 515 and the actuator 520 to the hanger 525. The hanger 525 is connected to the shroud 540.

In the illustrated examples of FIGS. 5A and 5B, the actuator 515 is located under the case 505 on the guiding hook 510A, and the actuator 520 is located under the case 505 on the guiding hook 510B. In some examples, the case 505 is a case surrounding a high pressure turbine (e.g., the HP turbine 118 of FIG. 1), a low pressure turbine (e.g., the LP turbine 120 of FIG. 1) or a compressor (e.g., the HP compressor 114 and LP compressor 112 of FIG. 1). In some examples, locating the actuator 515 and the actuator 520 under the case 505 reduces sealing concerns prevalent in the example ACC systems 400 and 465 of FIGS. 4A and 4B respectively, as described above. In the illustrated examples of FIGS. 5A and 5B, the actuator 515 and the actuator 520 are surrounded by the sealant 535A, 535B, respectively, to seal the opening in the guiding hooks 510A, 510B that the hanger extensions 530A, 530B are inserted through. However, the location of the actuator 515 and the actuator 520 prevents easy access for maintenance and part replacement.

In the illustrated examples of FIGS. 5A and 5B, the hanger 525 extends into the actuator 515 and the actuator 520 via the hanger extensions 530A, 530B. The multilayer stacks of piezoelectric material 550, 555, 560, 565 are connected to the hanger extensions 530A, 530B. The multilayer stack of piezoelectric material 550 is connected to a side (left) surface of the hanger extension 530A in the actuator 515. The multilayer stack of piezoelectric material 555 is connected to an opposite side (right) surface of the hanger extension 530A in the actuator 515. The multilayer stack of piezoelectric material 560 is connected to a side (left) surface of the hanger extension 530B in the actuator 520. The multilayer stack of piezoelectric material 565 is connected to an opposite side (right) surface of the hanger extension 530B in the actuator 520. In some examples, the piezoelectric material of the multilayer stacks of piezoelectric material 550, 555, 560, 565 can include quartz, topaz, etc. However, other piezoelectric materials or other materials that generate linear displacement, such as shape memory alloy (SMA) materials, etc., can be additionally and/or alternatively included.

In the illustrated examples of FIGS. 5A and 5B, the multilayer stacks of piezoelectric material 550, 555, 560, 565 generate a linear displacement of the hanger 525 from electrical signals generated by an example controller. An example controller that generates the electrical signal is illustrated in FIG. 12, which is described in further detail below. In the examples of FIGS. 5A and 5B, the hanger 525 and the shroud 540 are connected and move together. As such, the hanger 525 moves the shroud 540 in an axial direction using the linear displacement generated by the multilayer stacks of piezoelectric material 550, 555, 560, 565. In some examples, the ACC system 500 includes the shroud 540 without the hanger 525. In such examples, the shroud 540 moves using the linear displacement generated by the multilayer stacks of piezoelectric material 550, 555, 560, 565. The multilayer stacks of piezoelectric material 550, 555, 560, 565 are positioned on side surfaces (left and right) of the hanger extensions 530A, 530B in the actuator 515 and the actuator 520 to accurately modulate the linear displacement in the axial direction. In some examples, the range of the linear displacement is increased by adding more layers of piezoelectric material to the multilayer stacks of piezoelectric material 550, 555, 560, 565. For example, the more layers added in the multilayer stacks of piezoelectric material 550, 555, 560, 565, the more axial movement range and muscle capability for the ACC system.

The example ACC system 500 has an open clearance represented by the open clearance 570 between the shroud 540 and the blade 545. The multilayer stacks of piezoelectric material 550, 555, 560, 565 control the open clearance 570. In the ACC system 500, the actuator 515 and the actuator 520 receive a first electrical signal from an example controller. The actuator 515 provides the first electrical signal to the multilayer stack of piezoelectric material 550, and actuator 520 provides the first electrical signal to the multilayer stack of piezoelectric material 560. The first electrical signal causes a linear displacement of the multilayer stack of piezoelectric material 550 (e.g., each stack in the multilayer stack of piezoelectric material 550 is long and thin as seen in the example FIG. 5A) and the multilayer stack of piezoelectric material 560 (e.g., each stack in the multilayer stack of piezoelectric material 560 is long and thin as seen in the example FIG. 5A).

In the ACC system 500, the actuator 515 and the actuator 520 receive a second electrical signal from an example controller. In some examples, the actuator 515 and the actuator 520 receive the first electrical signal and the second electrical signal at the same time or at substantially the same time given transmission delay (e.g., in parallel). The actuator 515 provides the second electrical signal to the multilayer stack of piezoelectric material 555, and actuator 520 provides the second electrical signal to the multilayer stack of piezoelectric material 565. The second electrical signal causes a linear displacement of the multilayer stack of piezoelectric material 555 (e.g., each stack in the multilayer stack of piezoelectric material 555 is short and thick as seen in the example FIG. 5A) and the multilayer stack of piezoelectric material 565 (e.g., each stack in the multilayer stack of piezoelectric material 565 is short and thick as seen in the example FIG. 5A). The linear displacement of the multilayer stacks of piezoelectric material 550, 555, 560, 565 in the axial direction move the hanger 525 and shroud 540 the axial direction (e.g., leftward), which increases the distance between the shroud 540 and the blade 545 in the radial direction and increases the open clearance 570.

In the example of FIG. 5B, the ACC system 575 has a tight/closed clearance represented by the tight clearance 580 between the shroud 540 and the blade 545. The multilayer stacks of piezoelectric material 550, 555, 560, 565 control the tight clearance 580. In the ACC system 575, the actuator 515 and the actuator 520 receive a third electrical signal from an example controller. The actuator 515 provides the third electrical signal to the multilayer stack of piezoelectric material 550, and actuator 520 provides the third electrical signal to the multilayer stack of piezoelectric material 560. The third electrical signal causes a linear displacement of the multilayer stack of piezoelectric material 550 (e.g., each stack in the multilayer stack of piezoelectric material 550 is short and thick as seen in the example FIG. 5B) and the multilayer stack of piezoelectric material 560 (e.g., each stack in the multilayer stack of piezoelectric material 560 is short and thick as seen in the example FIG. 5B).

In the ACC system 575, the actuator 515 and the actuator 520 receive a fourth electrical signal from an example controller. In some examples, the actuator 515 and the actuator 520 receive the third electrical signal and the fourth electrical signal at the same time or at substantially the same time given transmission delay (e.g., in parallel). The actuator 515 provides the fourth electrical signal to the multilayer stack of piezoelectric material 555, and actuator 520 provides the fourth electrical signal to the multilayer stack of piezoelectric material 565. The fourth electrical signal causes a linear displacement of the multilayer stack of piezoelectric material 555 (e.g., each stack in the multilayer stack of piezoelectric material 555 is long and thin as seen in the example FIG. 5B) and the multilayer stack of piezoelectric material 565 (e.g., each stack in the multilayer stack of piezoelectric material 565 is long and thin as seen in the example FIG. 5B). The linear displacement of the multilayer stacks of piezoelectric material 550, 555, 560, 565 in the axial direction move the hanger 525 and shroud 540 the axial direction (e.g., rightward), which decreases the distance between the shroud 540 and the blade 545 in the radial direction and decreases the tight clearance 580.

In the illustrated examples of FIGS. 5A and 5B, the actuator 515 and the actuator 520 adjust the clearance between the shroud 540 and the blade 545 in two directions (e.g., shrinkage and expansion). The actuator 515 and the actuator 520 can be installed for an individual shroud (e.g., the shroud 540), partial groups of shrouds (e.g., for groups of three shrouds, for groups of five shrouds, etc.), or for an entire group of shrouds in a turbine (e.g., the shrouds surrounding the 360 degree inner surface of the case 505).

FIGS. 6A and 6B are schematic cross-sectional views of a third example ACC system 600, 675 with an example axial, inner-stack piezoelectric actuator and spring load in accordance with teachings disclosed herein. The example ACC system 600 of FIG. 6A includes an example case 605, example guiding hooks 610A, 610B, an example actuator 615, an example actuator 620, an example hanger 625, example hanger extensions 630A, 630B, example sealant 635A, 635B, an example shroud 640, and an example blade 645. The actuator 615 includes an example spring 650 and an example stack of piezoelectric material 655. The actuator 620 includes an example spring 660 and an example stack of piezoelectric material 665. The ACC system 600 includes an example open clearance 670 between the shroud 640 and the blade 645. The example ACC system 675 of FIG. 6B includes the case 605, the guiding hooks 610A, 610B, the actuator 615, the actuator 620, the hanger 625, the hanger extensions 630A, 630B, the sealant 635A, 635B, the shroud 640, and the blade 645 of FIG. 6A. The actuator 615 of FIG. 6B includes the spring 650 and an example stack of piezoelectric material 655. The example actuator 620 of FIG. 6B includes the spring 660 and an example stack of piezoelectric material 665. The ACC system 675 includes an example tight clearance 680 between the shroud 640 and the blade 645.

In the illustrated examples of FIGS. 6A and 6B, the actuator 615 is located under the case 605 on the guiding hook 610A, and the actuator 620 is located under the case 605 on the guiding hook 610B. In some examples, the case 605 is a case surrounding a high pressure turbine (e.g., the HP turbine 118 of FIG. 1), a low pressure turbine (e.g., the LP turbine 120 of FIG. 1), or a compressor (e.g., the HP compressor 114 and LP compressor 112 of FIG. 1). In some examples, locating the actuator 615 and the actuator 620 under the case 605 reduces sealing concerns prevalent in the example ACC systems 400 and 465 of FIGS. 4A and 4B respectively, as described above. In the illustrated examples of FIGS. 6A and 6B, the actuator 615 and the actuator 620 are surrounded by the sealant 635A, 635B, respectively, to seal the opening in the guiding hooks 610A, 610B that the hanger extensions 630A, 630B are inserted through. However, the location of the actuator 615 and the actuator 620 prevents easy access for maintenance and part replacement.

In the example ACC systems 600 and 675, the actuator 615 includes the spring 650 and the multilayer stack of piezoelectric material 655. In the example ACC systems 600 and 675, the actuator 620 includes the spring 660 and the multilayer stack of piezoelectric material 665. In some examples, the piezoelectric material of the multilayer stacks of piezoelectric material 655, 665 can include quartz, topaz, etc. However, other piezoelectric materials or other materials that generate linear displacement, such as shape memory alloy (SMA) materials, etc., can be additionally and/or alternatively included. The multilayer stack of piezoelectric material 655 and the multilayer stack of piezoelectric material 665 each receive control electrical signals to operate in the ACC systems 600 and 675. The actuator 615 and the actuator 620 include springs 650, 660 instead of additional multilayer stacks of piezoelectric material because the springs reduce the controls complexity for the actuators 615, 620 (e.g., including the springs 650, 660 allows for the actuator 615 and the actuator 620 to only have to receive one electrical control signal each). However, the springs 650, 660 may cause uncertainty in linear displacement modulation in the example ACC system 600, 675 as compared to the example ACC system 500, 575.

In the illustrated examples of FIGS. 6A and 6B, the hanger 625 extends into the actuator 615 and the actuator 620 via the hanger extensions 630A, 630B. The multilayer stacks of piezoelectric material 655, 665 and the springs 650, 660 are connected to the hanger extensions 630A, 630B. The spring 650 is connected to a side (left) surface of the hanger extension 630A in the actuator 615. The multilayer stack of piezoelectric material 655 is connected to an opposite side (right) surface of the hanger extension 630A in the actuator 615. The spring 660 is connected to a side (left) surface of the hanger extension 630B in the actuator 620. The multilayer stack of piezoelectric material 665 is connected to an opposite side (right) surface of the hanger extension 630B in the actuator 620.

In the illustrated examples of FIGS. 6A and 6B, the multilayer stacks of piezoelectric material 655, 665 generate a linear displacement of the hanger 625 in an axial direction from electrical signals generated by an example controller. An example controller that generates the electrical signal is illustrated in FIG. 12, which is described in further detail below. The springs 650, 660 provide a load for the side (left) surfaces of the hanger extensions 630A, 630B based on the linear displacement of the multilayer stacks of piezoelectric material 655, 665. In the illustrated example of FIGS. 6A and 6B, the hanger 625 and the shroud 640 are connected and move together. As such, the hanger 625 moves the shroud 640 in an axial direction using the linear displacement generated by the multilayer stacks of piezoelectric material 655, 665. In some examples, the ACC system 600 includes the shroud 640 without the hanger 625. In such examples, the shroud 640 moves using the linear displacement generated by the multilayer stacks of piezoelectric material 655, 665. The multilayer stacks of piezoelectric material 655, 665 are positioned on side (right) surfaces of the hanger extensions 630A, 630B in the actuator 615 and the actuator 620 to accurately modulate the linear displacement in the axial direction. The springs 650, 660 are positioned on the side (left) surfaces of the hanger extensions 630A, 630B in the actuator 615 and the actuator 620 to provide a spring load to the hanger 625 based on the linear displacement generated by the multilayer stacks of piezoelectric material 655, 665. In some examples, the range of the linear displacement is increased by adding more layers of piezoelectric material to the multilayer stacks of piezoelectric material 655, 665. For example, the more layers added in the multilayer stacks of piezoelectric material 655, 665 the more axial movement range and muscle capability for the ACC system.

In the illustrated example of FIG. 6A, the ACC system 600 has an open clearance represented by the open clearance 670 between the shroud 640 and the blade 645. The multilayer stacks of piezoelectric material 655, 665 control the open clearance 670. In the ACC system 600, the actuator 615 and the actuator 620 receive a first electrical signal from an example controller. The actuator 615 provides the first electrical signal to the multilayer stack of piezoelectric material 655, and actuator 620 provides the first electrical signal to the multilayer stack of piezoelectric material 665. The first electrical signal causes a linear displacement of the multilayer stack of piezoelectric material 655 (each stack in the multilayer stack of piezoelectric material 655 is short and thick as seen in the example FIG. 6A) and the multilayer stack of piezoelectric material 665 (each stack in the multilayer stack of piezoelectric material 665 is short and thick as seen in the example FIG. 6A). The springs 650, 660 provide a spring load to match the linear displacement of the multilayer stacks of piezoelectric material 655, 665. For example, the springs 650, 660 compress to provide a load to match the change in linear displacement from the multilayer stacks of piezoelectric material 655, 665. The linear displacement of the multilayer stacks of piezoelectric material 655, 665 and the loads from the springs 650, 660 in the axial direction move the hanger 625 and shroud 640 in the axial direction (e.g., leftward), which increases the distance between the shroud 640 and the blade 645 in the radial direction and increases the open clearance 670.

In the illustrated example of FIG. 6B, the ACC system 675 has a tight/closed clearance represented by the tight clearance 680 between the shroud 640 and the blade 645. The multilayer stacks of piezoelectric material 655, 665 and the springs 650, 660 control the tight clearance 680. In the ACC system 675, the actuator 615 and the actuator 620 receive a second electrical signal from an example controller. The actuator 615 provides the second electrical signal to the multilayer stack of piezoelectric material 655, and actuator 620 provides the second electrical signal to the multilayer stack of piezoelectric material 665. The second electrical signal causes a linear displacement of the multilayer stack of piezoelectric material 655 (e.g., each stack in the multilayer stack of piezoelectric material 655 is long and thin as seen in the example FIG. 6B) and the multilayer stack of piezoelectric material 665 (e.g., each stack in the multilayer stack of piezoelectric material 665 is long and thin as seen in the example FIG. 6B). The springs 650, 660 provide a spring load to match the linear displacement of the multilayer stacks of piezoelectric material 655, 665. For example, the springs 650, 660 extend to provide a load to match the change in linear displacement from the multilayer stacks of piezoelectric material 655, 665. The linear displacement of the multilayer stacks of piezoelectric material 655, 665 and the loads from the springs 650, 660 in the axial direction move the hanger 625 and shroud 640 in the axial direction (e.g., rightward), which decreases the distance between the shroud 640 and the blade 645 in the radial direction and decreases the tight clearance 680.

In the illustrated examples of FIGS. 6A and 6B, the actuator 615 and the actuator 620 adjust the clearance between the shroud 640 and the blade 645 in two directions (e.g., shrinkage and expansion). The actuator 615 and the actuator 620 can be installed for an individual shroud (e.g., the shroud 640), partial groups of shrouds (e.g., for groups of three shrouds, for groups of five shrouds, etc.), or for an entire group of shrouds in a turbine (e.g., the shrouds surrounding the 360 degree inner surface of the case 605).

FIGS. 7A and 7B are schematic cross-sectional views of a fourth example ACC system 700, 790 with an example axial/radial combined piezoelectric actuator in accordance with teachings disclosed herein. The example ACC system 700 of FIG. 7A includes a case 705, guiding hooks 510A, 510B, an actuator 715, an actuator 720, a hanger 725, hanger extensions 730A, 730B, sealant 735A, 735B, a shroud 740, and a blade 745. The actuator 715 includes a multilayer stack of piezoelectric material 750, a multilayer stack of piezoelectric material 755, a multilayer stack of piezoelectric material 760, and a multilayer stack of piezoelectric material 765. The actuator 720 includes a multilayer stack of piezoelectric material 770, a multilayer stack of piezoelectric material 775, a multilayer stack of piezoelectric material 780, and a multilayer stack of piezoelectric material 782. The ACC system 700 includes an open clearance 785 between the shroud 740 and the blade 745. The example ACC system 790 of FIG. 7B includes the case 705, the guiding hooks 510A, 510B, the actuator 715, the actuator 720, the hanger 725, the hanger extensions 730A, 730B, the sealant 735A, 735B, the shroud 740, and the blade 745 of FIG. 7A. The actuator 715 of FIG. 7B includes the multilayer stack of piezoelectric material 750, the multilayer stack of piezoelectric material 755, the multilayer stack of piezoelectric material 760, and the multilayer stack of piezoelectric material 765. The actuator 720 of FIG. 7B includes the multilayer stack of piezoelectric material 770, the multilayer stack of piezoelectric material 775, the multilayer stack of piezoelectric material 780, and the multilayer stack of piezoelectric material 782. The example ACC system 790 includes a tight/closed clearance 795 between the shroud 740 and the blade 745. The case 705 includes the guiding hooks 710A, 710B, wherein the guiding hooks 710A, 710B connect the actuator 715 and the actuator 720 to the hanger 725. The hanger 725 is connected to the shroud 740.

In the illustrated examples of FIGS. 7A and 7B, the actuator 715 is located under the case 705 on the guiding hook 710A, and the actuator 720 is located under the case 705 on the guiding hook 710B. In some examples, the case 705 is a case surrounding a high pressure turbine (e.g., the HP turbine 118 of FIG. 1), a low pressure turbine (e.g., the LP turbine 120 of FIG. 1) or a compressor (e.g., the HP compressor 114 and LP compressor 112 of FIG. 1). In some examples, locating the actuator 715 and the actuator 720 under the case 705 reduces sealing concerns prevalent in the example ACC systems 400 and 465 of FIGS. 4A and 4B respectively, as described above. In the illustrated examples of FIGS. 7A and 7B, the actuator 715 and the actuator 720 are surrounded by the sealant 735A, 735B, respectively, to seal the opening in the guiding hooks 710A, 710B that the hanger extensions 730A, 730B are inserted through. However, the location of the actuator 715 and the actuator 720 prevents easy access for maintenance and part replacement.

In the illustrated examples of FIGS. 7A and 7B, the hanger 725 extends into the actuator 715 and the actuator 720 via the hanger extensions 730A, 730B. The multilayer stacks of piezoelectric material 750, 755, 760, 765, 770, 775, 780, 782 are connected to the hanger extensions 730A, 730B. The multilayer stack of piezoelectric material 750 is connected to a side (left) surface of the hanger extension 730A in the actuator 715. The multilayer stack of piezoelectric material 755 is connected to an opposite side (right) surface of the hanger extension 730A in the actuator 715. The multilayer stack of piezoelectric material 760 is connected to a top surface of the hanger extension 730A in the actuator 715. The multilayer stack of piezoelectric material 765 is connected to a bottom surface of the hanger extension 730A in the actuator 715. The multilayer stack of piezoelectric material 770 is connected to a side (left) surface of the hanger extension 730B in the actuator 720. The multilayer stack of piezoelectric material 775 is connected to an opposite side (right) surface of the hanger extension 730B in the actuator 720. The multilayer stack of piezoelectric material 780 is connected to a top surface of the hanger extension 730B in the actuator 720. The multilayer stack of piezoelectric material 782 is connected to a bottom surface of the hanger extension 730B in the actuator 720. In some examples, the piezoelectric material of the multilayer stacks of piezoelectric material 750, 755, 760, 765, 770, 775, 780, 782 can include quartz, topaz, etc. However, other piezoelectric materials or other materials that generate linear displacement, such as shape memory alloy (SMA) materials, etc., can be additionally and/or alternatively included.

In the illustrated examples of FIGS. 7A and 7B, the multilayer stacks of piezoelectric material 750, 755, 760, 765, 770, 775, 780, 782 generate a linear displacement of the hanger 725 from electrical signals generated by an example controller. An example controller that generates the electrical signals is illustrated in FIG. 12, which is described in further detail below. In the examples of FIGS. 7A and 7B, the hanger 725 and the shroud 740 are connected and move together. As such, the hanger 725 moves the shroud 740 in an axial direction and a radial direction using the linear displacement generated by the multilayer stacks of piezoelectric material 750, 755, 760, 765, 770, 775, 780, 782. In some examples, the ACC system 700 includes the shroud 740 without the hanger 725. In such examples, the shroud 740 moves using the linear displacement generated by the multilayer stacks of piezoelectric material 750, 755, 760, 765, 770, 775, 780, 782. In the illustrated examples of FIGS. 7A and 7B, the actuator 715 and the actuator 720 include four stacks of piezoelectric material on all surfaces of the hanger extensions 730A, 730B (e.g., left surface, right surface, upper/top surface, and lower/bottom surface) to displace the hanger 725 in an axial direction and a radial direction. The piezoelectric stacks (e.g., the multilayer stacks of piezoelectric material 750, 755, 760, 765 in the actuator 715 and the multilayer stacks of piezoelectric material 770, 775, 780, 782 in the actuator 720) are positioned on the left, right, upper, and lower surfaces of the hanger extensions 730A, 730B to achieve a stronger and more accurate clearance modulation. In some examples, the range of the linear displacement is increased by adding more layers of piezoelectric material to the multilayer stacks of piezoelectric material 750, 755, 760, 765, 770, 775, 780, 782. For example, the more layers added in the multilayer stacks of piezoelectric material 750, 755, 760, 765, 770, 775, 780, 782, the more axial and radial movement range and muscle capability for the ACC system.

The example ACC system 700 has an open clearance represented by the open clearance 785 between the shroud 740 and the blade 745. The multilayer stacks of piezoelectric material 750, 755, 760, 765, 770, 775, 780, 782 control the open clearance 785. In the ACC system 700, the actuator 715 and the actuator 720 receive a first electrical signal from an example controller. The actuator 715 provides the first electrical signal to the multilayer stack of piezoelectric material 750 and the multilayer stack of piezoelectric material 760, and actuator 720 provides the first electrical signal to the multilayer stack of piezoelectric material 770 and the multilayer stack of piezoelectric material 780. The first electrical signal causes a linear displacement of the multilayer stack of piezoelectric material 750, the multilayer stack of piezoelectric material 760, the multilayer stack of piezoelectric material 770, and the multilayer stack of piezoelectric material 780 (e.g., each stack in the multilayer stack of piezoelectric material 750, the multilayer stack of piezoelectric material 760, the multilayer stack of piezoelectric material 770, and the multilayer stack of piezoelectric material 780 are long and thin as seen in the example FIG. 7A).

In the ACC system 700, the actuator 715 and the actuator 720 receive a second electrical signal from an example controller. In some examples, the actuator 715 and the actuator 720 receive the first electrical signal and the second electrical signal at the same time or at substantially the same time given transmission delay (e.g., in parallel). The actuator 715 provides the second electrical signal to the multilayer stack of piezoelectric material 755 and the multilayer stack of piezoelectric material 765, and actuator 720 provides the second electrical signal to the multilayer stack of piezoelectric material 775 and the multilayer stack of piezoelectric material 782. The second electrical signal causes a linear displacement of the multilayer stack of piezoelectric material 755, the multilayer stack of piezoelectric material 765, the multilayer stack of piezoelectric material 775, and the multilayer stack of piezoelectric material 782 (e.g., each stack in the multilayer stack of piezoelectric material 755, the multilayer stack of piezoelectric material 765, the multilayer stack of piezoelectric material 775, and the multilayer stack of piezoelectric material 782 are short and thick as seen in the example FIG. 7A). The linear displacement of the multilayer stacks of piezoelectric material 750, 755, 770, 775 in the axial direction and the linear displacement of the multilayer stacks of piezoelectric material 760, 765, 780, 782 in the radial direction move the hanger 525 and shroud 540 is the axial direction (e.g., leftward) and the radial direction (e.g., upward), which increases the distance between the shroud 740 and the blade 745 in the radial direction and increases the open clearance 785.

In the example of FIG. 7B, example ACC system 790 has a tight/closed clearance represented by the tight clearance 795 between the shroud 740 and the blade 745. The multilayer stacks of piezoelectric material 750, 755, 760, 765, 770, 775, 780, 782 control the tight clearance 795. In the ACC system 790, the actuator 715 and the actuator 720 receive a third electrical signal from an example controller. The actuator 715 provides the third electrical signal to the multilayer stack of piezoelectric material 750 and the multilayer stack of piezoelectric material 760, and actuator 720 provides the third electrical signal to the multilayer stack of piezoelectric material 770 and the multilayer stack of piezoelectric material 780. The third electrical signal causes a linear displacement of the multilayer stack of piezoelectric material 750, the multilayer stack of piezoelectric material 760, the multilayer stack of piezoelectric material 770, and the multilayer stack of piezoelectric material 780 (e.g., each stack in the multilayer stack of piezoelectric material 750, the multilayer stack of piezoelectric material 760, the multilayer stack of piezoelectric material 770, and the multilayer stack of piezoelectric material 780 are short and thick as seen in the example FIG. 7B).

In the ACC system 790, the actuator 715 and the actuator 720 receive a fourth electrical signal from an example controller. In some examples, the actuator 715 and the actuator 720 receive the third electrical signal and the fourth electrical signal at the same time or at substantially the same time given transmission delay (e.g., in parallel). The actuator 715 provides the fourth electrical signal to the multilayer stack of piezoelectric material 755 and the multilayer stack of piezoelectric material 765, and actuator 720 provides the fourth electrical signal to the multilayer stack of piezoelectric material 775 and the multilayer stack of piezoelectric material 782. The fourth electrical signal causes a linear displacement of the multilayer stack of piezoelectric material 755, the multilayer stack of piezoelectric material 765, the multilayer stack of piezoelectric material 775, and the multilayer stack of piezoelectric material 782 (e.g., each stack in the multilayer stack of piezoelectric material 755, the multilayer stack of piezoelectric material 765, the multilayer stack of piezoelectric material 775, and the multilayer stack of piezoelectric material 782 are long and thin as seen in the example FIG. 7B). The linear displacement of the multilayer stacks of piezoelectric material 750, 755, 770, 775 in the axial direction and the linear displacement of the multilayer stacks of piezoelectric material 760, 765, 780, 782 in the radial direction move the hanger 525 and shroud 540 is the axial direction (e.g., rightward) and the radial direction (e.g., downward), which decreases the distance between the shroud 740 and the blade 745 in the radial direction and decreases the tight clearance 795.

In the illustrated examples of FIGS. 7A and 7B, the actuator 715 and the actuator 720 adjust the clearance between the shroud 740 and the blade 745 in two directions (e.g., shrinkage and expansion). The actuator 715 and the actuator 720 can be installed for an individual shroud (e.g., the shroud 740), partial groups of shrouds (e.g., for groups of three shrouds, for groups of five shrouds, etc.), or for an entire group of shrouds in a turbine (e.g., the shrouds surrounding the 360 degree inner surface of the case 705).

Figure 8B:
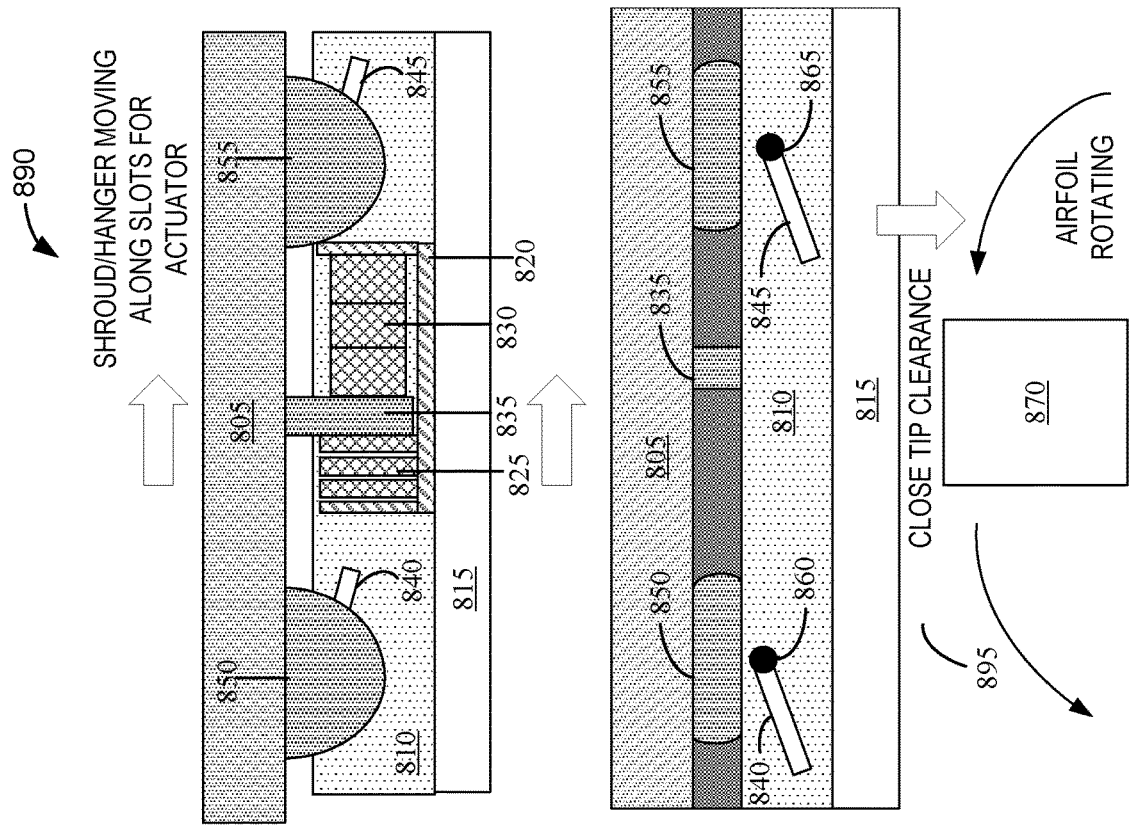
FIGS. 8A and 8B are schematic aft looking forward (ALF) and forward looking aft (FLA) views of a fifth example ACC system with an example circumferential piezoelectric actuator in accordance with teachings disclosed herein.
Figure 8A:
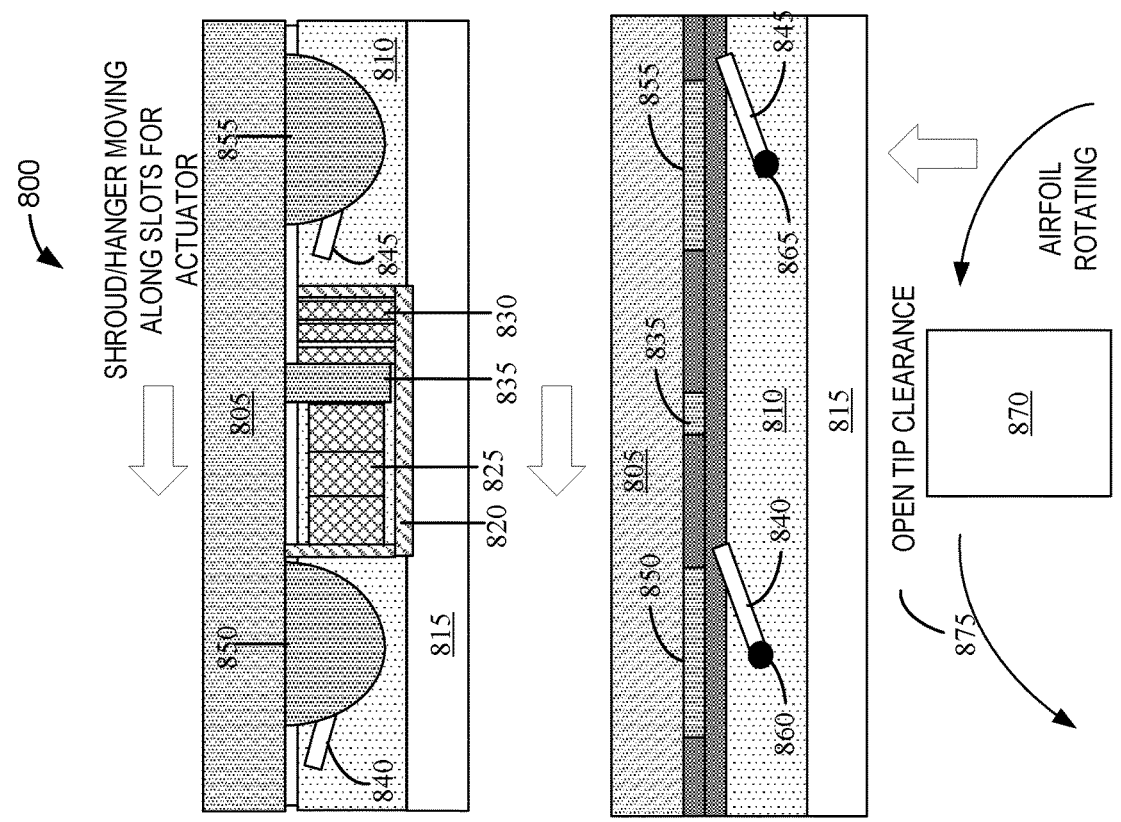

FIGS. 8A and 8B are schematic aft looking forward (ALF) and forward looking aft (FLA) views of a fifth example ACC system 800, 890 with an example circumferential piezoelectric actuator in accordance with teachings disclosed herein. An example ACC system 800 of FIG. 8A includes a case 805, a hanger 810, a shroud 815, an actuator 820, and a blade 870. The actuator 820 includes a multilayer stack of piezoelectric material 825 and a multilayer stack of piezoelectric material 830. The case 805 includes a rod 835, a case extension 850, a case extension 855, and example holding bars 860, 865. The shroud hanger 810 includes example slots 840, 845. The ACC system 800 includes an open clearance 875 between the shroud 815 and the blade 870. The example ACC system 890 of FIG. 8B includes the case 805, the hanger 810, the shroud 815, the actuator 820, and the blade 870 of FIG. 8A. The actuator 820 of FIG. 8B includes the multilayer stack of piezoelectric material 825 and the multilayer stack of piezoelectric material 830, The case 805 of FIG. 8B includes the rod 835, the case extension 850, the case extension 855, and the holding bars 860, 865, and the hanger 810 includes the slots 840, 845 of FIG. 8A. The ACC system 890 includes a tight/closed clearance 895 between the shroud 815 and the blade 870. The case 805 includes the case extension 850, the case extension 855, and the holding bars 860, 865 to connect to the hanger 810. The hanger 810 is connected to the shroud 815.

In the illustrated examples of FIGS. 8A and 8B, the actuator 820 is located under the case 805 inside of the hanger 810. In some examples, the case 805 is a case surrounding a high pressure turbine (e.g., the HP turbine 118 of FIG. 1), a low pressure turbine (e.g., the LP turbine 120 of FIG. 1) or a compressor (e.g., the HP compressor 114 and LP compressor 112 of FIG. 1). In some examples, locating the actuator 820 under the case 805 reduces sealing concerns prevalent in the example ACC systems 400 and 465 of FIGS. 4A and 4B respectively, as described above. However, the location of the actuator 820 prevents easy access for maintenance and part replacement.

In the illustrated examples of FIGS. 8A and 8B, the case 805 extends into the actuator 820 via the rod 835. The multilayer stacks of piezoelectric material 825, 830 are connected to the rod 835. The multilayer stack of piezoelectric material 825 is connected to a side (left) surface of the rod 835 in the actuator 820, and the multilayer stack of piezoelectric material 830 is connected to an opposite side (right) surface of the rod 835 in the actuator 820. In some examples, the piezoelectric material of multilayer stacks of piezoelectric material 825, 830 can include quartz, topaz, etc. However, other piezoelectric materials or other materials that generate linear displacement, such as shape memory alloy (SMA) materials, etc., can be additionally and/or alternatively included. In the illustrated examples of FIGS. 8A and 8B, the case 805 also overlaps the hanger 810 via the case extension 850 and the case extension 855. The case extension 850 connects to the slot 840 in the hanger 810 via the holding bar 860, and the case extension 855 connects to the slot 845 in the hanger 810 via the holding bar 865.

In the illustrated examples of FIGS. 8A and 8B, the multilayer stacks of piezoelectric material 825, 830 generate a linear displacement of the hanger 810 from electrical signals generated by an example controller. An example controller that generates the electrical signals is illustrated in FIG. 12, which is described in further detail below. In some examples, the linear displacement of the multilayer stacks of piezoelectric material 825, 830 moves the hanger 810 circumferentially along the slanted slots 840 and 845 to mechanically convert the circumferential displacement of the hanger into clearance control in the radial direction. The example actuator 820 of FIGS. 8A and 8B provides circumferential gap adjustment between the hanger 810/shroud 815 and the blade 870 while also providing radial clearance control using the piezoelectric material displacement from the multilayer stacks of piezoelectric material 825, 830 combined with the slanted slots 840, 845 and holding bars 860, 865 of the hanger 810 and the case 805, respectively. In the examples of FIGS. 8A and 8B, the hanger 810 and the shroud 815 are connected and move together. As such, the hanger 810 moves the shroud 815 in a circumferential direction using the linear displacement generated by the multilayer stacks of piezoelectric material 825, 830. In some examples, the ACC system 800 includes the shroud 815 without the hanger 810. In such examples, the shroud 815 moves using the linear displacement generated by the multilayer stacks of piezoelectric material 825, 830. The multilayer stacks of piezoelectric material 825, 830 are positioned on side surfaces (left and right) of the rod 835 to accurately modulate the linear displacement in the circumferential direction. In some examples, the range of the linear displacement is increased by adding more layers of piezoelectric material to the multilayer stacks of piezoelectric material 825, 830. For example, the more layers added in the multilayer stacks of piezoelectric material 825, 830, the more circumferential movement range and muscle capability for the ACC system.

The example ACC system 800 has an open clearance represented by the open clearance 875 between the shroud 815 and the blade 870. The multilayer stacks of piezoelectric material 825, 830 control the open clearance 875. In the ACC system 800, the actuator 820 receives a first electrical signal from an example controller. The actuator 820 provides the first electrical signal to the multilayer stack of piezoelectric material 825. The first electrical signal causes a linear displacement of the multilayer stack of piezoelectric material 825 (e.g., each stack in the multilayer stack of piezoelectric material 825 is short and thick as seen in the example FIG. 8A). In the ACC system 800, the actuator 820 receives a second electrical signal from an example controller. In some examples, the actuator 820 receives the first electrical signal and the second electrical signal at the same time or at substantially the same time given transmission delay (e.g., in parallel). The actuator 820 provides the second electrical signal to the multilayer stack of piezoelectric material 830. The second electrical signal causes a linear displacement of the multilayer stack of piezoelectric material 830 (e.g., each stack in the multilayer stack of piezoelectric material 830 is long and thin as seen in the example FIG. 8A).

In the example ACC system 800, the linear displacement of the multilayer stacks of piezoelectric material 825, 830 in a first axial direction (e.g., to the left) moves the hanger 810 along the slanted slots 840, 845 with respect to the stationary case 805. The case extension 850 includes the holding bar 860 to connect to the slot 840, and the case extension 855 includes the holding bar 865 to connect to the slot 845. When the hanger 810 is displaced by the linear displacement of the multilayer stacks of piezoelectric material 825, 830, the hanger 810 moves with the slots 840, 845 along the holding bars 860, 865, respectively, in the first axial direction to displace the hanger 810 and the shroud 815 circumferentially in relation to the case 805. The linear displacement of the multilayer stacks of piezoelectric material 825, 830 in the first axial direction moves the hanger 810 and shroud 815 in the circumferential direction away from the blade 870, which increases the distance between the shroud 815 and the blade 870 in the radial direction and increases the open clearance 875.

In the example of FIG. 8B, the ACC system 890 has a tight/closed clearance represented by the tight clearance 895 between the shroud 815 and the blade 870. The multilayer stacks of piezoelectric material 825, 830 control the tight clearance 895. In the ACC system 890, the actuator 820 receives a third electrical signal from an example controller. The actuator 820 provides the third electrical signal to the multilayer stack of piezoelectric material 825. The third electrical signal causes a linear displacement of the multilayer stack of piezoelectric material 825 (e.g., each stack in the multilayer stack of piezoelectric material 825 is long and thin as seen in the example FIG. 8B). In the ACC system 890, the actuator 820 receives a fourth electrical signal from an example controller. In some examples, the actuator 820 receives the third electrical signal and the fourth electrical signal at the same time or at substantially the same time given transmission delay (e.g., in parallel). The actuator 820 provides the fourth electrical signal to the multilayer stack of piezoelectric material 830. The fourth electrical signal causes a linear displacement of the multilayer stack of piezoelectric material 830 (e.g., each stack in the multilayer stack of piezoelectric material 830 is short and thick as seen in the example FIG. 8B).

In the example ACC system 890, the linear displacement of the multilayer stacks of piezoelectric material 825, 830 in a second axial direction (e.g., to the right) moves the hanger 810 along the slanted slots 840, 845 with respect to the stationary case 805. The case extension 850 includes the holding bar 860 to connect to the slot 840, and the case extension 855 includes the holding bar 865 to connect to the slot 845. When the hanger 810 is displaced by the linear displacement of the multilayer stacks of piezoelectric material 825, 830, the hanger 810 moves with the slots 840, 845 along the holding bars 860, 865, respectively, in the second axial direction to displace the hanger 810 and the shroud 815 circumferentially in relation to the case 805. The linear displacement of the multilayer stacks of piezoelectric material 825, 830 in the second axial direction moves the hanger 810 and shroud 815 in the circumferential direction toward the blade 870, which decreases the distance between the shroud 815 and the blade 870 in the radial direction and decreases the tight clearance 895.

In the illustrated examples of FIGS. 8A and 8B, the actuator 820 adjusts the clearance between the shroud 815 and the blade 870 in two directions (e.g., shrinkage and expansion). The actuator 820 can be installed for an individual shroud (e.g., the shroud 815), partial groups of shrouds (e.g., for groups of three shrouds, for groups of five shrouds, etc.), or for an entire group of shrouds in a turbine (e.g., the shrouds surrounding the 360 degree inner surface of the case 805).

Figure 9A:
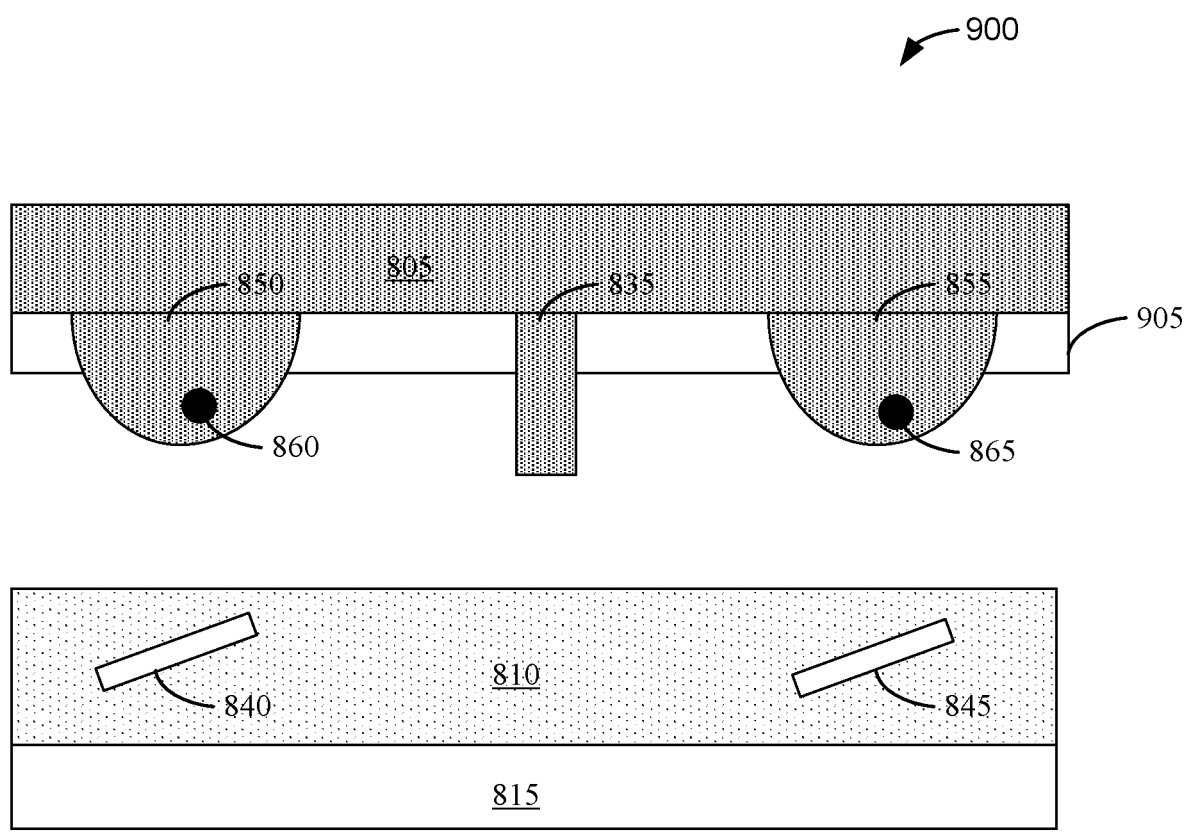
FIGS. 9A and 9B are schematic FLA views of the fifth example ACC system in a disassembled and an assembled state.
Figure 9B:
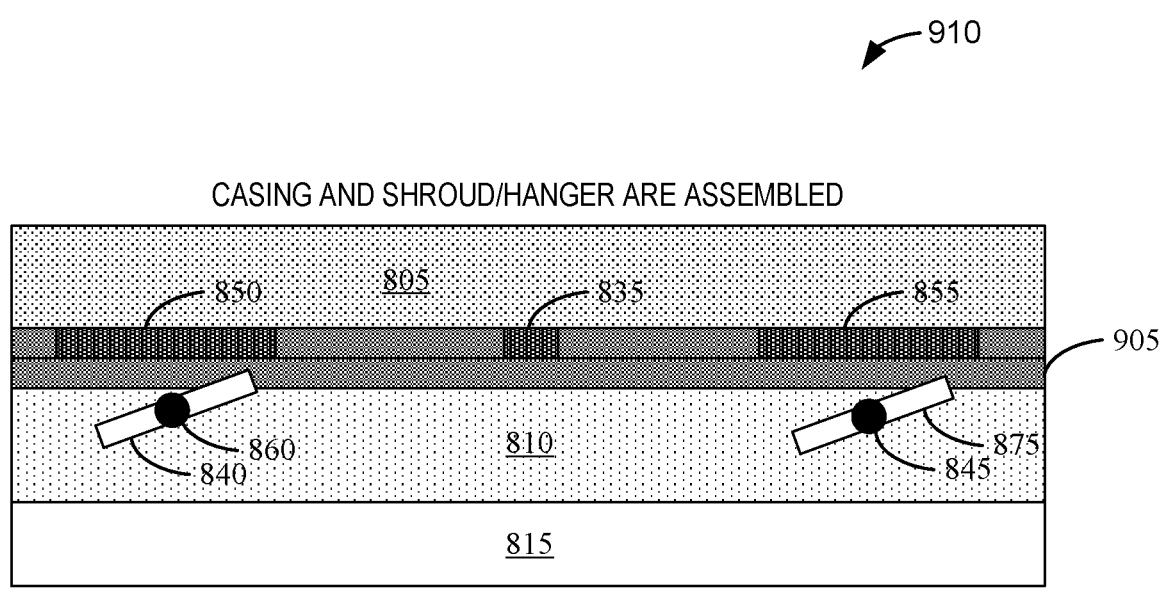

FIG. 9A illustrates an example FLA view 900 of the ACC system 800, 890 of FIGS. 8A, 8B in a disassembled state. FIG. 9B illustrates an example FLA view 910 of the ACC system 800, 890 of FIGS. 8A, 8B in an assembled state. In the FLA view 900 and the FLA view 910, the example ACC system 800, 890 includes a thermal shield 905. In the illustrated examples, the thermal shield 905 is positioned between the case 805 and the hanger 810. In some examples, the thermal shield 905 seals the connection between the case 805 and the hanger 810 via the case extensions 850, 855, the holding bars 860, 865, and the slots 840, 845.

Figure 10A:
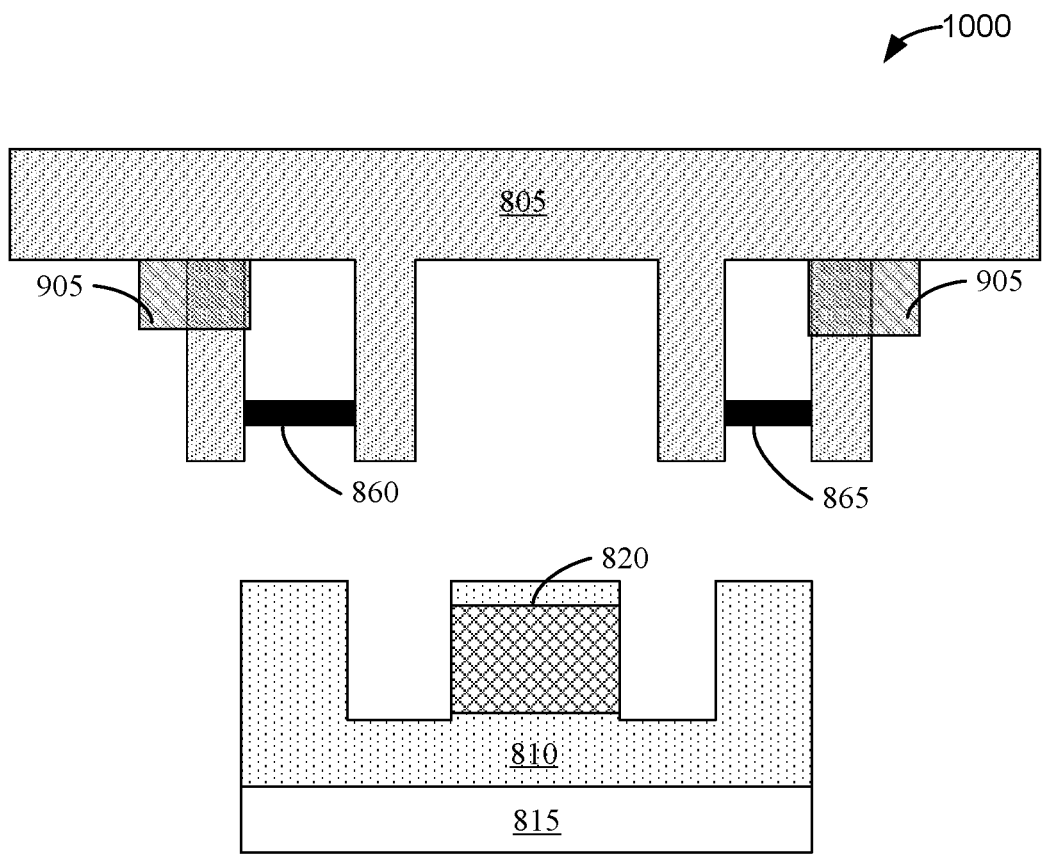
FIGS. 10A and 10B are schematic side views (Axi-sym) views of the fifth example ACC system in a disassembled and an assembled state.
Figure 10B:
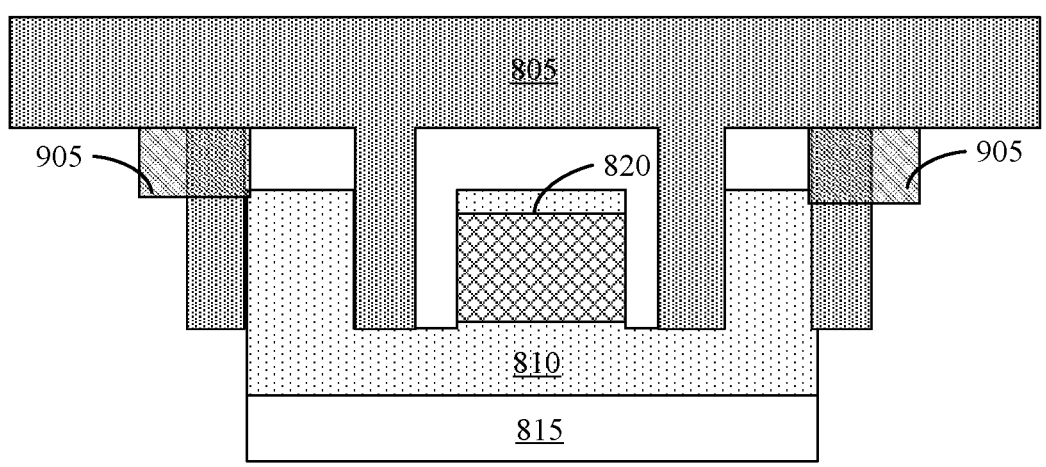

FIG. 10A illustrates an example side view (Axi-sym) view 1000 of the ACC system 800, 890 of FIGS. 8A, 8B in a disassembled state. FIG. 10B illustrates an example Axi-sym view 1005 of the ACC system 800, 890 of FIGS. 8A, 8B in an assembled state. The illustrated examples of FIGS. 10A and 10B illustrate the case 805, the hanger 810, the shroud 815, the actuator 820, the holding bars 860, 865, and the thermal shield 905 in the Axi-sym views in the disassembled and assembled states.

Figure 11A:
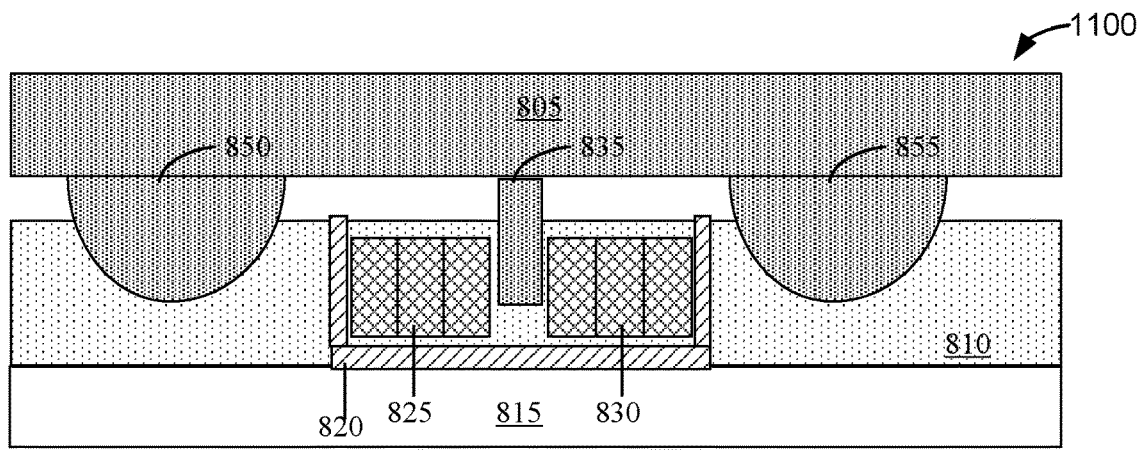
FIGS. 11A-11C are schematic ALF views of the fifth example ACC system in cold conditions and hot conditions.

FIG. 11A is a schematic ALF view 1100 of the fifth example ACC system 800, 890 of FIGS. 8A-10B in the cold condition. The ALF view 1100 illustrates the assembled ACC system 800, 890 in a cold condition (e.g., when the actuator 820 is not operating to control clearance and the gas turbine engine is not operating). In the illustrated example of FIG. 11A, the multilayer stack of piezoelectric material 825 and the multilayer stack of piezoelectric material 830 located in the actuator 820 are not linearly displaced by any electrical signals.

Figure 11B:
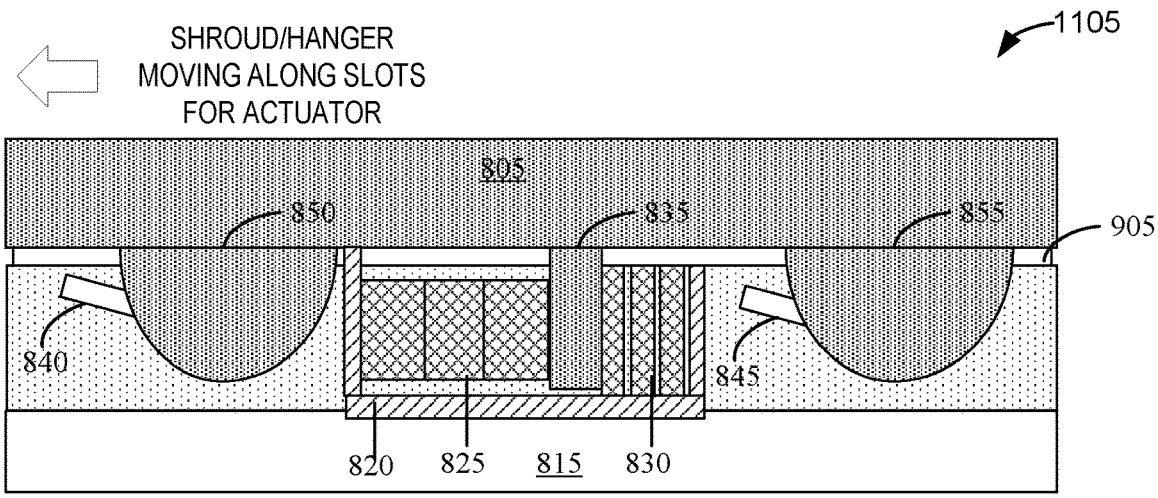

FIG. 11B illustrates an ALF view 1105 of the fifth example ACC system 800, 890 of FIGS. 8A-10B in a hot condition with open clearance similar to the state of the example ACC system 800 of FIG. 8A. The ALF view 1105 illustrates the assembled ACC system 800 in a hot condition (e.g., when the actuator 820 is operating to control clearance and the gas turbine engine is operating). In the illustrated example of FIG. 11B, the multilayer stack of piezoelectric material 825 and the multilayer stack of piezoelectric material 830 are linearly displaced in a first axial direction (e.g., to the left) by a first electrical signal and a second electrical signal, respectively. In the illustrated example of FIG. 11B, the linear displacement of the multilayer stacks of piezoelectric material 825, 830 in the first axial direction moves the hanger 810 along the slanted slots 840, 845 with respect to the stationary case 805. When the hanger 810 is displaced by the linear displacement of the multilayer stacks of piezoelectric material 825, 830, the hanger 810 moves with the slots 840, 845 (illustrated in FIGS. 9A and 9B) along the holding bars 860, 865 (illustrated in FIGS. 9A-10B), respectively, in the first axial direction to displace the hanger 810 and the shroud 815 circumferentially in relation to the case 805. The linear displacement of the multilayer stacks of piezoelectric material 825, 830 in the first axial direction moves the hanger 810 and shroud 815 in the circumferential direction away from a blade (e.g., the blade 870).

Figure 11C:
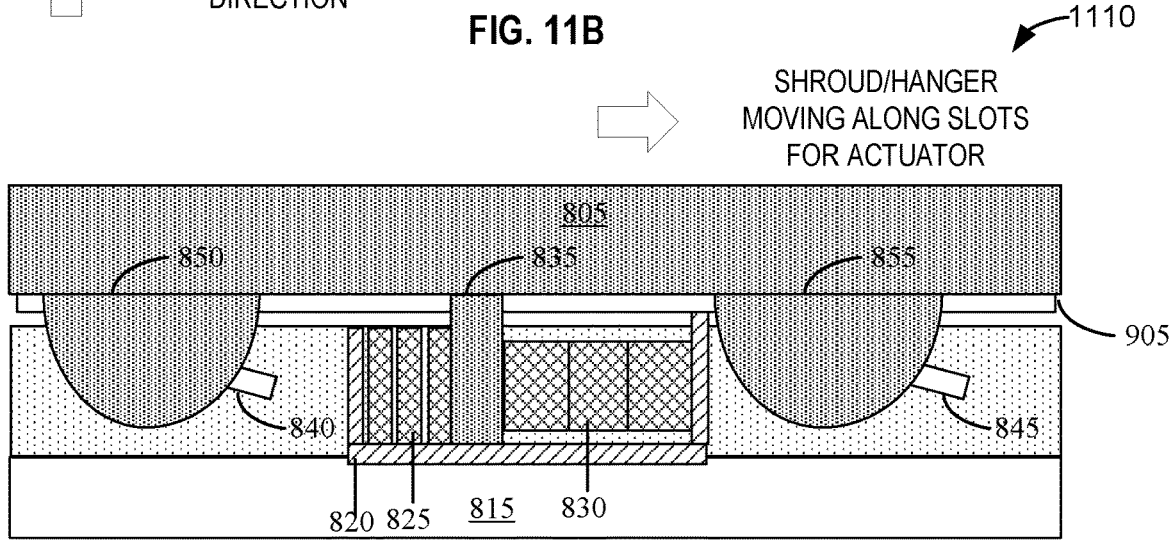

FIG. 11C illustrates an ALF view 1110 of the fifth example ACC system 800, 890 of FIGS. 8A-10B in a hot condition with tight clearance similar to the state of the example ACC system 890 of FIG. 8B. The ALF view 1110 illustrates the assembled ACC system 890 in a hot condition (e.g., when the actuator 820 is operating to control clearance and the gas turbine engine is operating). In the illustrated example of FIG. 11C, the multilayer stack of piezoelectric material 825 and the multilayer stack of piezoelectric material 830 are linearly displaced in a second axial direction (e.g., to the right) by a third electrical signal and a fourth electrical signal, respectively. In the illustrated example of FIG. 11C, the linear displacement of the multilayer stacks of piezoelectric material 825, 830 in the second axial direction moves the hanger 810 along the slanted slots 840, 845 with respect to the stationary case 805. When the hanger 810 is displaced by the linear displacement of the multilayer stacks of piezoelectric material 825, 830, the hanger 810 moves with the slots 840, 845 along the holding bars 860, 865, respectively, in the second axial direction to displace the hanger 810 and the shroud 815 circumferentially in relation to the case 805. The linear displacement of the multilayer stacks of piezoelectric material 825, 830 in the second axial direction moves the hanger 810 and shroud 815 in the circumferential direction toward a blade (e.g., the blade 870).

FIG. 12 is a block diagram of an example controller 1200 of the example ACC systems of FIGS. 4A-11C. The controller 1200 of FIG. 12 may be instantiated (e.g., creating an instance of, bring into being for any length of time, materialize, implement, etc.) by processor circuitry such as a central processing unit executing instructions. Additionally or alternatively, the controller 1200 of FIG. 12 may be instantiated (e.g., creating an instance of, bring into being for any length of time, materialize, implement, etc.) by an Application Specific Integrated Circuit (ASIC) or a Field Programmable Gate Array (FPGA) structured to perform operations corresponding to the instructions. It should be understood that some or all of the circuitry of FIG. 12 may, thus, be instantiated at the same or different times. Some or all of the circuitry may be instantiated, for example, in one or more threads executing concurrently on hardware and/or in series on hardware. Moreover, in some examples, some or all of the circuitry of FIG. 12 may be implemented by one or more virtual machines and/or containers executing on the microprocessor.

In FIG. 12, the controller 1200 can be a full-authority digital engine control (FADEC) unit, an engine control unit (ECU), an electronic engine control (EEC) unit, etc., or any other type of data acquisition and/or control computing device, processor platform (e.g., processor-based computing platform), etc. The controller 1200 communicates with the example engine sensor(s) 1205. The controller 1200 includes an example sensor(s) processor 1210 and an example actuator controller 1215.

In the illustrated example of FIG. 12, the controller 1200 receives values for a plurality of input variables relating to flight condition (e.g., air density, throttle lever position, engine temperatures, engine pressures, direct clearance measurements, indirect clearance measurements, etc.). The controller 1200 receives the flight condition data from the engine sensor(s) 1205. The engine sensor(s) 1205 can be mounted on the gas turbine engine 100 and/or positioned elsewhere in the aircraft (e.g., on wing, in cockpit, in main cabin, in engine compartment, in cargo, etc.). The communication between the controller 1200 and the engine sensor(s) 1205 can be one-way communication and/or two-way communication, for example. The controller 1200 computes engine operating parameters such as fuel flow, stator vane position, air bleed valve position, etc., using the flight condition data.

In the illustrated example of FIG. 12, the sensor(s) processor 1210 obtains the sensor data from the example engine sensor(s) 1205. The sensor data includes the flight condition data obtained from the gas turbine engine 100. The sensor(s) processor 1210 monitors engine conditions based on the sensor data from the engine sensor(s) 1205. For example, the sensor(s) processor 1210 can calculate and monitor the fuel flow, stator vane position, air bleed valve position, etc. In some examples, the sensor(s) processor 1210 determines if the turbine case is expanding or shrinking based on the engine conditions determined from the obtained flight condition data. In the illustrated example of FIG. 12, the actuator controller 1215 generates electrical signals and supplies the electrical signals to the actuator(s) of an ACC system. In some examples, the actuator controller 1215 generates an electrical control signal to the actuator(s) of an ACC system 400-890 based on the results from sensor(s) processor 1210.

For the example ACC systems 400 and 465 of FIGS. 4A and 4B respectively, the actuator controller 1215 generates and sends a first electrical current via a first electrical signal to the multilayer stack of piezoelectric material 455 located in the actuator 405. In some examples, the actuator controller 1215 sends the first electrical current to the actuator 405 when the sensor(s) processor 1210 determines that the turbine case is expanding. In some examples, the first electrical current causes a linear displacement in the multilayer stack of piezoelectric material 455 that moves the shroud 440 in an axial direction (e.g., rightward) toward the edge of the blade 450, which decreases the tight clearance 470 in the radial direction (similar to the example ACC system 465 of FIG. 4B). However, the actuator controller 1215 can send the first electrical current to the actuator 405 for additional and/or alternative flight conditions (e.g., flight conditions other than those indicative of turbine case expansion) determined by the sensor(s) processor 1210. In other examples, the actuator controller 1215 generates and sends a second electrical current via a second electrical signal to the multilayer stack of piezoelectric material 455 located in the actuator 405. In some examples, the actuator controller 1215 sends the second electrical current to the actuator 405 when the sensor(s) processor 1210 determines that the turbine case is shrinking. In some examples, the second electrical current causes a linear displacement in the multilayer stack of piezoelectric material 455 that moves the shroud 440 in the axial direction (e.g., leftward) away from the edge of the blade 450, which increases the open clearance 460 in the radial direction (similar to the example ACC system 400 of FIG. 4A). However, the actuator controller 1215 can send the second electrical current to the actuator 405 for additional and/or alternative flight conditions (e.g., flight conditions other than those indicative of turbine case shrinkage) determined by the sensor(s) processor 1210.

For the example ACC systems 500 and 575 of FIGS. 5A and 5B respectively, the actuator controller 1215 generates and sends a first electrical current via a first electrical signal to the multilayer stack of piezoelectric material 550 and the multilayer stack of piezoelectric material 560 located in the actuator 515 and the actuator 520 respectively. The actuator controller 1215 also generates and sends a second electrical current via a second electrical signal to the multilayer stack of piezoelectric material 555 and the multilayer stack of piezoelectric material 565 located in the actuator 515 and the actuator 520, respectively. In some examples, the actuator controller sends the first electrical current and the second electrical current to the actuator 515 and the actuator 520 when the sensor(s) processor 1210 determines that the turbine case is expanding. In some examples, the first electrical current causes a first linear displacement in the multilayer stack of piezoelectric material 550 and the multilayer stack of piezoelectric material 560 in a first axial direction (e.g., rightward). In some examples, the second electrical current causes a second linear displacement in the multilayer stack of piezoelectric material 555 and the multilayer stack of piezoelectric material 565 in the first axial direction (e.g., rightward). In some examples, the second linear displacement is opposite of the first linear displacement. For example, if the first linear displacement is a decrease in length and an increase in thickness of the multilayer stack of piezoelectric material 550 and the multilayer stack of piezoelectric material 560, then the second linear displacement is an increase in length and a decrease in thickness of the multilayer stack of piezoelectric material 555 and the multilayer stack of piezoelectric material 565. The first linear displacement and the second linear displacement move the shroud 540 in the first axial direction (e.g., rightward), which decreases the distance between the shroud 540 and the blade 545 in the radial direction and decreases the tight clearance 580 (similar to the example ACC system 575 of FIG. 5B). However, the actuator controller 1215 can send the first electrical current and the second electrical current to the actuator 515 and the actuator 520 for additional and/or alternative flight conditions (e.g., flight conditions other than those indicative of case shrinkage) determined by the sensor(s) processor 1210.

In other examples, the actuator controller 1215 generates and sends a third electrical current via a third electrical signal to the multilayer stack of piezoelectric material 550 and the multilayer stack of piezoelectric material 560. The actuator controller 1215 also generates and sends a fourth electrical current via a fourth electrical signal to the multilayer stack of piezoelectric material 555 and the multilayer stack of piezoelectric material 565. In some examples, the actuator controller sends the third electrical current and the fourth electrical current to the actuator 515 and the actuator 520 when the sensor(s) processor 1210 determines that the case is shrinking. In some examples, the third electrical current causes a third linear displacement in the multilayer stack of piezoelectric material 550 and the multilayer stack of piezoelectric material 560 in a second axial direction (e.g., leftward). In some examples, the fourth electrical current causes a fourth linear displacement in the multilayer stack of piezoelectric material 555 and the multilayer stack of piezoelectric material 565 in the second axial direction (e.g., leftward). In some examples, the fourth linear displacement is opposite of the third linear displacement. For example, if the third linear displacement is an increase in length and a decrease in thickness of the multilayer stack of piezoelectric material 550 and the multilayer stack of piezoelectric material 560, then the fourth linear displacement is a decrease in length and an increase in thickness of the multilayer stack of piezoelectric material 555 and the multilayer stack of piezoelectric material 565. The third linear displacement and the fourth linear displacement move the shroud 540 in the axial direction (e.g., leftward), which increases the distance between the shroud 540 and the blade 545 in the radial direction and increases the open clearance 570 (similar to the example ACC system 500 of FIG. 5A). However, the actuator controller 1215 can send the third electrical current and the fourth electrical current to the actuator 515 and the actuator 520 for additional and/or alternative flight conditions (e.g., flight conditions other than those indicative of case shrinkage) determined by the sensor(s) processor 1210.

For the example ACC systems 600 and 675 of FIGS. 6A and 6B respectively, the actuator controller 1215 generates and sends a first electrical current via a first electrical signal to the multilayer stack of piezoelectric material 655 and the multilayer stack of piezoelectric material 665 located in the actuator 615 and the actuator 620 respectively. In some examples, the actuator controller 1215 sends the first electrical current to the actuator 615 and the actuator 620 when the sensor(s) processor 1210 determines that the case is expanding. In some examples, the first electrical current causes a linear displacement in the multilayer stack of piezoelectric material 655 and the multilayer stack of piezoelectric material 665 that moves the shroud 640 in the axial direction (e.g., rightward), which decreases the distance between the shroud 640 and the blade 645 in the radial direction and decreases the tight clearance 680 (similar to the example ACC system 675 of FIG. 6B). However, the actuator controller 1215 can send the first electrical current to the actuator 615 and the actuator 620 for additional and/or alternative flight conditions (e.g., flight conditions other than those indicative of case expansion) determined by the sensor(s) processor 1210. In some examples, the actuator controller 1215 generates and sends a second electrical current via a second electrical signal to the multilayer stack of piezoelectric material 655 and the multilayer stack of piezoelectric material 665 located in the actuator 615 and the actuator 620, respectively. In some examples, the actuator controller 1215 sends the second electrical current to the actuator 615 and the actuator 620 when the sensor(s) processor 1210 determines that the case is shrinking. In some examples, the second electrical current causes a linear displacement in the multilayer stack of piezoelectric material 655 and the multilayer stack of piezoelectric material 665 that moves the shroud 640 in the axial direction (e.g., leftward), which increases the distance between the shroud 640 and the blade 645 in the radial direction and increases the open clearance 670 (similar to the example ACC system 600 of FIG. 6A). However, the actuator controller 1215 can send the second electrical current to the actuator 615 and the actuator 620 for additional and/or alternative flight conditions (e.g., flight conditions other than those indicative of turbine case shrinkage) determined by the sensor(s) processor 1210.

For the example ACC systems 700 and 790 of FIGS. 7A and 7B respectively, the actuator controller 1215 generates and sends a first electrical current via a first electrical signal to the multilayer stack of piezoelectric material 750 and the multilayer stack of piezoelectric material 760 located in the actuator 715 and the multilayer stack of piezoelectric material 770 and the multilayer stack of piezoelectric material 780 located in the actuator 720. The actuator controller 1215 also generates and sends a second electrical current via a second electrical signal to the multilayer stack of piezoelectric material 755 and the multilayer stack of piezoelectric material 765 located in the actuator 715 and the multilayer stack of piezoelectric material 775 and the multilayer stack of piezoelectric material 782 located in the actuator 720. In some examples, the actuator controller 1215 sends the first electrical current and the second electrical current to the actuator 715 and the actuator 720 when the sensor(s) processor 1210 determines that the turbine case is expanding. In some examples, the first electrical current causes a first linear displacement in the multilayer stack of piezoelectric material 750, the multilayer stack of piezoelectric material 760, the multilayer stack of piezoelectric material 770, and the multilayer stack of piezoelectric material 780 in a first axial direction (e.g., rightward) and a first radial direction (e.g., downward). In some examples, the second electrical current causes a second linear displacement in the multilayer stack of piezoelectric material 755, the multilayer stack of piezoelectric material 765, the multilayer stack of piezoelectric material 775, and the multilayer stack of piezoelectric material 782 in the first axial direction (e.g., rightward) and the first radial direction (e.g., downward). In some examples, the second linear displacement is opposite of the first linear displacement. For example, if the first linear displacement is a decrease in length and an increase in thickness of the multilayer stack of piezoelectric material 750, the multilayer stack of piezoelectric material 760, the multilayer stack of piezoelectric material 770, and the multilayer stack of piezoelectric material 780, then the second linear displacement is an increase in length and a decrease in thickness of the multilayer stack of piezoelectric material 755, the multilayer stack of piezoelectric material 765, the multilayer stack of piezoelectric material 775, and the multilayer stack of piezoelectric material 782. The first linear displacement and the second linear displacement move the shroud 740 in the first axial direction (e.g., rightward) and the first radial direction (e.g., downward), which decreases the distance between the shroud 740 and the blade 745 in the radial direction and decreases the tight clearance 795 (similar to the example ACC system 790 of FIG. 7B). However, the actuator controller 1215 can send the first electrical current and the second electrical current to the actuator 715 and the actuator 720 for additional and/or alternative flight conditions (e.g., flight conditions other than those indicative of case shrinkage) determined by the sensor(s) processor 1210.

In other examples, the actuator controller 1215 generates and sends a third electrical current via a third electrical signal to the multilayer stack of piezoelectric material 750 and the multilayer stack of piezoelectric material 760 located in the actuator 715 and the multilayer stack of piezoelectric material 770 and the multilayer stack of piezoelectric material 780 located in the actuator 720. The actuator controller 1215 also generates and sends a fourth electrical current via a fourth electrical signal to the multilayer stack of piezoelectric material 755 and the multilayer stack of piezoelectric material 765 located in the actuator 715 and the multilayer stack of piezoelectric material 775 and the multilayer stack of piezoelectric material 782 located in the actuator 720. In some examples, the actuator controller 1215 sends the third electrical current and the fourth electrical current to the actuator 715 and the actuator 720 when the sensor(s) processor 1210 determines that the case is shrinking. In some examples, the third electrical current causes a third linear displacement in the multilayer stack of piezoelectric material 750, the multilayer stack of piezoelectric material 760, the multilayer stack of piezoelectric material 770, and the multilayer stack of piezoelectric material 780 in a second axial direction (e.g., leftward) and a second radial direction (e.g., upward). In some examples, the fourth electrical current causes a fourth linear displacement in the multilayer stack of piezoelectric material 755, the multilayer stack of piezoelectric material 765, the multilayer stack of piezoelectric material 775, and the multilayer stack of piezoelectric material 782 in the second axial direction (e.g., leftward) and the second radial direction (e.g., upward). In some examples, the fourth linear displacement is opposite of the third linear displacement. For example, if the third linear displacement is an increase in length and a decrease in thickness of the multilayer stack of piezoelectric material 750, the multilayer stack of piezoelectric material 760, the multilayer stack of piezoelectric material 770, and the multilayer stack of piezoelectric material 780, then the fourth linear displacement is a decrease in length and an increase in thickness of the multilayer stack of piezoelectric material 755, the multilayer stack of piezoelectric material 765, the multilayer stack of piezoelectric material 775, and the multilayer stack of piezoelectric material 782. The third linear displacement and the fourth linear displacement move the shroud 740 in the second axial direction (e.g., leftward) and the second radial direction (e.g., upward), which increases the distance between the shroud 740 and the blade 745 in the radial direction and increases the open clearance 785 (similar to the example ACC system 700 of FIG. 7A). However, the actuator controller 1215 can send the third electrical current and the fourth electrical current to the actuator 715 and the actuator 720 for additional and/or alternative flight conditions (e.g., flight conditions other than those indicative of case shrinkage) determined by the sensor(s) processor 1210.

For the example ACC systems 800 and 890 of FIGS. 8A and 8B respectively and FIGS. 9A-11C, the actuator controller 1215 generates and sends a first electrical current via a first electrical signal to the multilayer stack of piezoelectric material 825 located in the actuator 820. The actuator controller 1215 also generates and sends a second electrical current via a second electrical signal to the multilayer stack of piezoelectric material 830 located in the actuator 820. In some examples, the actuator controller sends the first electrical current and the second electrical current to the actuator 820 when the sensor(s) processor 1210 determines that the turbine case is expanding. In some examples, the first electrical current causes a first linear displacement in the multilayer stack of piezoelectric material 825 in a first axial direction (e.g., rightward). In some examples, the second electrical current causes a second linear displacement in the multilayer stack of piezoelectric material 830 in the first axial direction (e.g., rightward). In some examples, the second linear displacement is opposite of the first linear displacement. For example, if the first linear displacement is an increase in length and a decrease in thickness of the multilayer stack of piezoelectric material 825, then the second linear displacement is a decrease in length and an increase in thickness of the multilayer stack of piezoelectric material 830. The first linear displacement and the second linear displacement moves the hanger 810 with the slots 840, 845 along the holding bars 860, 865, respectively, in the first axial direction (e.g., rightward) to displace the hanger 810 and the shroud 815 circumferentially in relation to the case 805. The first linear displacement and the second linear displacement of the multilayer stacks of piezoelectric material 825, 830 moves the hanger 810 and shroud 815 in the circumferential direction toward the blade 870, which decreases the distance between the shroud 815 and the blade 870 in the radial direction and decreases the tight clearance 895. However, the actuator controller 1215 can send the first electrical current and the second electrical current to the actuator 820 for additional and/or alternative flight conditions (e.g., flight conditions other than those indicative of case shrinkage) determined by the sensor(s) processor 1210.

In other examples, the actuator controller 1215 generates and sends a third electrical current via a third electrical signal to the multilayer stack of piezoelectric material 825. The actuator controller 1215 also generates and sends a fourth electrical current via a fourth electrical signal to the multilayer stack of piezoelectric material 830. In some examples, the actuator controller sends the third electrical current and the fourth electrical current to the actuator 820 when the sensor(s) processor 1210 determines that the case is shrinking. In some examples, the third electrical current causes a third linear displacement in the multilayer stack of piezoelectric material 825 in a second axial direction (e.g., leftward). In some examples, the fourth electrical current causes a fourth linear displacement in the multilayer stack of piezoelectric material 830 in the second axial direction (e.g., leftward). In some examples, the fourth linear displacement is opposite of the third linear displacement. For example, if the third linear displacement is a decrease in length and an increase in thickness of the multilayer stack of piezoelectric material 825, then the fourth linear displacement is an increase in length and a decrease in thickness of the multilayer stack of piezoelectric material 830. The third linear displacement and the fourth linear displacement move the hanger 810 with the slots 840, 845 along the holding bars 860, 865, respectively, in the second axial direction (e.g., leftward) to displace the hanger 810 and the shroud 815 circumferentially in relation to the case 805. The third linear displacement and the fourth linear displacement of the multilayer stacks of piezoelectric material 825, 830 moves the hanger 810 and shroud 815 in the circumferential direction away from the blade 870, which increases the distance between the shroud 815 and the blade 870 in the radial direction and increases the open clearance 875. However, the actuator controller 1215 can send the third electrical current and the fourth electrical current to the actuator 515 and the actuator 520 for additional and/or alternative flight conditions (e.g., flight conditions other than those indicative of case shrinkage) determined by the sensor(s) processor 1210.

While an example manner of implementing the controller 1200 is illustrated in FIG. 12, one or more of the elements, processes, and/or devices illustrated in FIG. 12 may be combined, divided, re-arranged, omitted, eliminated, and/or implemented in any other way. Further, the example sensor(s) processor 1210, the example actuator controller 1215, and/or, more generally, the example controller 1200 of FIG. 12, may be implemented by hardware alone or by hardware in combination with software and/or firmware. Thus, for example, any of the example sensor(s) processor 1210, the example actuator controller 1215, and/or, more generally, the example controller 1200, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). Further still, the example controller 1200 of FIG. 12 may include one or more elements, processes, and/or devices in addition to, or instead of, those illustrated in FIG. 12, and/or may include more than one of any or all of the illustrated elements, processes and devices.

Flowcharts representative of example hardware logic circuitry, machine readable instructions, hardware implemented state machines, and/or any combination thereof for implementing the controller 1200 of FIG. 12 are shown in FIGS. 13, 14, 15, 16, and 17. The machine readable instructions may be one or more executable programs or portion(s) of an executable program for execution by processor circuitry, such as the processor circuitry 1812 shown in the example processor platform 1800 discussed below in connection with FIG. 18. The program may be embodied in software stored on one or more non-transitory computer readable storage media such as a compact disk (CD), a floppy disk, a hard disk drive (HDD), a solid-state drive (SSD), a digital versatile disk (DVD), a Blu-ray disk, a volatile memory (e.g., Random Access Memory (RAM) of any type, etc.), or a non-volatile memory (e.g., electrically erasable programmable read-only memory (EEPROM), FLASH memory, an HDD, an SSD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN)) gateway that may facilitate communication between a server and an endpoint client hardware device). Similarly, the non-transitory computer readable storage media may include one or more mediums located in one or more hardware devices. Further, although the example program is described with reference to the flowcharts illustrated in FIGS. 13, 14, 15, 16, and 17, many other methods of implementing the example controller 1200 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc.).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 13, 14, 15, 16, and 17 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium are expressly defined to include any type of computer readable storage device and/or storage disk and to exclude propagating signals and to exclude transmission media.

Figure 13:
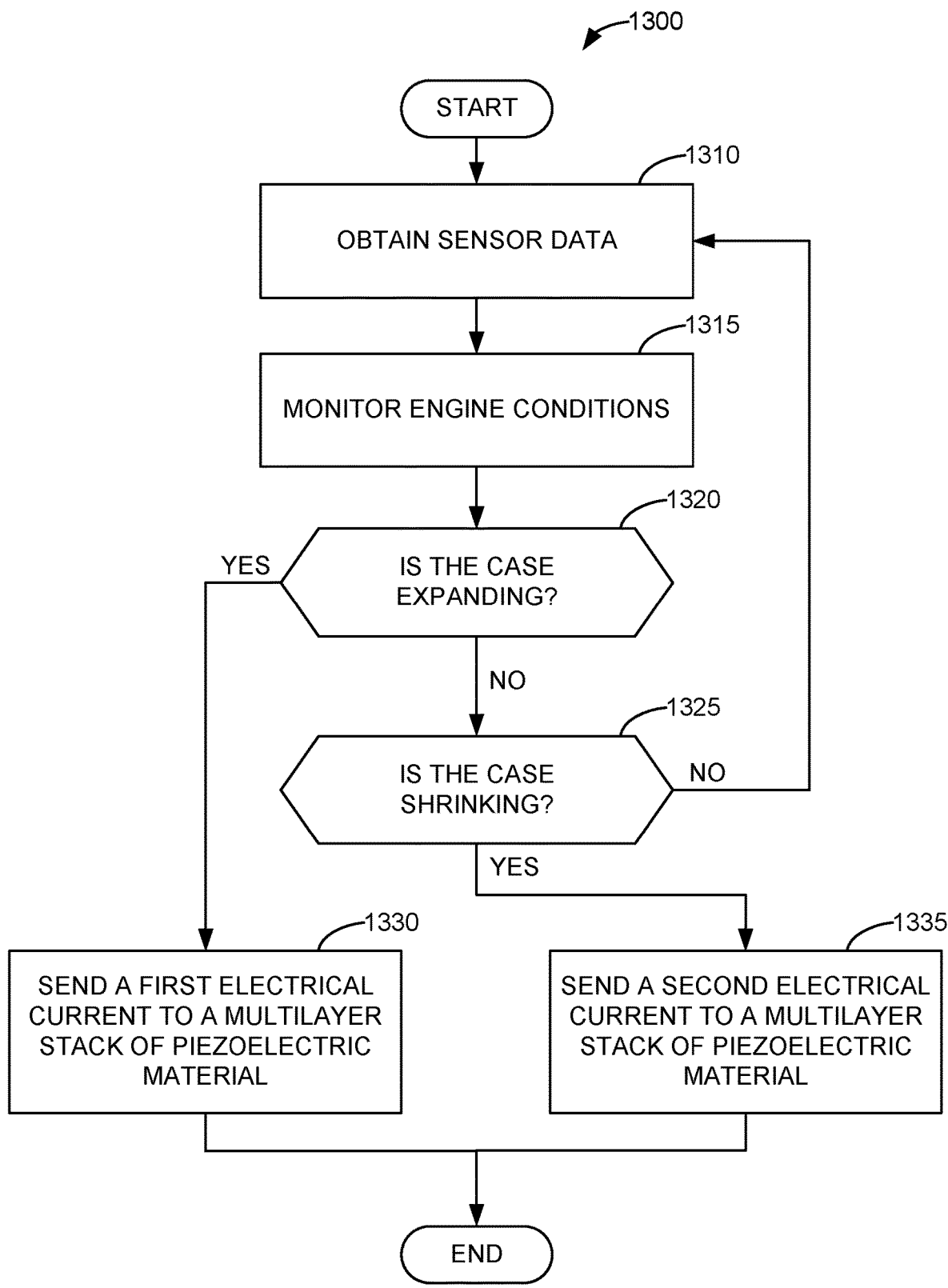
FIG. 13 is a flowchart representative of example machine readable instructions and/or example operations that may be executed by example processor circuitry to implement the example controller of FIG. 12 in conjunction with the first example ACC system of FIGS. 4A and 4B.

FIG. 13 is a flowchart representative of example machine readable instructions and/or example operations 1300 that may be executed and/or instantiated by processor circuitry to implement the example controller 1200 of FIG. 12 in conjunction with the first example ACC system 400, 465 of FIGS. 4A and 4B. In examples disclosed herein, the example machine readable instructions and/or example operations 1300 may be executed in a closed loop system and/or an open loop system. In some examples, the example machine readable instructions and/or example operations 1300 may be executed in an open loop system with direct measurement. The machine readable instructions and/or the operations 1300 of FIG. 13 begin at block 1310, at which the example sensor(s) processor 1210 obtains sensor data from the example engine sensor(s) 1205. In some examples, the sensor data includes the flight condition data obtained by the engine sensor(s) 1205 from an engine (e.g., the gas turbine engine 100 of FIG. 1). In some examples, flight condition data of the sensor data includes values for a plurality of input variables relating to flight conditions (e.g., air density, throttle lever position, engine temperatures, engine pressures, etc.).

At block 1315, the example sensor(s) processor 1210 monitors engine conditions based on the sensor data from the engine sensor(s) 1205. For example, the sensor(s) processor 1210 can calculate and monitor the fuel flow, stator vane position, air bleed valve position, etc., using the flight condition data included in the sensor data. At block 1320, the example sensor(s) processor 1210 determines if the case is expanding. In some examples, the case is a case surrounding a high pressure turbine (e.g., the HP turbine 118 of FIG. 1), a low pressure turbine (e.g., the LP turbine 120 of FIG. 1) or a compressor (e.g., the HP compressor 114 and LP compressor 112 of FIG. 1). In some example, the sensor(s) processor 1210 determines if the case is expanding based on the engine conditions determined from the obtained flight condition data. When the example sensor(s) processor 1210 determines that the case is expanding, then the example operations 1300 continues to block 1330 at which the example actuator controller 1215 sends a first electrical current to a multilayer stack of piezoelectric material. When the example sensor(s) processor 1210 determines that the case is not expanding, then the example operations 1300 continues to block 1325 at which the example sensor(s) processor 1210 determines if the case is shrinking.

At block 1325, the example sensor(s) processor 1210 determines if the case is shrinking. In some example, the sensor(s) processor 1210 determines if the case is shrinking based on the engine conditions determined from the obtained flight condition data. When the example sensor(s) processor 1210 determines that the case is shrinking, then the example operations 1300 continues to block 1335 at which the example actuator controller 1215 sends a second electrical current to a multilayer stack of piezoelectric material. When the example sensor(s) processor 1210 determines that the case is not shrinking, then the example operations 1300 returns to block 1310 at which the example sensor(s) processor 1210 obtains sensor data.

At block 1330, the example actuator controller 1215 sends a first electrical current to a multilayer stack of piezoelectric material. In some examples, the actuator controller 1215 generates and sends the first electrical current via a first electrical signal to the multilayer stack of piezoelectric material 455 located in the actuator 405 of FIGS. 4A and 4B. In some examples, the first electrical current causes a linear displacement in the multilayer stack of piezoelectric material 455 that moves the shroud 440 in an axial direction towards the blade 450 (similar to the example ACC system 465 of FIG. 4B). After the example actuator controller 1215 sends the first electrical current, the operations 1300 ends.

At block 1335, the example actuator controller 1215 sends a second electrical current to a multilayer stack of piezoelectric material. In some examples, the multilayer stack of piezoelectric material is substantially similar to the multilayer stack of piezoelectric material 455 of FIGS. 4A, 4B. In some examples, the actuator controller 1215 generates and sends the second electrical current via a second electrical signal to the multilayer stack of piezoelectric material 455 located in the actuator 405. In some examples, the second electrical current causes a linear displacement in the multilayer stack of piezoelectric material 455 that moves the shroud 440 in an axial direction away from the blade 450 (similar to the example ACC system 400 of FIG. 4A). After the example actuator controller 1215 sends the second electrical current, the operations 1300 ends.

Figure 14:
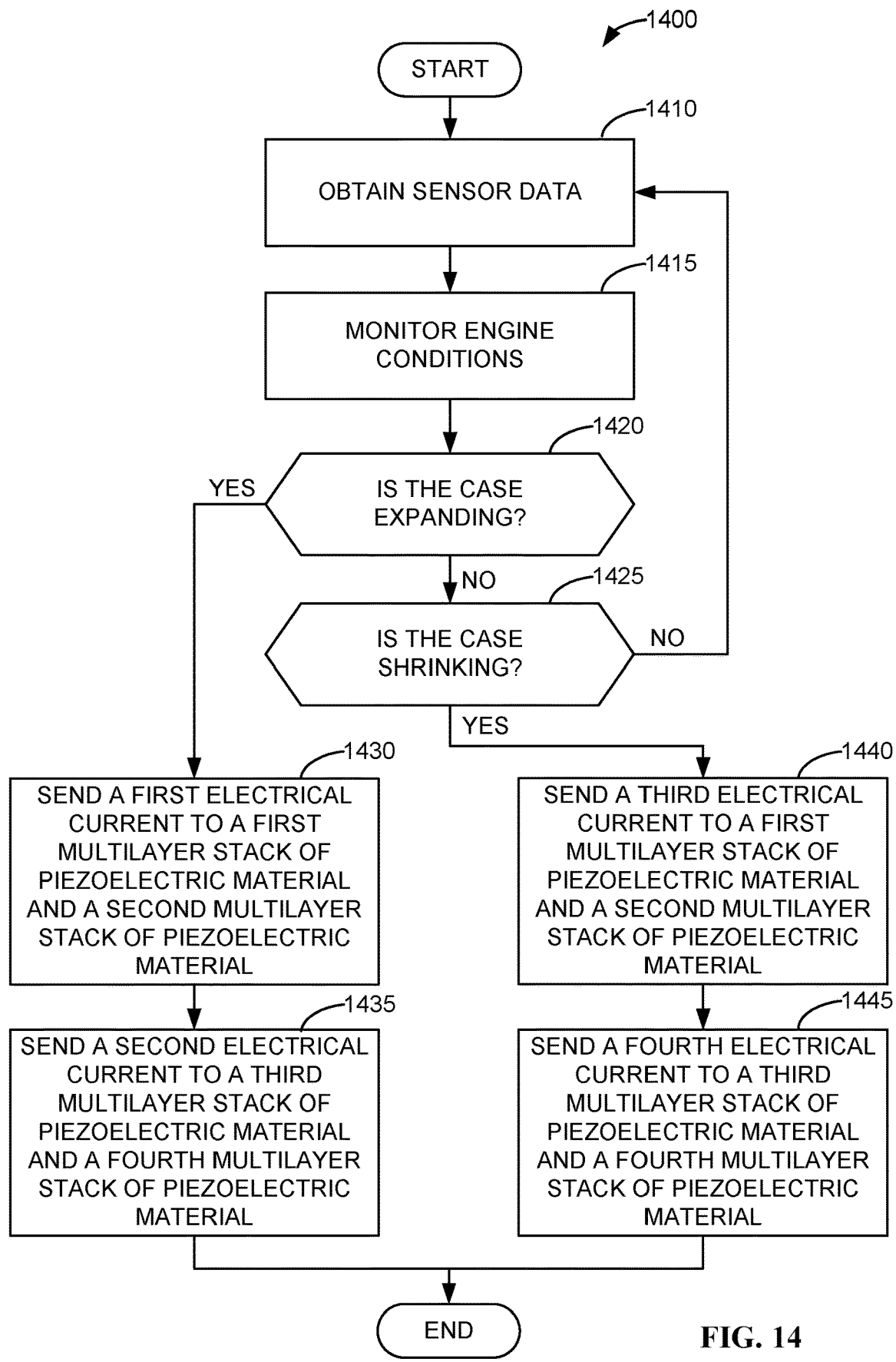
FIG. 14 is a flowchart representative of example machine readable instructions and/or example operations that may be executed by example processor circuitry to implement the example controller of FIG. 12 in conjunction with the second example ACC system of FIGS. 5A and 5B.

FIG. 14 is a flowchart representative of example machine readable instructions and/or example operations 1400 that may be executed and/or instantiated by processor circuitry to implement the example controller 1200 of FIG. 12 in conjunction with the second example ACC system 500, 575 of FIGS. 5A and 5B and/or the fifth example ACC system 800, 890 of FIGS. 8A-11C. In examples disclosed herein, the example machine readable instructions and/or example operations 1400 may be executed in a closed loop system and/or an open loop system. In some examples, the example machine readable instructions and/or example operations 1400 may be executed in an open loop system with direct measurement. The machine readable instructions and/or the operations 1400 of FIG. 14 begin at block 1410, at which the example sensor(s) processor 1210 obtains sensor data from the example engine sensor(s) 1205. In some examples, the sensor data includes the flight condition data obtained by the engine sensor(s) 1205 from an engine (e.g., the gas turbine engine 100 of FIG. 1). In some examples, flight condition data of the sensor data includes values for a plurality of input variables relating to flight conditions (e.g., air density, throttle lever position, engine temperatures, engine pressures, etc.).

At block 1415, the example sensor(s) processor 1210 monitors engine conditions based on the sensor data from the engine sensor(s) 1205. For example, the sensor(s) processor 1210 can calculate and monitor the fuel flow, stator vane position, air bleed valve position, etc., using the flight condition data included in the sensor data. At block 1420, the example sensor(s) processor 1210 determines if the case is expanding. In some examples, the case is a case surrounding a high pressure turbine (e.g., the HP turbine 118 of FIG. 1), a low pressure turbine (e.g., the LP turbine 120 of FIG. 1) or a compressor (e.g., the HP compressor 114 and LP compressor 112 of FIG. 1). In some examples, the sensor(s) processor 1210 determines if the case is expanding based on the engine conditions determined from the obtained flight condition data. When the example sensor(s) processor 1210 determines that the case is expanding, then the example operations 1400 continues to block 1430 at which the example actuator controller 1215 sends a first electrical current to a first multilayer stack of piezoelectric material and a second multilayer stack of piezoelectric material. When the example sensor(s) processor 1210 determines that the case is not expanding, then the example operations 1400 continues to block 1425 at which the example sensor(s) processor 1210 determines if the case is shrinking.

At block 1425, the example sensor(s) processor 1210 determines if the case is shrinking. In some examples, the sensor(s) processor 1210 determines if the case is shrinking based on the engine conditions determined from the obtained flight condition data. When the example sensor(s) processor 1210 determines that the case is shrinking, then the example operations 1400 continues to block 1440 at which the example actuator controller 1215 sends a third electrical current to a first multilayer stack of piezoelectric material and a second multilayer stack of piezoelectric material. When the example sensor(s) processor 1210 determines that the case is not shrinking, then the example operations 1400 returns to block 1410 at which the example sensor(s) processor 1210 obtains sensor data.

At block 1430, the example actuator controller 1215 sends a first electrical current to a first multilayer stack of piezoelectric material and a second multilayer stack of piezoelectric material. In some examples, the first multilayer stack of piezoelectric material is substantially similar to the multilayer stack of piezoelectric material 550, and the second multilayer stack of piezoelectric material is substantially similar to the multilayer stack of piezoelectric material 560. In some examples, the actuator controller 1215 generates and sends the first electrical current via a first electrical signal to the multilayer stack of piezoelectric material 550 and the multilayer stack of piezoelectric material 560 located in the actuator 515 and the actuator 520, respectively. In some examples, the first electrical current causes a first linear displacement in the multilayer stack of piezoelectric material 550 and the multilayer stack of piezoelectric material 560.

At block 1435, the example actuator controller 1215 sends a second electrical current to a third multilayer stack of piezoelectric material and a fourth multilayer stack of piezoelectric material. In some examples, the third multilayer stack of piezoelectric material is substantially similar to the multilayer stack of piezoelectric material 555, and the fourth multilayer stack of piezoelectric material is substantially similar to the multilayer stack of piezoelectric material 565. In some examples, the actuator controller 1215 generates and sends the second electrical current via a second electrical signal to the multilayer stack of piezoelectric material 555 and the multilayer stack of piezoelectric material 565 located in the actuator 515 and the actuator 520, respectively. In some examples, the second electrical current causes a second linear displacement in the multilayer stack of piezoelectric material 555 and the multilayer stack of piezoelectric material 565. In some examples, the second linear displacement is opposite of the first linear displacement. For example, if the first linear displacement is a decrease in length and an increase in thickness of the multilayer stack of piezoelectric material 550 and the multilayer stack of piezoelectric material 560, then the second linear displacement is an increase in length and a decrease in thickness of the multilayer stack of piezoelectric material 555 and the multilayer stack of piezoelectric material 565. While blocks 1430 and 1435 are shown in sequence, they can be executed in parallel. After the example actuator controller 1215 sends the second electrical current to a third multilayer stack of piezoelectric material and a fourth multilayer stack of piezoelectric material, operations 1400 ends.

At block 1440, the example actuator controller 1215 sends a third electrical current to a first multilayer stack of piezoelectric material and a second multilayer stack of piezoelectric material. In some examples, the actuator controller 1215 generates and sends the third electrical current via a third electrical signal to the multilayer stack of piezoelectric material 550 and the multilayer stack of piezoelectric material 560. In some examples, the third electrical current causes a third linear displacement in the multilayer stack of piezoelectric material 550 and the multilayer stack of piezoelectric material 560.

At block 1445, the example actuator controller 1215 sends a fourth electrical current to a third multilayer stack of piezoelectric material and a fourth multilayer stack of piezoelectric material. In some examples, the actuator controller 1215 generates and sends the fourth electrical current via a fourth electrical signal to the multilayer stack of piezoelectric material 555 and the multilayer stack of piezoelectric material 565. In some examples, the fourth electrical current causes a fourth linear displacement in the multilayer stack of piezoelectric material 555 and the multilayer stack of piezoelectric material 565. In some examples, the fourth linear displacement is opposite of the third linear displacement. For example, if the third linear displacement is an increase in length and a decrease in thickness of the multilayer stack of piezoelectric material 550 and the multilayer stack of piezoelectric material 560, then the fourth linear displacement is a decrease in length and an increase in thickness of the multilayer stack of piezoelectric material 555 and the multilayer stack of piezoelectric material 565. While blocks 1440 and 1445 are shown in sequence in the example of FIG. 14, in certain examples, they can be executed in parallel. After the example actuator controller 1215 sends the fourth electrical current to the third multilayer stack of piezoelectric material and a fourth multilayer stack of piezoelectric material, operations 1400 ends.

Figure 15:
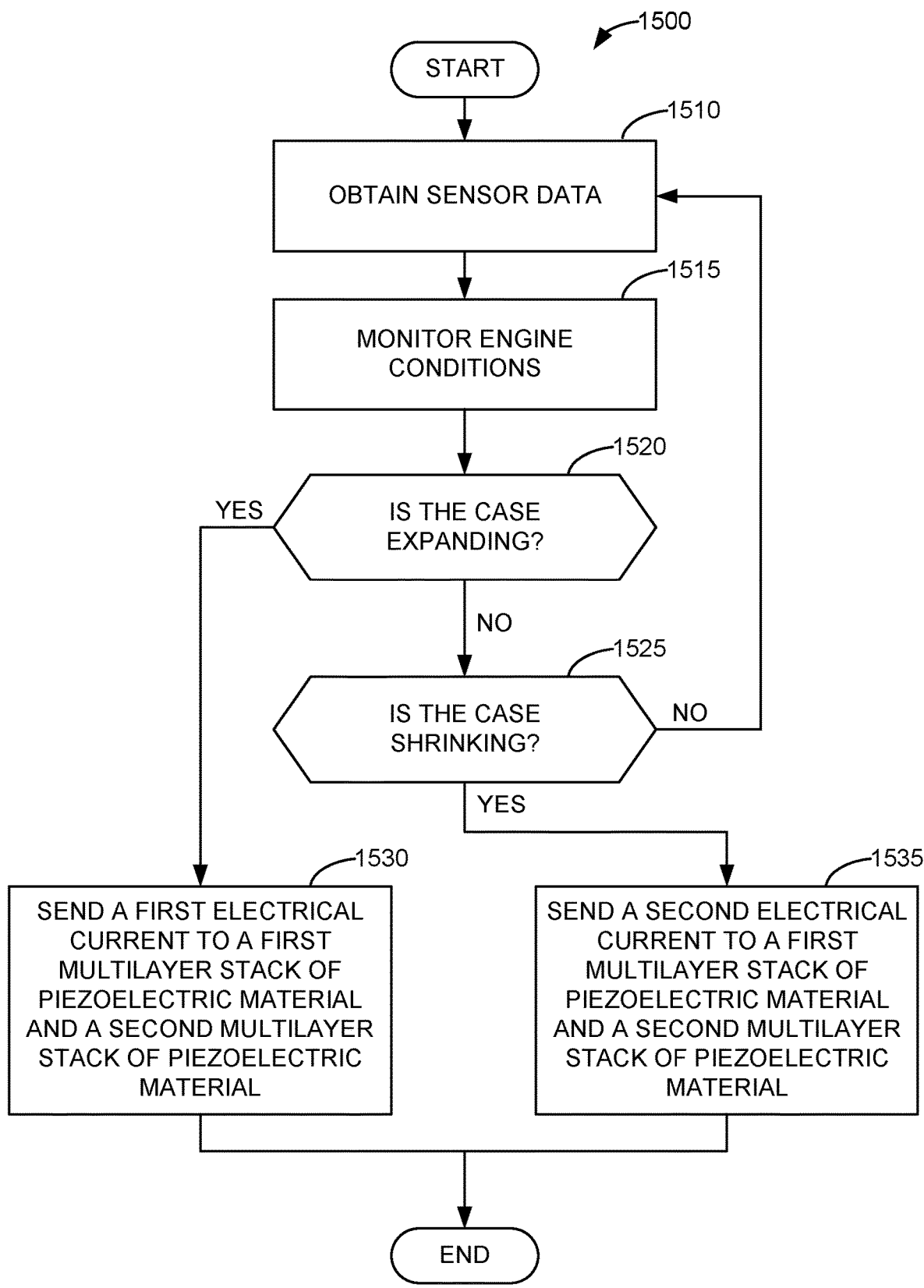
FIG. 15 is a flowchart representative of example machine readable instructions and/or example operations that may be executed by example processor circuitry to implement the example controller of FIG. 12 in conjunction with the third example ACC system of FIGS. 6A and 6B.

FIG. 15 is a flowchart representative of example machine readable instructions and/or example operations 1500 that may be executed and/or instantiated by processor circuitry to implement the example controller 1200 of FIG. 12 in conjunction with the third example ACC system 600, 675 of FIGS. 6A and 6B. In examples disclosed herein, the example machine readable instructions and/or example operations 1500 may be executed in a closed loop system and/or an open loop system. In some examples, the example machine readable instructions and/or example operations 1500 may be executed in an open loop system with direct measurement. The machine readable instructions and/or the operations 1500 of FIG. 15 begin at block 1510, at which the example sensor(s) processor 1210 obtains sensor data from the example engine sensor(s) 1205. In some examples, the sensor data includes the flight condition data obtained by the engine sensor(s) 1205 from an engine (e.g., the gas turbine engine 100 of FIG. 1). In some examples, flight condition data of the sensor data includes values for a plurality of input variables relating to flight conditions (e.g., air density, throttle lever position, engine temperatures, engine pressures, etc.).

At block 1515, the example sensor(s) processor 1210 monitors engine conditions based on the sensor data from the engine sensor(s) 1205. For example, the sensor(s) processor 1210 can calculate and monitor the fuel flow, stator vane position, air bleed valve position, etc., using the flight condition data included in the sensor data. At block 1520, the example sensor(s) processor 1210 determines if the case is expanding. In some examples, the case is a case surrounding a high pressure turbine (e.g., the HP turbine 118 of FIG. 1), a low pressure turbine (e.g., the LP turbine 120 of FIG. 1) or a compressor (e.g., the HP compressor 114 and LP compressor 112 of FIG. 1). In some examples, the sensor(s) processor 1210 determines if the case is expanding based on the engine conditions determined from the obtained flight condition data. When the example sensor(s) processor 1210 determines that the case is expanding, then the example operations 1500 continues to block 1530 at which the example actuator controller 1215 sends a first electrical current to a first multilayer stack of piezoelectric material and a second multilayer stack of piezoelectric material. When the example sensor(s) processor 1210 determines that the case is not expanding, then the example operations 1500 continues to block 1525 at which the example sensor(s) processor 1210 determines if the case is shrinking.

At block 1525, the example sensor(s) processor 1210 determines if the case is shrinking. In some examples, the sensor(s) processor 1210 determines if the case is shrinking based on the engine conditions determined from the obtained flight condition data. When the example sensor(s)

processor 1210 determines that the case is shrinking, then the example operations 1500 continues to block 1535 at which the example actuator controller 1215 sends a second electrical current to a first multilayer stack of piezoelectric material and a second multilayer stack of piezoelectric material. When the example sensor(s) processor 1210 determines that the case is not shrinking, then the example operations 1500 returns to block 1510 at which the example sensor(s) processor 1210 obtains sensor data.

At block 1530, the example actuator controller 1215 sends a first electrical current to a first multilayer stack of piezoelectric material and a second multilayer stack of piezoelectric material. In some examples, the first multilayer stack of piezoelectric material is substantially similar to multilayer stack of piezoelectric material 655, and the second multilayer stack of piezoelectric material is substantially similar to multilayer stack of piezoelectric material 665. In some examples, the actuator controller 1215 generates and sends the first electrical current via a first electrical signal to the multilayer stack of piezoelectric material 655 and the multilayer stack of piezoelectric material 665 located in the actuator 615 and the actuator 620, respectively. In some examples, the first electrical current causes a linear displacement in the multilayer stack of piezoelectric material 655 and the multilayer stack of piezoelectric material 665 that moves the shroud 640 in the axial direction (e.g., rightward), which decreases the distance between the shroud 640 and the blade 645 in the radial direction and decreases the tight clearance 680 (similar to the example ACC system 675 of FIG. 6B). After the example actuator controller 1215 sends the first electrical current, the operations 1500 ends.

At block 1535, the example actuator controller 1215 sends a second electrical current to a first multilayer stack of piezoelectric material and a second multilayer stack of piezoelectric material. In some examples, the actuator controller 1215 generates and sends the second electrical current via a second electrical signal to the multilayer stack of piezoelectric material 655 and the multilayer stack of piezoelectric material 665 located in the actuator 615 and the actuator 620, respectively. In some examples, the second electrical current causes a linear displacement in the multilayer stack of piezoelectric material 655 and the multilayer stack of piezoelectric material 665 that moves the shroud 640 in the axial direction (e.g., leftward), which increases the distance between the shroud 640 and the blade 645 in the radial direction and increases the open clearance 670 (similar to the example ACC systems 600 of FIG. 6A). After the example actuator controller 1215 sends the second electrical current, operations 1500 ends.

Figure 16:
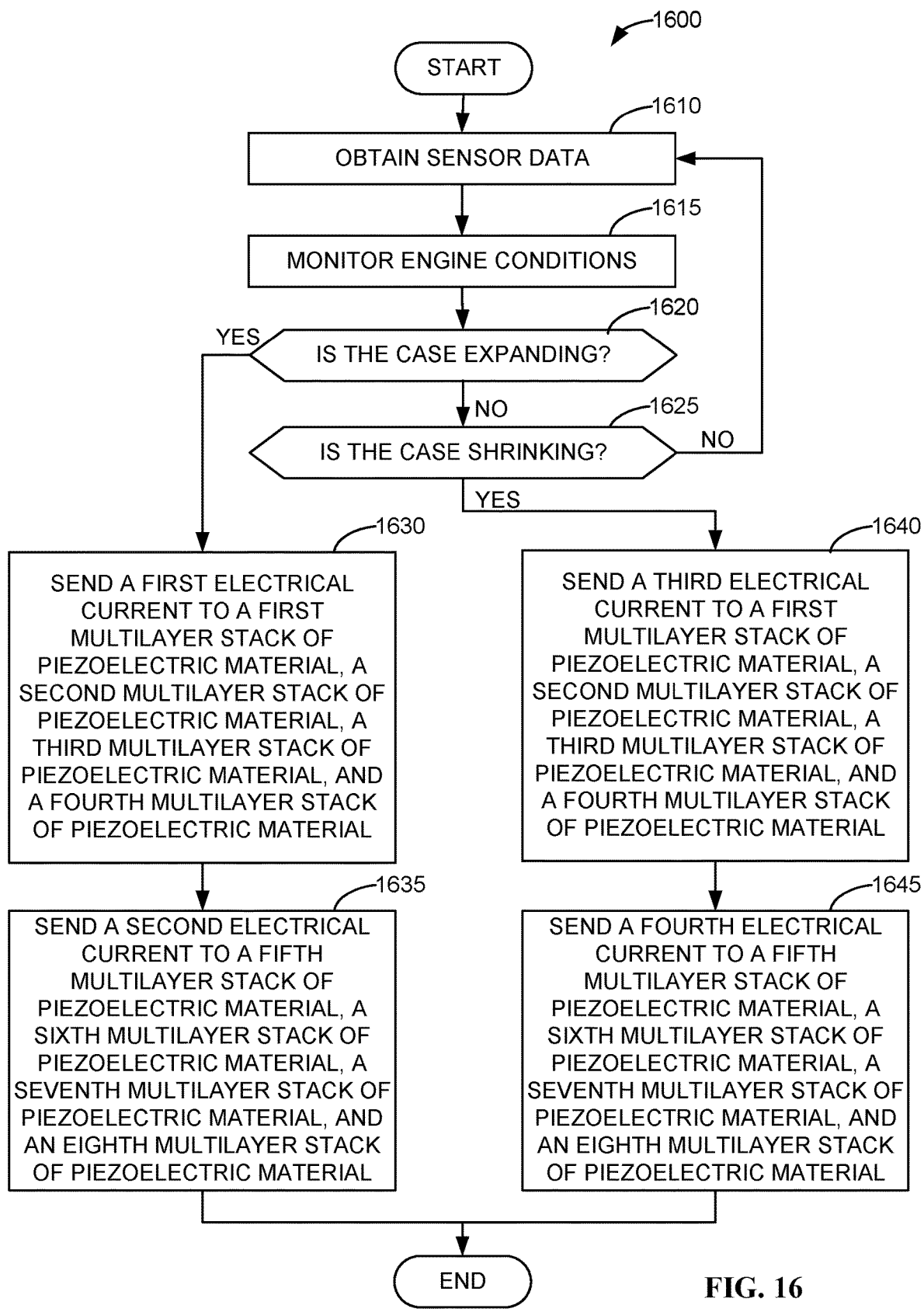
FIG. 16 is a flowchart representative of example machine readable instructions and/or example operations that may be executed by example processor circuitry to implement the example controller of FIG. 12 in conjunction with the fourth example ACC system of FIGS. 7A and 7B.

FIG. 16 is a flowchart representative of example machine readable instructions and/or example operations 1600 that may be executed and/or instantiated by processor circuitry to implement the example controller 1200 of FIG. 12 in conjunction with the fourth example ACC system 700, 790 of FIGS. 7A and 7B. In examples disclosed herein, the example machine readable instructions and/or example operations 1600 may be executed in a closed loop system and/or an open loop system. In some examples, the example machine readable instructions and/or example operations 1600 may be executed in an open loop system with direct measurement. The machine readable instructions and/or the operations 1600 of FIG. 16 begin at block 1610, at which the example sensor(s) processor 1210 obtains sensor data from the example engine sensor(s) 1205. In some examples, the sensor data includes the flight condition data obtained by the engine sensor(s) 1205 from an engine (e.g., the gas turbine engine 100 of FIG. 1). In some examples, flight condition data of the sensor data includes values for a plurality of input variables relating to flight conditions (e.g., air density, throttle lever position, engine temperatures, engine pressures, etc.).

At block 1615, the example sensor(s) processor 1210 monitors engine conditions based on the sensor data from the engine sensor(s) 1205. For example, the sensor(s) processor 1210 can calculate and monitor the fuel flow, stator vane position, air bleed valve position, etc., using the flight condition data included in the sensor data. At block 1620, the example sensor(s) processor 1210 determines if the case is expanding. In some examples, the case is a case surrounding a high pressure turbine (e.g., the HP turbine 118 of FIG. 1), a low pressure turbine (e.g., the LP turbine 120 of FIG. 1) or a compressor (e.g., the HP compressor 114 and LP compressor 112 of FIG. 1). In some examples, the sensor(s) processor 1210 determines if the case is expanding based on the engine conditions determined from the obtained flight condition data. When the example sensor(s) processor 1210 determines that the case is expanding, then the example operations 1600 continues to block 1630 at which the example actuator controller 1215 sends a first electrical current to a first multilayer stack of piezoelectric material, a second multilayer stack of piezoelectric material, a third multilayer stack of piezoelectric material, and a fourth multilayer stack of piezoelectric material. When the example sensor(s) processor 1210 determines that the case is not expanding, then the example operations 1600 continues to block 1625 at which the example sensor(s) processor 1210 determines if the case is shrinking.

At block 1625, the example sensor(s) processor 1210 determines if the case is shrinking. In some example, the sensor(s) processor 1210 determines if the case is shrinking based on the engine conditions determined from the obtained flight condition data. When the example sensor(s) processor 1210 determines that the case is shrinking, then the example operations 1600 continues to block 1640 at which the example actuator controller 1215 a third electrical current to a first multilayer stack of piezoelectric material, a second multilayer stack of piezoelectric material, a third multilayer stack of piezoelectric material, and a fourth multilayer stack of piezoelectric material. When the example sensor(s) processor 1210 determines that the case is not shrinking, then the example operations 1600 returns to block 1610 at which the example sensor(s) processor 1210 obtains sensor data.

At block 1630, the example actuator controller 1215 sends a first electrical current to a first multilayer stack of piezoelectric material, a second multilayer stack of piezoelectric material, a third multilayer stack of piezoelectric material, and a fourth multilayer stack of piezoelectric material. In some examples, the first multilayer stack of piezoelectric material is substantially similar to the multilayer stack of piezoelectric material 750, and the second multilayer stack of piezoelectric material is substantially similar to the multilayer stack of piezoelectric material 760, the third multilayer stack of piezoelectric material is substantially similar to the multilayer stack of piezoelectric material 770, and the fourth multilayer stack of piezoelectric material is substantially similar to the multilayer stack of piezoelectric material 780. In some examples, the actuator controller 1215 generates and sends the first electrical current via a first electrical signal to the multilayer stack of piezoelectric material 750 and the multilayer stack of piezoelectric material 760 located in the actuator 715 and the multilayer stack of piezoelectric material 770 and the multilayer stack of piezoelectric material 780 located in the actuator 720. In some examples, the first electrical current causes a first linear displacement in the multilayer stack of piezoelectric material 750, the multilayer stack of piezoelectric material 760, the multilayer stack of piezoelectric material 770, and the multilayer stack of piezoelectric material 780 in a first axial direction (e.g., rightward) and a first radial direction (e.g., downward).

At block 1635, the example actuator controller 1215 sends a second electrical current to a fifth multilayer stack of piezoelectric material, a sixth multilayer stack of piezoelectric material, a seventh multilayer stack of piezoelectric material, and an eighth multilayer stack of piezoelectric material. In some examples, the fifth multilayer stack of piezoelectric material is substantially similar to the multilayer stack of piezoelectric material 755, the sixth multilayer stack of piezoelectric material is substantially similar to the multilayer stack of piezoelectric material 765, the seventh multilayer stack of piezoelectric material is substantially similar to the multilayer stack of piezoelectric material 775, and the eighth multilayer stack of piezoelectric material is substantially similar to the multilayer stack of piezoelectric material 782. In some examples, the actuator controller 1215 generates and sends the second electrical current via a second electrical signal to the multilayer stack of piezoelectric material 755 and the multilayer stack of piezoelectric material 765 located in the actuator 715 and the multilayer stack of piezoelectric material 775 and the multilayer stack of piezoelectric material 782 located in the actuator 720. In some examples, the second electrical current causes a second linear displacement in the multilayer stack of piezoelectric material 755, the multilayer stack of piezoelectric material 765, the multilayer stack of piezoelectric material 775, and the multilayer stack of piezoelectric material 782 in the first axial direction (e.g., rightward) and the first radial direction (e.g., downward). In some examples, the second linear displacement is opposite of the first linear displacement. If the first linear displacement is a decrease in length and an increase in thickness of the multilayer stack of piezoelectric material 750, the multilayer stack of piezoelectric material 760, the multilayer stack of piezoelectric material 770, and the multilayer stack of piezoelectric material 780, then the second linear displacement is an increase in length and a decrease in thickness of the multilayer stack of piezoelectric material 755, the multilayer stack of piezoelectric material 765, the multilayer stack of piezoelectric material 775, and the multilayer stack of piezoelectric material 782. While blocks 1630 and 1635 are shown in sequence, they can be executed in parallel. After the example actuator controller 1215 sends the second electrical current to second electrical current to a fifth multilayer stack of piezoelectric material, a sixth multilayer stack of piezoelectric material, a seventh multilayer stack of piezoelectric material, and an eighth multilayer stack of piezoelectric material, operations 1600 ends.

At block 1640, the example actuator controller 1215 sends a third electrical current to a first multilayer stack of piezoelectric material, a second multilayer stack of piezoelectric material, a third multilayer stack of piezoelectric material, and a fourth multilayer stack of piezoelectric material. In some examples, the actuator controller 1215 generates and sends the third electrical current via a third electrical signal to the multilayer stack of piezoelectric material 750 and the multilayer stack of piezoelectric material 760 located in the actuator 715 and the multilayer stack of piezoelectric material 770 and the multilayer stack of piezoelectric material 780 located in the actuator 720. In some examples, the third electrical current causes a third linear displacement in the multilayer stack of piezoelectric material 750, the multilayer stack of piezoelectric material 760, the multilayer stack of piezoelectric material 770, and the multilayer stack of piezoelectric material 780 in a second axial direction (e.g., leftward) and a second radial direction (e.g., upward).

At block 1645, the example actuator controller 1215 sends a fourth electrical current to a fifth multilayer stack of piezoelectric material, a sixth multilayer stack of piezoelectric material, a seventh multilayer stack of piezoelectric material, and an eighth multilayer stack of piezoelectric material. In some examples, the actuator controller 1215 generates and sends the fourth electrical current via a fourth electrical signal to the multilayer stack of piezoelectric material 755 and the multilayer stack of piezoelectric material 765 located in the actuator 715 and the multilayer stack of piezoelectric material 775 and the multilayer stack of piezoelectric material 782 located in the actuator 720. In some examples, the fourth electrical current causes a fourth linear displacement in the multilayer stack of piezoelectric material 755, the multilayer stack of piezoelectric material 765, the multilayer stack of piezoelectric material 775, and the multilayer stack of piezoelectric material 782 in the second axial direction (e.g., leftward) and the second radial direction (e.g., upward). In some examples, the fourth linear displacement is opposite of the third linear displacement. For example, if the third linear displacement is an increase in length and a decrease in thickness of the multilayer stack of piezoelectric material 750, the multilayer stack of piezoelectric material 760, the multilayer stack of piezoelectric material 770, and the multilayer stack of piezoelectric material 780, then the fourth linear displacement is a decrease in length and an increase in thickness of the multilayer stack of piezoelectric material 755, the multilayer stack of piezoelectric material 765, the multilayer stack of piezoelectric material 775, and the multilayer stack of piezoelectric material 782. While blocks 1640 and 1645 are shown in sequence in the example of FIG. 16, in certain examples, they can be executed in parallel. After the example actuator controller 1215 sends the fourth electrical current to a fifth multilayer stack of piezoelectric material, a sixth multilayer stack of piezoelectric material, a seventh multilayer stack of piezoelectric material, and an eighth multilayer stack of piezoelectric material, operations 1600 ends.

Figure 17:
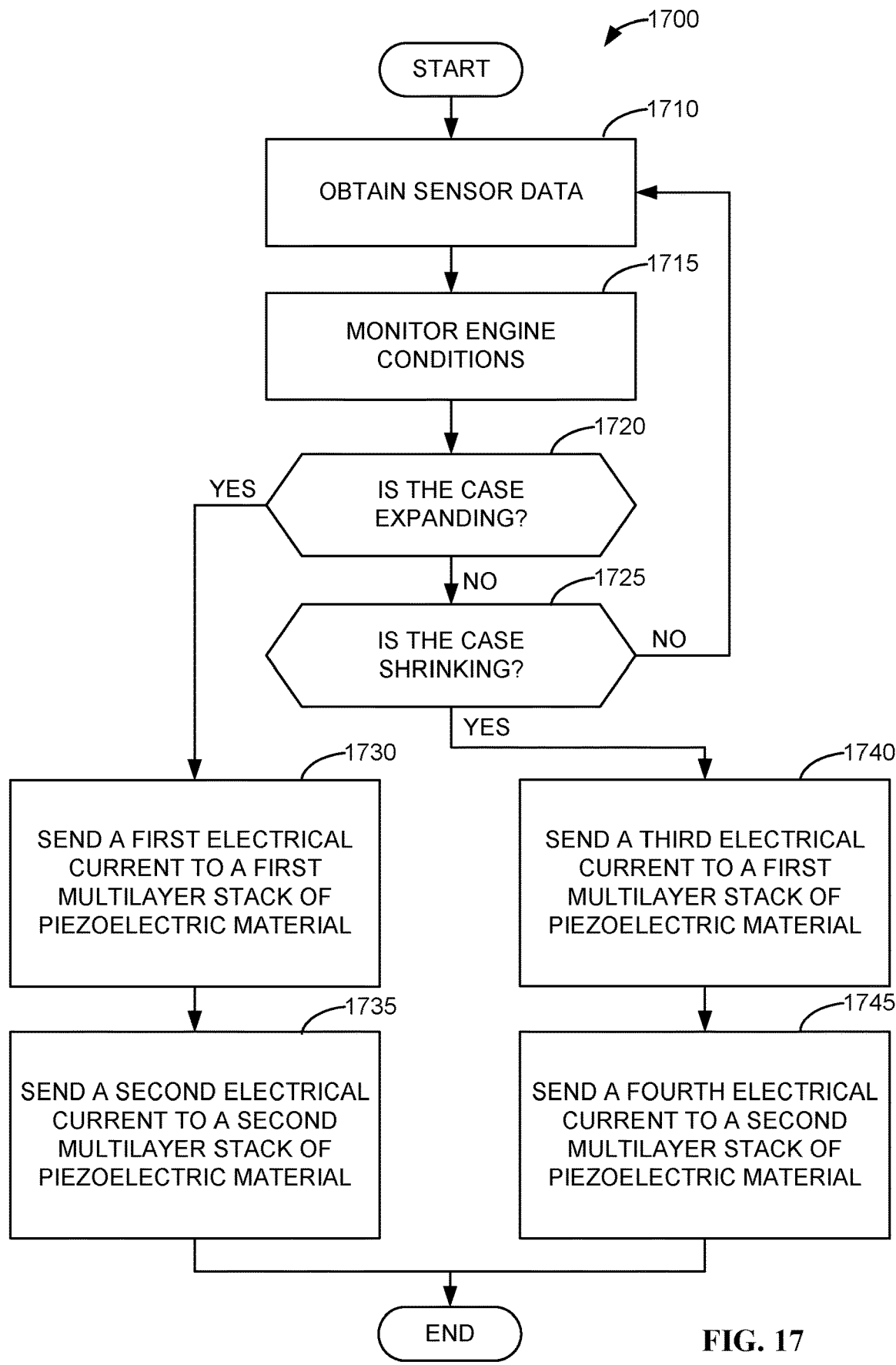
FIG. 17 is a flowchart representative of example machine readable instructions and/or example operations that may be executed by example processor circuitry to implement the example controller of FIG. 12 in conjunction with the fifth example ACC system of FIGS. 8A-11C.

FIG. 17 is a flowchart representative of example machine readable instructions and/or example operations 1700 that may be executed and/or instantiated by processor circuitry to implement the example controller 1200 of FIG. 12 in conjunction with the fifth example ACC system 800, 890 of FIGS. 8A-11C. In examples disclosed herein, the example machine readable instructions and/or example operations 1700 may be executed in a closed loop system and/or an open loop system. In some examples, the example machine readable instructions and/or example operations 1700 may be executed in an open loop system with direct measurement. The machine readable instructions and/or the operations 1700 of FIG. 17 begin at block 1710, at which the example sensor(s) processor 1210 obtains sensor data from the example engine sensor(s) 1205. In some examples, the sensor data includes the flight condition data obtained by the engine sensor(s) 1205 from an engine (e.g., the gas turbine engine 100 of FIG. 1). In some examples, flight condition data of the sensor data includes values for a plurality of input variables relating to flight conditions (e.g., air density, throttle lever position, engine temperatures, engine pressures, etc.).

At block 1715, the example sensor(s) processor 1210 monitors engine conditions based on the sensor data from the engine sensor(s) 1205. For example, the sensor(s) processor 1210 can calculate and monitor the fuel flow, stator vane position, air bleed valve position, etc., using the flight condition data included in the sensor data. At block 1720, the example sensor(s) processor 1210 determines if the case is expanding. In some examples, the case is a case surrounding a high pressure turbine (e.g., the HP turbine 118 of FIG. 1), a low pressure turbine (e.g., the LP turbine 120 of FIG. 1) or a compressor (e.g., the HP compressor 114 and LP compressor 112 of FIG. 1). In some examples, the sensor(s) processor 1210 determines if the case is expanding based on the engine conditions determined from the obtained flight condition data. When the example sensor(s) processor 1210 determines that the case is expanding, then the example operations 1700 continues to block 1730 at which the example actuator controller 1215 sends a first electrical current to a first multilayer stack of piezoelectric material. When the example sensor(s) processor 1210 determines that the case is not expanding, then the example operations 1700 continues to block 1725 at which the example sensor(s) processor 1210 determines if the case is shrinking.

At block 1725, the example sensor(s) processor 1210 determines if the case is shrinking. In some example, the sensor(s) processor 1210 determines if the case is shrinking based on the engine conditions determined from the obtained flight condition data. When the example sensor(s) processor 1210 determines that the case is shrinking, then the example operations 1700 continues to block 1740 at which the example actuator controller 1215 a third electrical current to a first multilayer stack of piezoelectric material. When the example sensor(s) processor 1210 determines that the case is not shrinking, then the example operations 1700 returns to block 1710 at which the example sensor(s) processor 1210 obtains sensor data.

At block 1730, the example actuator controller 1215 sends a first electrical current to a first multilayer stack of piezoelectric material. In some examples, the first multilayer stack of piezoelectric material is substantially similar to the multilayer stack of piezoelectric material 825. In some examples, the actuator controller 1215 generates and sends the first electrical current via a first electrical signal to the multilayer stack of piezoelectric material 825 located in the actuator 820. In some examples, the first electrical current causes a first linear displacement in the multilayer stack of piezoelectric material 825.

At block 1735, the example actuator controller 1215 sends a second electrical current to a second multilayer stack of piezoelectric material. In some examples, the second multilayer stack of piezoelectric material is substantially similar to the multilayer stack of piezoelectric material 830. In some examples, the actuator controller 1215 generates and sends the second electrical current via a second electrical signal to the multilayer stack of piezoelectric material 830 located in the actuator 820. In some examples, the second electrical current causes a second linear displacement in the multilayer stack of piezoelectric material 830. In some examples, the second linear displacement is opposite of the first linear displacement. For example, if the first linear displacement is an increase in length and a decrease in thickness of the multilayer stack of piezoelectric material 825, then the second linear displacement is a decrease in length and an increase in thickness of the multilayer stack of piezoelectric material 830. While blocks 1730 and 1735 are shown in sequence, they can be executed in parallel. After the example actuator controller 1215 sends the second electrical current to a second multilayer stack of piezoelectric material, operations 1700 ends.

At block 1740, the example actuator controller 1215 sends a third electrical current to a first multilayer stack of piezoelectric material. In some examples, the actuator controller 1215 generates and sends the third electrical current via a third electrical signal to the multilayer stack of piezoelectric material 825. In some examples, the third electrical current causes a third linear displacement in the multilayer stack of piezoelectric material 825.

At block 1745, the example actuator controller 1215 sends a fourth electrical current to a second multilayer stack of piezoelectric material. In some examples, the actuator controller 1215 generates and sends the fourth electrical current via a fourth electrical signal to the multilayer stack of piezoelectric material 830. In some examples, the fourth electrical current causes a fourth linear displacement in the multilayer stack of piezoelectric material 830. In some examples, the fourth linear displacement is opposite of the third linear displacement. For example, if the third linear displacement is a decrease in length and an increase in thickness of the multilayer stack of piezoelectric material 825, then the fourth linear displacement is an increase in length and a decrease in thickness of the multilayer stack of piezoelectric material 830. While blocks 1740 and 1745 are shown in sequence in the example of FIG. 17, in certain examples, they can be executed in parallel. After the example actuator controller 1215 sends the fourth electrical current to the second multilayer stack of piezoelectric material, operations 1700 ends.

Figure 18:
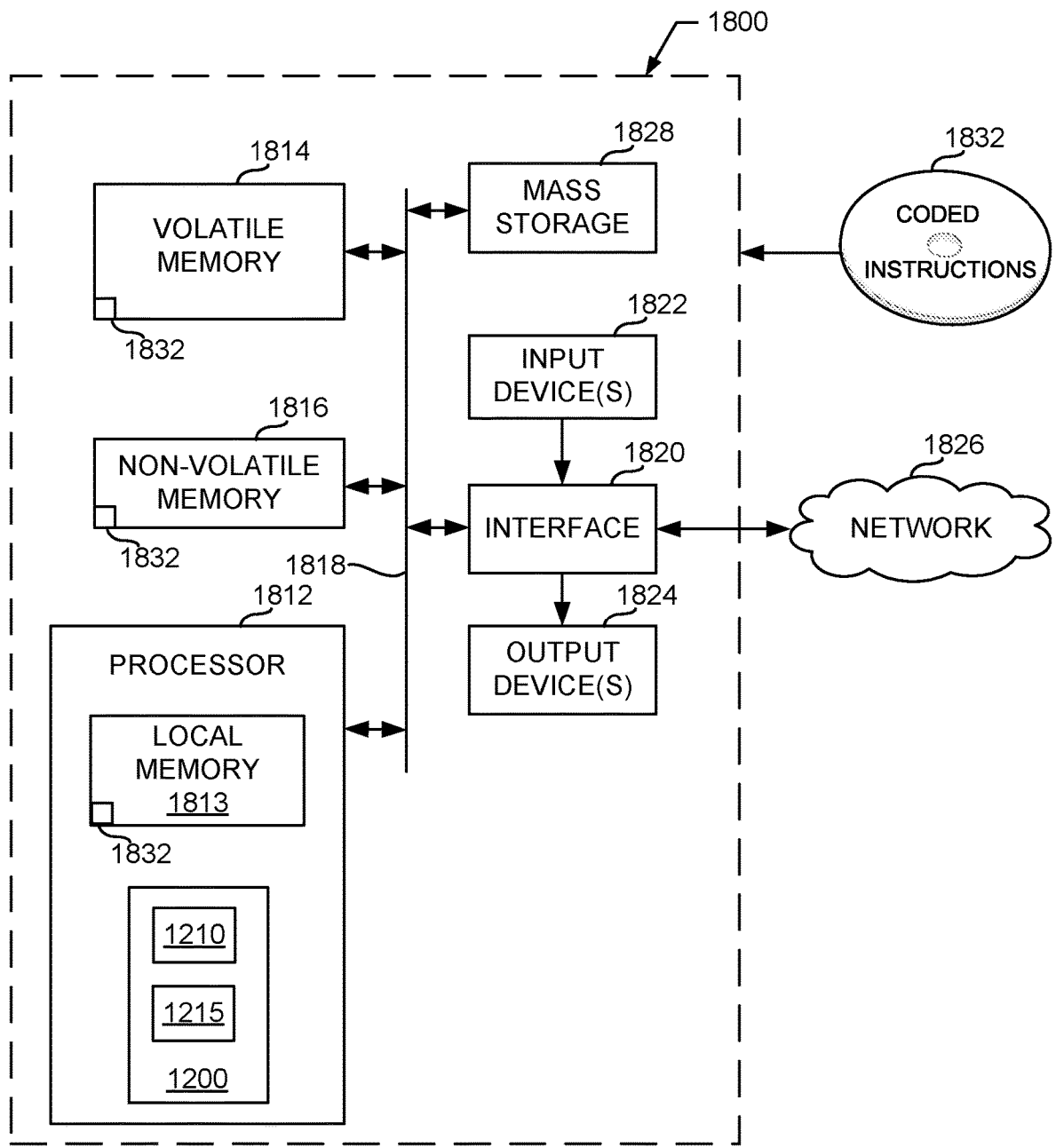
FIG. 18 is a block diagram of an example processing platform including processor circuitry structured to execute the example machine readable instructions and/or the example operations of FIGS. 13-17 to implement the example controller of FIG. 12.

FIG. 18 is a block diagram of an example processor platform 1800 structured to execute the instructions of FIGS. 13, 14, 15, 16 and 17 to implement the example controller 1200 of FIG. 12. The processor platform 1800 can be, for example, a server, a personal computer, a workstation, a self-learning machine (e.g., a neural network), a mobile device (e.g., a tablet such as an iPad™), or any other type of computing device.

The processor platform 1800 of the illustrated example includes a processor 1812. The processor 1812 of the illustrated example is hardware. For example, the processor 1812 can be implemented by one or more integrated circuits, logic circuits, microprocessors, GPUs, DSPs, or controllers from any desired family or manufacturer. The hardware processor may be a semiconductor based (e.g., silicon based) device. In this example, the processor implements the example sensor(s) processor 1210 and the example actuator controller 1215.

The processor 1812 of the illustrated example includes a local memory 1813 (e.g., a cache). The processor 1812 of the illustrated example is in communication with a main memory including a volatile memory 1814 and a non-volatile memory 1816 via a bus 1818. The volatile memory 1814 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 1816 may be implemented by flash memory and/or any other desired type of memory device. Access to the main memory 1814, 1816 is controlled by a memory controller.

The processor platform 1800 of the illustrated example also includes an interface circuit 1820. The interface circuit 1820 may be implemented by any type of interface standard, such as an Ethernet interface, a universal serial bus (USB), a Bluetooth® interface, a near field communication (NFC) interface, and/or a PCI express interface.

In the illustrated example, one or more input devices 1822 are connected to the interface circuit 1820. The input device(s) 1822 permit(s) a user to enter data and/or commands into the processor 1812. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 1824 are also connected to the interface circuit 1820 of the illustrated example. The output devices 1824 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 1820 of the illustrated example, thus, typically includes a graphics driver card, a graphics driver chip and/or a graphics driver processor.

The interface circuit 1820 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1826. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1800 of the illustrated example also includes one or more mass storage devices 1828 for storing software and/or data. Examples of such mass storage devices 1828 include floppy disk drives, hard drive disks, compact disk drives, and redundant array of independent disks (RAID) systems.

The machine executable instructions 1832 of FIGS. 13, 14, 15, 16, and 17 may be stored in the mass storage device 1828, in the volatile memory 1814, in the non-volatile memory 1816, and/or on a removable non-transitory computer readable storage medium such as a CD or DVD.

From the foregoing, it will be appreciated that example methods, apparatus and articles of manufacture have been disclosed that improve clearance control in a gas turbine engine. The disclosed examples propose improved ACC designs using piezoelectric actuator(s) in the axial, axial/radial combined, and circumferential directions to achieve tighter clearance at any operating conditions with fast mechanical ACC modulation. The disclosed examples use piezoelectric material to generate high mechanical power and provide fast response clearance control in the radial direction with no time delay. The disclosed examples mechanically convert the displacement of the piezoelectric material in the axial, axial/radial combined, and circumferential directions into the clearance control in the radial direction. The disclosed examples use multilayer stacks of the piezoelectric material to manage the range of displacement, which effects the range of the ACC system muscle capability. The disclosed examples propose simpler ACC design with weight reduction and increased space in the undercowl for other components of the gas turbine engine to be installed more freely. The disclosed examples improve engine performance and EGT control capability with additional SFC benefit due to saving airflow because no cooling airflow is needed for the mechanical ACC system.

Further aspects of the present disclosure are provided by the subject matter of the following clauses:

An apparatus to control clearance for a turbine engine, the apparatus comprising an actuator to control clearance between a blade and at least one of a shroud or a hanger, the actuator including a multilayer stack of material, and wherein the actuator is outside a case, and a rod coupled to the actuator and at the least one of the shroud or the hanger through an opening in the case, the rod to move the at least one of the shroud or the hanger in a radial direction based on movement of the multilayer stack of material.

The apparatus of any preceding clause, wherein the case surrounds at least part of the turbine engine, the at least part of the turbine engine including the at least one of the shroud or the hanger to contain airflow in the at least part of the turbine engine and at least one of a turbine or a compressor.

The apparatus of any preceding clause, wherein the actuator and the multilayer stack of material are oriented in an axial direction, the multilayer stack of material including at least one of a piezoelectric material or a shape memory alloy.

The apparatus of any preceding clause, further including a controller operatively coupled to the actuator, the controller to supply an electrical current to the multilayer stack of material in the actuator, the multilayer stack of material displaced in an axial direction by the electrical current.

The apparatus of any preceding clause, wherein the actuator controls clearance between the blade and the at least one of the shroud or the hanger in the radial direction using the displacement of the multilayer stack of material.

The apparatus of any preceding clause, further including a first seal on an outer surface of the case and a second seal on an inner surface of the case at the opening in the case for the rod, the first seal and the second seal to reduce leakage through the opening in the case.

An apparatus to control clearance for a turbine engine, the apparatus comprising a first actuator to control clearance between a blade and at least one of a shroud or a hanger, the first actuator including a first multilayer stack of material, and wherein the first actuator is coupled to the at least one of the shroud or a first hook of the hanger, and a second actuator to control clearance between the blade and the at least one of the shroud or the hanger, the second actuator including a second multilayer stack of material, the second actuator coupled to the at least one of the shroud or a second hook of the hanger, and wherein the first actuator and the second actuator are to move the at least one of the shroud or the hanger in an axial direction.

The apparatus of any preceding clause, further including a case surrounding at least part of the turbine engine, the at least part of the turbine engine including the at least one of the shroud or the hanger to contain airflow in the turbine engine and at least one of a turbine or a compressor.

The apparatus of any preceding clause, wherein the first multilayer stack of material and the second multilayer stack of material include at least one of piezoelectric material or shape memory alloy.

The apparatus of any preceding clause, the first actuator further including a third multilayer stack of material, and the second actuator further including a fourth multilayer stack of material.

The apparatus of any preceding clause, the apparatus further including a controller operatively coupled to the first actuator and the second actuator, the controller to supply a first electrical current to the first multilayer stack of material and the second multilayer stack of material, the controller to supply a second electrical current to the third multilayer stack of material and the fourth multilayer stack of material, the controller to supply the first electrical current and the second electrical current at a same time.

The apparatus of any preceding clause, wherein the first multilayer stack of material and the third multilayer stack of material are displaced in the axial direction by the first electrical current, and the third multilayer stack of material and the fourth multilayer stack of material are displaced in the axial direction by the second electrical current, the first multilayer stack of material and the third multilayer stack of material displaced at a same time the third multilayer stack of material and the fourth multilayer stack of material are displaced.

The apparatus of any preceding clause, wherein the first actuator and second actuator control clearance between the at least one of the shroud or the hanger and the blade in a radial direction using the displacement of the first multilayer stack of material, the second multilayer stack of material, the third multilayer stack of material, and the fourth multilayer stack of material.

The apparatus of any preceding clause, the first actuator further including a first spring, and the second actuator further including a second spring.

The apparatus of any preceding clause, the apparatus further including a controller operatively coupled to the first actuator and the second actuator, the controller to supply an electrical current to the first multilayer stack of material and the second multilayer stack of material, the first multilayer stack of material and the second multilayer stack of material displaced in the axial direction by the electrical current.

The apparatus of any preceding clause, wherein the first actuator and second actuator control clearance between the blade and the at least one of the shroud or the hanger in a radial direction using the displacement of the first multilayer stack of material and the second multilayer stack of material, and wherein the first spring supports displacement of the first multilayer stack of material and the second spring supports the displacement the second multilayer stack of material.

The apparatus of any preceding clause, wherein the first actuator further including a third multilayer stack of material, a fourth multilayer stack of material, and a fifth multilayer stack of material, and the second actuator further including a sixth multilayer stack of material, a seventh multilayer stack of material, and an eighth multilayer stack of material.

The apparatus of any preceding clause, the apparatus further including a controller operatively coupled to the first actuator and the second actuator, the controller to supply a first electrical current to the first multilayer stack of material, the second multilayer stack of material, the third multilayer stack of material, and the sixth multilayer stack of material, the controller to supply a second electrical current to the fourth multilayer stack of material, the fifth multilayer stack of material, the seventh multilayer stack of material, and the eighth multilayer stack of material, the controller to supply the first electrical current and the second electrical current at a same time.

The apparatus of any preceding clause, wherein the first multilayer stack of material, the second multilayer stack of material, the third multilayer stack of material, and the sixth multilayer stack of material are displaced by the first electrical current, and the fourth multilayer stack of material, the fifth multilayer stack of material, the seventh multilayer stack of material, and the eighth multilayer stack of material are displaced by the second electrical current.

The apparatus of any preceding clause, wherein the first multilayer stack of material, the second multilayer stack of material, the fourth multilayer stack of material, and the seventh multilayer stack of material are displaced in an axial direction, and the third multilayer stack of material, the fifth multilayer stack of material, the sixth multilayer stack of material, and the eighth multilayer stack of material are displaced in a radial direction.

The apparatus of any preceding clause, wherein the first actuator and second actuator control clearance between the at least one of the shroud or the hanger and the blade in the axial direction and the radial direction using the displacement of the first multilayer stack of material, the second multilayer stack of material, the third multilayer stack of material, the fourth multilayer stack of material, the fifth multilayer stack of material, the sixth multilayer stack of material, the seventh multilayer stack of material, and the eighth multilayer stack of material.

An apparatus to control clearance for a turbine engine, the apparatus comprising a case surrounding at least part of the turbine engine, the at least part of the turbine engine including a shroud and a hanger to contain airflow in the turbine engine, the case including a first pin and a second pin, the hanger coupled to the shroud, and wherein the hanger includes a first slot and a second slot, the first pin coupled to the first slot and the second pin coupled to the second slot, and an actuator to control clearance between an airfoil and the shroud, the actuator including a first multilayer stack of material and a second multilayer stack of material, and wherein the actuator is inside the hanger between the first slot and the second slot, the actuator to move the hanger and the shroud in a circumferential direction.

The apparatus of any preceding clause, wherein the at least part of the turbine engine includes a turbine or a compressor.

The apparatus of any preceding clause, wherein the first multilayer stack of material and the second multilayer stack of material include at least one of piezoelectric material or shape memory alloy.

The apparatus of any preceding clause, further including a controller operatively coupled to the actuator, the controller to supply a first electrical current to the first multilayer stack of material in the actuator and a second electrical current to the second multilayer stack of material in the actuator, the first multilayer stack of material displaced by the first electrical current and the second multilayer stack of material displaced by the second electrical current.

The apparatus of any preceding clause, wherein the actuator moves the hanger using the displacement of the first multilayer stack of material and the second multilayer stack of material, the actuator to displace the first slot and the second slot in the hanger, the first pin and the second pin in the case to move in the first slot and the second slot.

The apparatus of any preceding clause, wherein the actuator controls clearance between the airfoil and the shroud in the circumferential direction using the displacement of the first slot and the second slot in the hanger.

A clearance control method includes obtaining sensor data and monitoring engine conditions to determine whether an engine case is expanding or shrinking. When the case is expanding, a first electrical current is sent to a multilayer stack of piezoelectric material. When the case is shrinking, a second electrical current is sent to the multilayer stack of piezoelectric material.

A clearance control method includes obtaining sensor data and monitoring engine conditions to determine whether an engine case is expanding or shrinking. When the case is expanding, a first electrical current is sent to a first multilayer stack of piezoelectric material and a second multilayer stack of piezoelectric material, and a second electrical current is sent to a third multilayer stack of piezoelectric material and a fourth multilayer stack of piezoelectric material. When the case is shrinking, a third electrical current is sent to the first multilayer stack of piezoelectric material and the second multilayer stack of piezoelectric material, and a fourth electrical current is sent to the third multilayer stack of piezoelectric material and the fourth multilayer stack of piezoelectric material.

A clearance control method includes obtaining sensor data and monitoring engine conditions to determine whether an engine case is expanding or shrinking. When the case is expanding, a first electrical current is sent to a first multilayer stack of piezoelectric material and a second multilayer stack of piezoelectric material. When the case is shrinking, a second electrical current is sent to the first multilayer stack of piezoelectric material and the second multilayer stack of piezoelectric material.

A clearance control method includes obtaining sensor data and monitoring engine conditions to determine whether an engine case is expanding or shrinking. When the case is expanding, a first electrical current is sent to a first multilayer stack of piezoelectric material, and a second electrical current is sent to a second multilayer stack of piezoelectric material. When the case is shrinking, a third electrical current is sent to the first multilayer stack of piezoelectric material, and a fourth electrical current is sent to the second multilayer stack of piezoelectric material.

A clearance control method includes obtaining sensor data and monitoring engine conditions to determine whether an engine case is expanding or shrinking. When the case is expanding, a first electrical current is sent to first, second, third, and fourth multilayer stacks of piezoelectric material, and a second electrical current is sent to fifth, sixth seventh, and eighth multilayer stacks of piezoelectric material. When the case is shrinking, a third electrical current is sent to the first, second, third, and fourth multilayer stacks of piezoelectric material, and a fourth electrical current is sent to the fifth, sixth seventh, and eighth multilayer stacks of piezoelectric material.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. A clearance control method for a turbine or a compressor of an engine, the method comprising:
   obtaining sensor data;
   monitoring engine conditions to determine, based on the sensor data, whether an engine case is expanding or shrinking;
   when determined that the engine case is expanding, supplying a first electrical current to displace a multilayer stack of material in a first direction, the multilayer stack of material positioned with respect to the engine case; and
   when determined that the case is shrinking, supplying a second electrical current is sent to displace the multilayer stack of material in a second direction, the first electrical current different from the second electrical current, the first direction different from the second direction.

2. The clearance control method of claim 1, wherein the multilayer stack of material includes a multilayer stack of piezoelectric material.

3. The clearance control method of claim 1, wherein, when determined that the engine case is expanding, the first electrical current is sent to a first multilayer stack of material and a second multilayer stack of material, and a third electrical current is sent to a third multilayer stack of piezoelectric material and a fourth multilayer stack of piezoelectric material.

4. The clearance control method of claim 3, wherein, when determined that the case is shrinking, the second electrical current is sent to the first multilayer stack of piezoelectric material and the second multilayer stack of piezoelectric material, and a fourth electrical current is sent to the third multilayer stack of piezoelectric material and the fourth multilayer stack of piezoelectric material.

5. The clearance control method of claim 1, wherein, when determined that the engine case is expanding, the first electrical current is sent to a first multilayer stack of piezoelectric material and a second multilayer stack of piezoelectric material; and, when determined that the engine case is shrinking, the second electrical current is sent to the first multilayer stack of piezoelectric material and the second multilayer stack of piezoelectric material.

6. The clearance control method of claim 1, wherein, when determined that the engine case is expanding, the first electrical current is sent to a first multilayer stack of piezoelectric material, and a third electrical current is sent to a second multilayer stack of piezoelectric material; and
   when the case is shrinking, the second electrical current is sent to the first multilayer stack of piezoelectric material, and a fourth electrical current is sent to the second multilayer stack of piezoelectric material.

7. The clearance control method of claim 1, wherein, when determine that the engine case is expanding, the first electrical current is sent to first, second, third, and fourth multilayer stacks of piezoelectric material, and a third electrical current is sent to fifth, sixth seventh, and eighth multilayer stacks of piezoelectric material; and, when determined that the engine case is shrinking, the second electrical current is sent to the first, second, third, and fourth multilayer stacks of piezoelectric material, and a fourth electrical current is sent to the fifth, sixth seventh, and eighth multilayer stacks of piezoelectric material.

8. The clearance control method of claim 1, wherein the multilayer stack of material is connected to an actuator.

9. The clearance control method of claim 8, wherein the actuator is connected to a rod, the rod connected to the engine case.

10. The clearance control method of claim 9, wherein the rod is to move the engine case in a radial direction based on an axial movement of the multilayer stack of material.

11. At least one non-transitory computer readable storage medium storing instructions that, when executed, cause processor circuitry to at least:
    obtain sensor data;
    monitor engine conditions to determine, based on the sensor data, whether an engine case is expanding or shrinking;
    when determined that the engine case is expanding, supply a first electrical current to displace a multilayer stack of material in a first direction, the multilayer stack of material positioned with respect to the engine case; and
    when determined that the case is shrinking, supply a second electrical current is sent to displace the multilayer stack of material in a second direction, the first electrical current different from the second electrical current, the first direction different from the second direction.

12. The at least one computer readable storage medium of claim 11, wherein the multilayer stack of material includes a multilayer stack of piezoelectric material.

13. The at least one computer readable storage medium of claim 11, wherein, when determined that the engine case is expanding, the first electrical current is sent to a first multilayer stack of material and a second multilayer stack of material, and a third electrical current is sent to a third multilayer stack of piezoelectric material and a fourth multilayer stack of piezoelectric material.

14. The at least one computer readable storage medium of claim 13, wherein, when determined that the case is shrinking, the second electrical current is sent to the first multilayer stack of piezoelectric material and the second multilayer stack of piezoelectric material, and a fourth electrical current is sent to the third multilayer stack of piezoelectric material and the fourth multilayer stack of piezoelectric material.

15. The at least one computer readable storage medium of claim 11, wherein, when determined that the engine case is expanding, the first electrical current is sent to a first multilayer stack of piezoelectric material and a second multilayer stack of piezoelectric material; and, when determined that the engine case is shrinking, the second electrical current is sent to the first multilayer stack of piezoelectric material and the second multilayer stack of piezoelectric material.

16. The at least one computer readable storage medium of claim 11, wherein, when determined that the engine case is expanding, the first electrical current is sent to a first multilayer stack of piezoelectric material, and a third electrical current is sent to a second multilayer stack of piezoelectric material; and when the case is shrinking, the second electrical current is sent to the first multilayer stack of piezoelectric material, and a fourth electrical current is sent to the second multilayer stack of piezoelectric material.

17. The at least one computer readable storage medium of claim 11, wherein, when determine that the engine case is expanding, the first electrical current is sent to first, second, third, and fourth multilayer stacks of piezoelectric material, and a third electrical current is sent to fifth, sixth seventh, and eighth multilayer stacks of piezoelectric material; and, when determined that the engine case is shrinking, the second electrical current is sent to the first, second, third, and fourth multilayer stacks of piezoelectric material, and a fourth electrical current is sent to the fifth, sixth seventh, and eighth multilayer stacks of piezoelectric material.

18. The at least one computer readable storage medium of claim 11, wherein the multilayer stack of material is connected to an actuator.

19. The at least one computer readable storage medium of claim 18, wherein the actuator is connected to a rod, the rod connected to the engine case.

20. The at least one computer readable storage medium of claim 19, wherein the rod is to move the engine case in a radial direction based on an axial movement of the multilayer stack of material.

* * * * *